United States Patent [19]

Iwasaki et al.

[11] Patent Number: 5,892,273
[45] Date of Patent: *Apr. 6, 1999

[54] SEMICONDUCTOR PACKAGE INTEGRAL WITH SEMICONDUCTOR CHIP

[75] Inventors: Hiroshi Iwasaki; Hideo Aoki, both of Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 537,396

[22] Filed: Oct. 2, 1995

[30] Foreign Application Priority Data

Oct. 3, 1994 [JP] Japan ..................................... 6-239042
Aug. 30, 1995 [JP] Japan ..................................... 7-221827

[51] Int. Cl.$^6$ .................................................. H03L 23/528
[52] U.S. Cl. ......................... 257/690; 257/700; 257/701; 257/750; 257/758; 257/760; 257/773; 257/780; 257/786; 257/766
[58] Field of Search ..................................... 257/690, 697, 257/700, 701, 702, 737, 738, 750, 758, 760, 762, 773, 777, 778, 780, 786, 764, 766

[56] References Cited

U.S. PATENT DOCUMENTS

| | | | |
|---|---|---|---|
| 4,107,726 | 8/1978 | Schilling | 257/766 |
| 4,948,754 | 8/1990 | Kondo et al. | 437/183 |
| 5,220,199 | 6/1993 | Owada et al. | 257/758 |
| 5,309,024 | 5/1994 | Hirano | 257/697 |
| 5,360,988 | 11/1994 | Uda et al. | 257/666 |
| 5,457,345 | 10/1995 | Cook et al. | 257/766 |
| 5,581,122 | 12/1996 | Chao et al. | 257/738 |

OTHER PUBLICATIONS

European Search Report dated Nov. 28, 1997.
Masatoshi Yasunaga et al., "Chip Scale Package* (CSP) 'A Lightly Dressed LSI Chip'".
Patent Abstracts of Japan, vol. 017, No. 398; Publication No. 05074776; Mar. 26, 1993.

Primary Examiner—David B. Hardy
Attorney, Agent, or Firm—Finnegan, Henderson, Farabow, Garrett & Dunner, L.L.P.

[57] ABSTRACT

A semiconductor chip having a semiconductor substrate, a plurality of pads formed above the semiconductor substrate a first passivating film formed over an entire surface of the semiconductor substrate, and having openings above the pads the surface of the first passivating film being flat, a plurality of interconnection lines formed on the surface of the first passivating film, a second passivating film formed over the entire surface of the first passivating film and having through holes, the through holes being arranged in the form of an array, the surface of the second passivating film being flat, a plurality of contacts for connection to external leads each of the contacts being formed within and above a respective one of the through holes, the contacts being arranged in the form of an array.

63 Claims, 34 Drawing Sheets

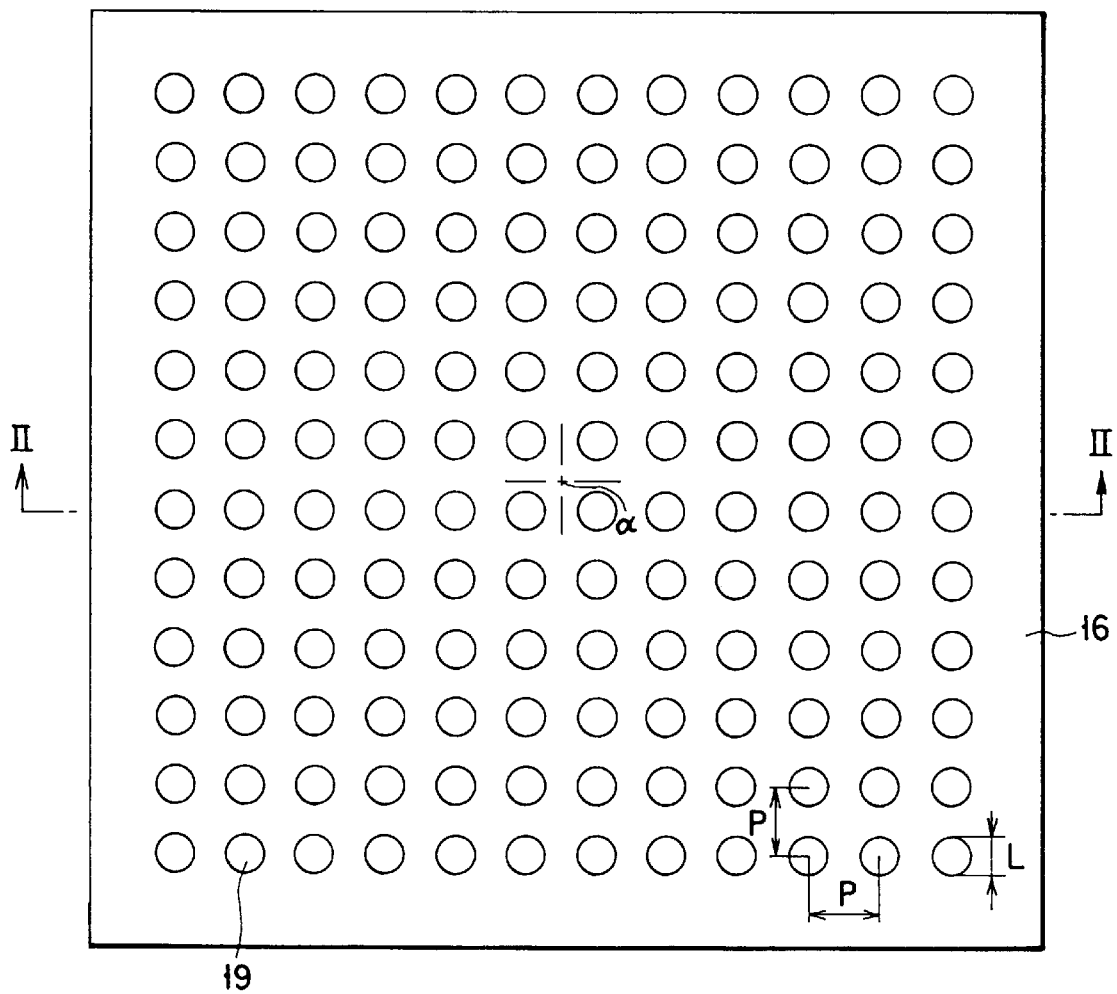
F I G. 1
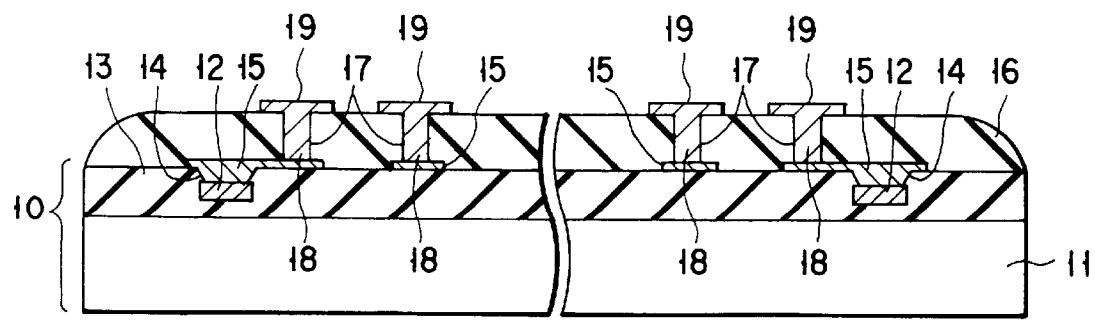
F I G. 2

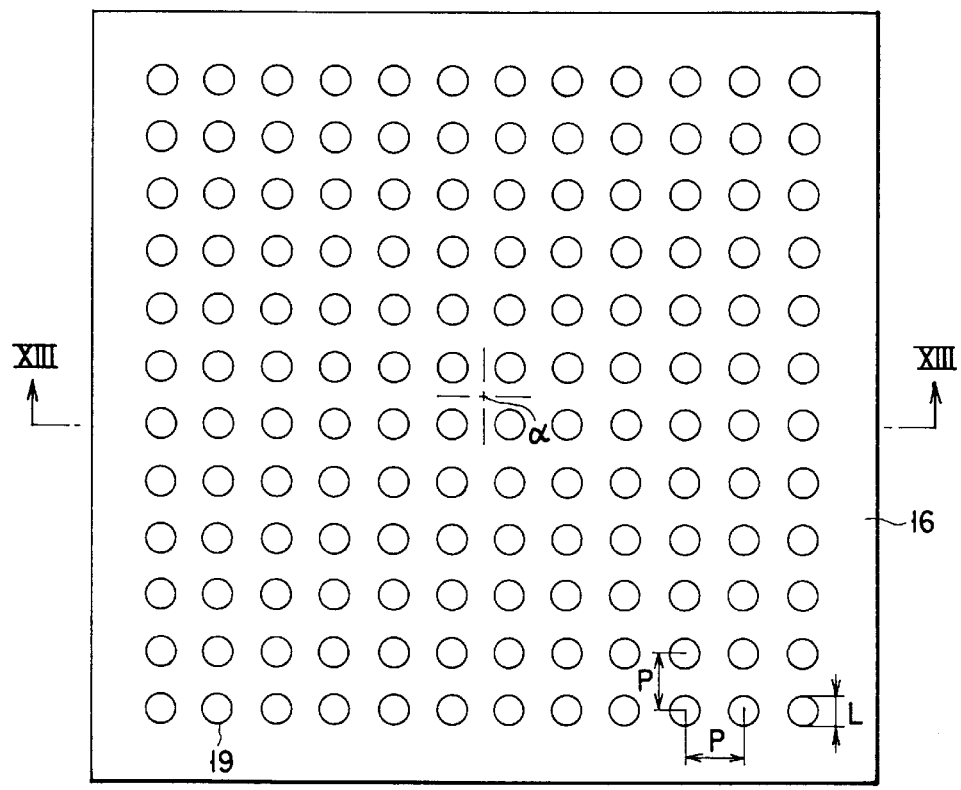
F I G. 12
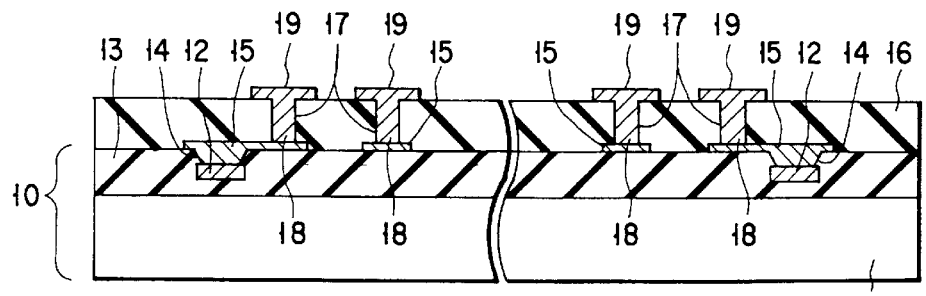
F I G. 13
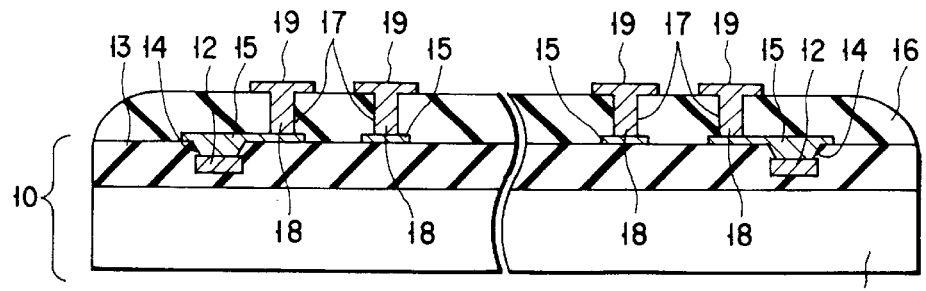
F I G. 14

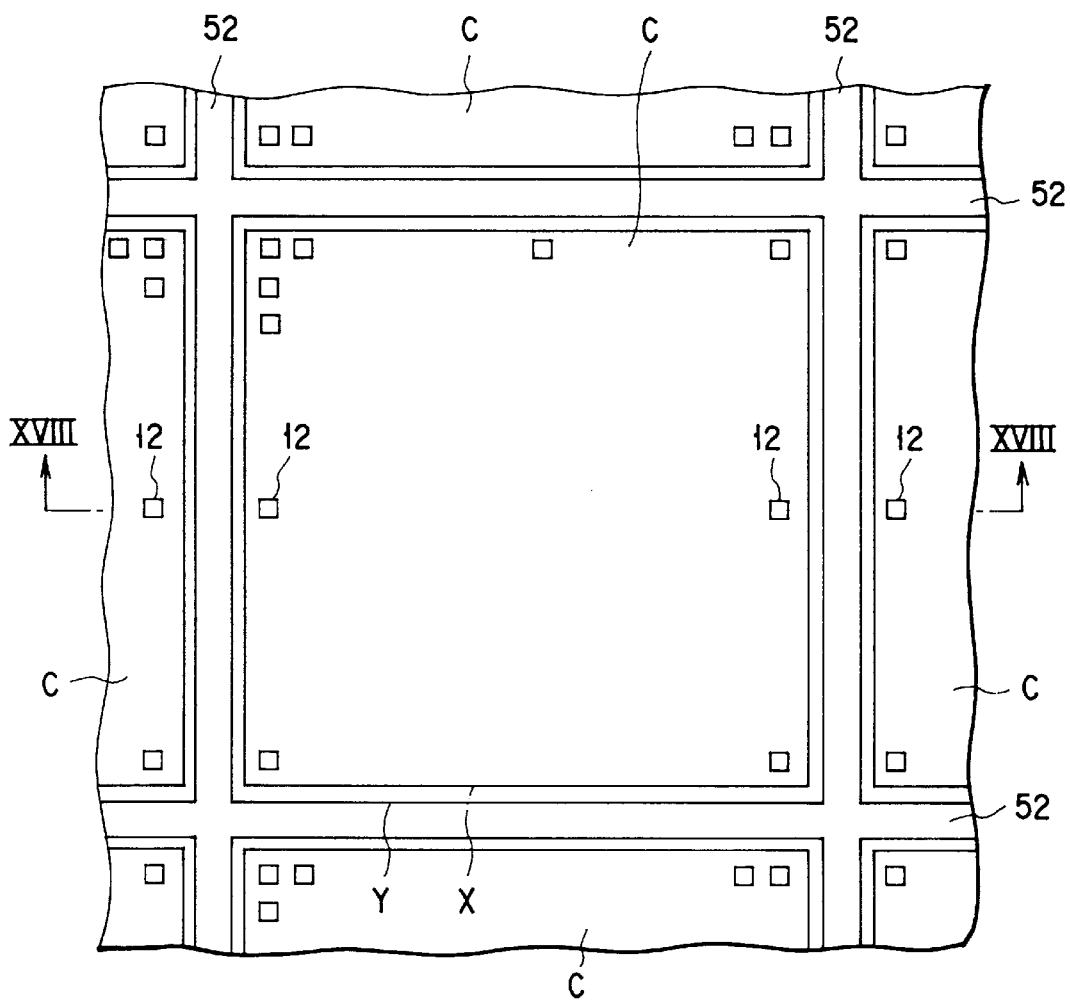
F I G. 17
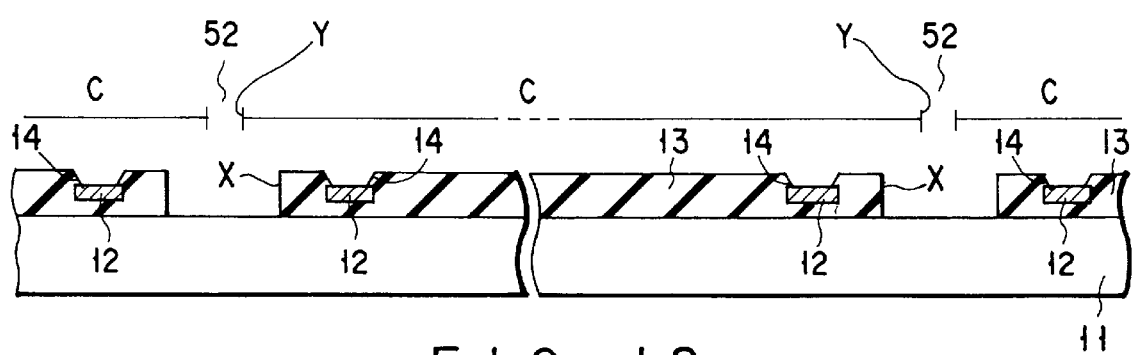
F I G. 18

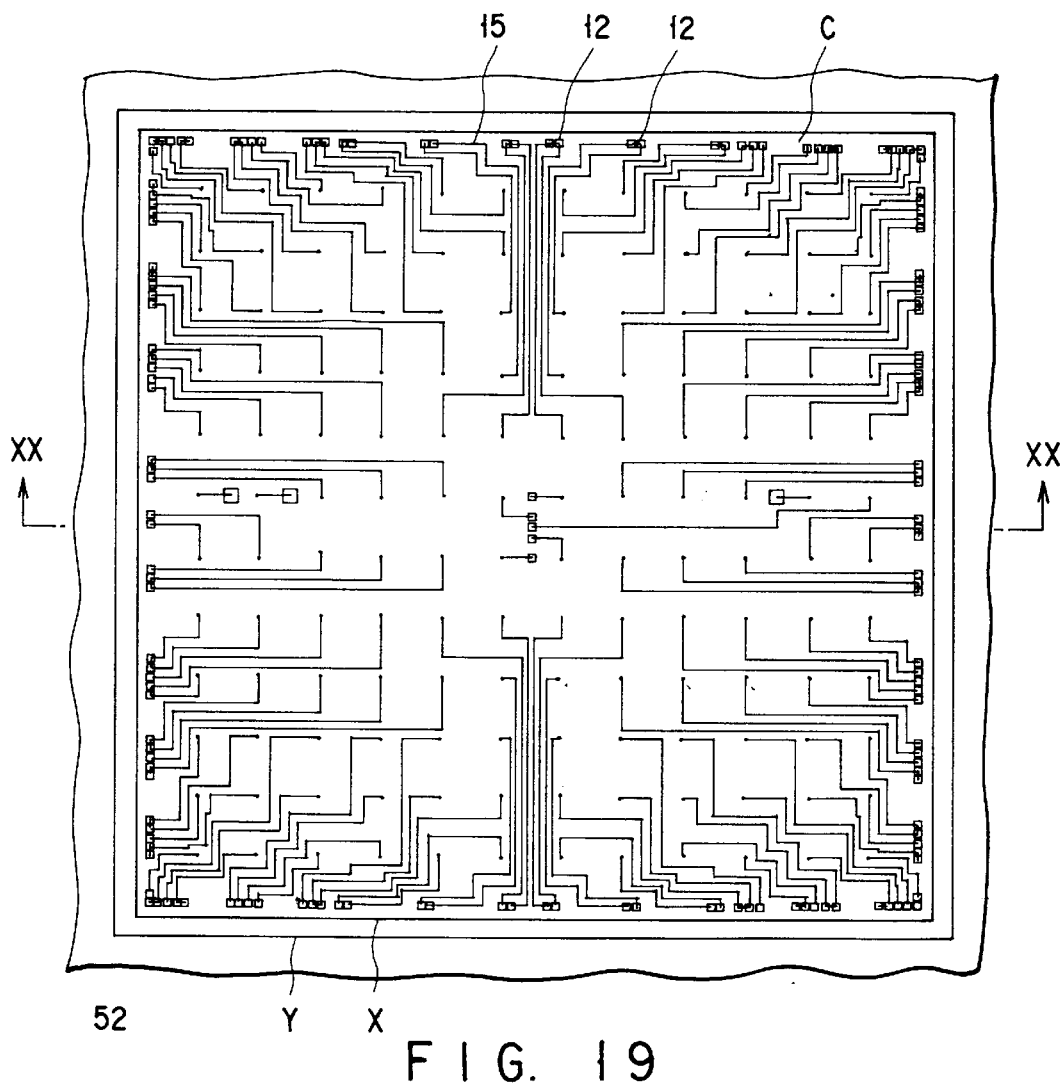
F I G. 19
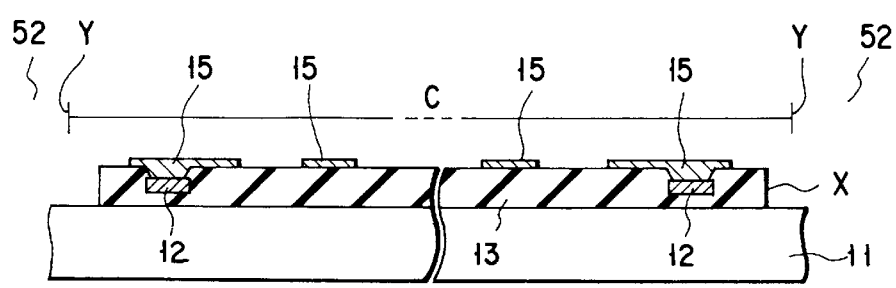
F I G. 20

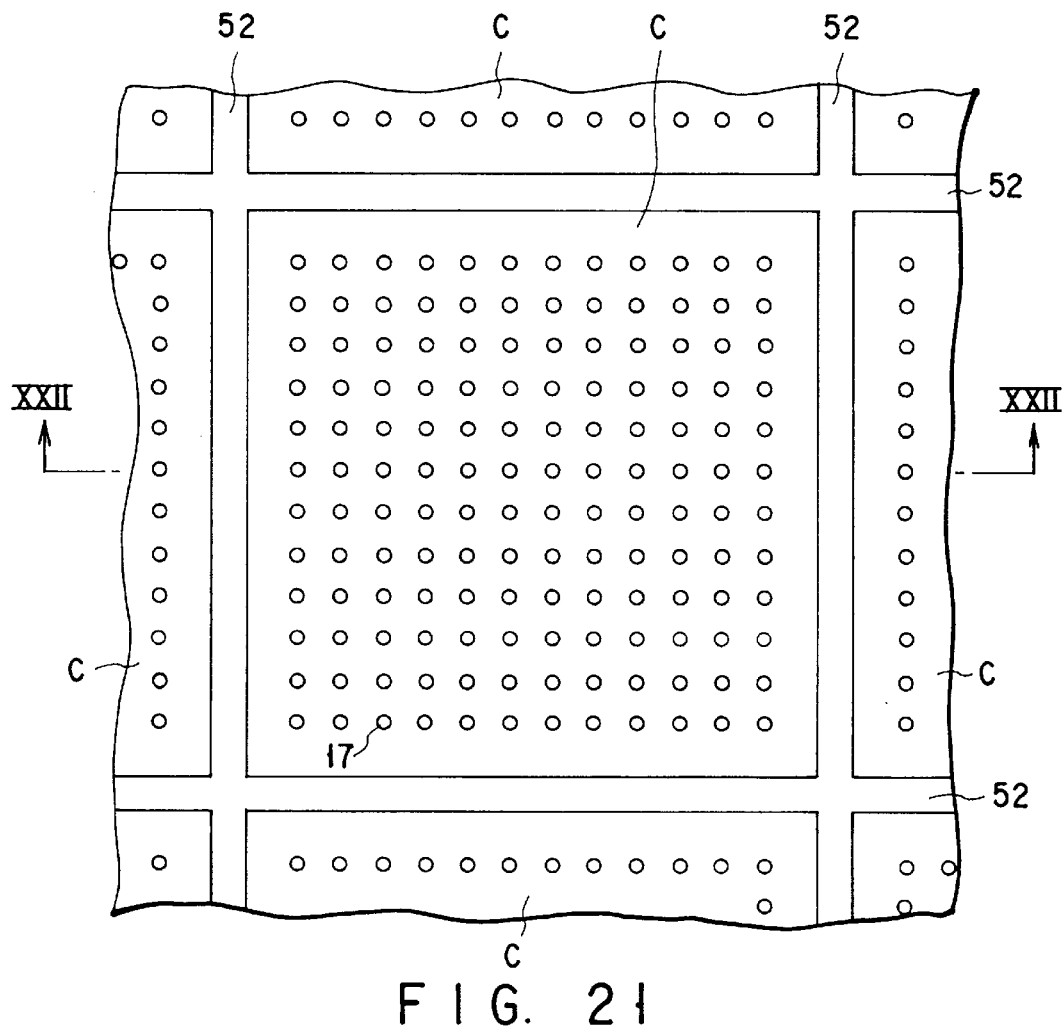
F I G. 21
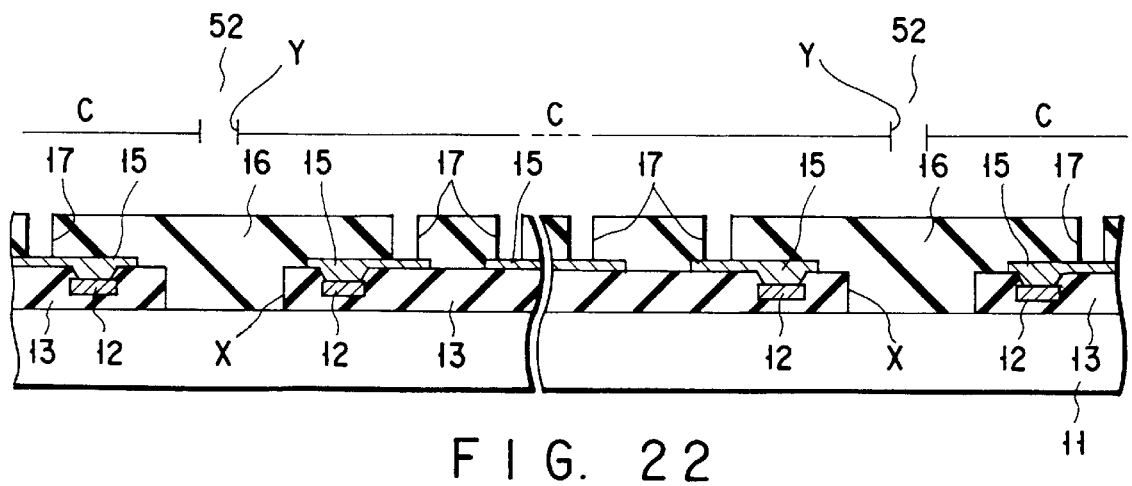
F I G. 22

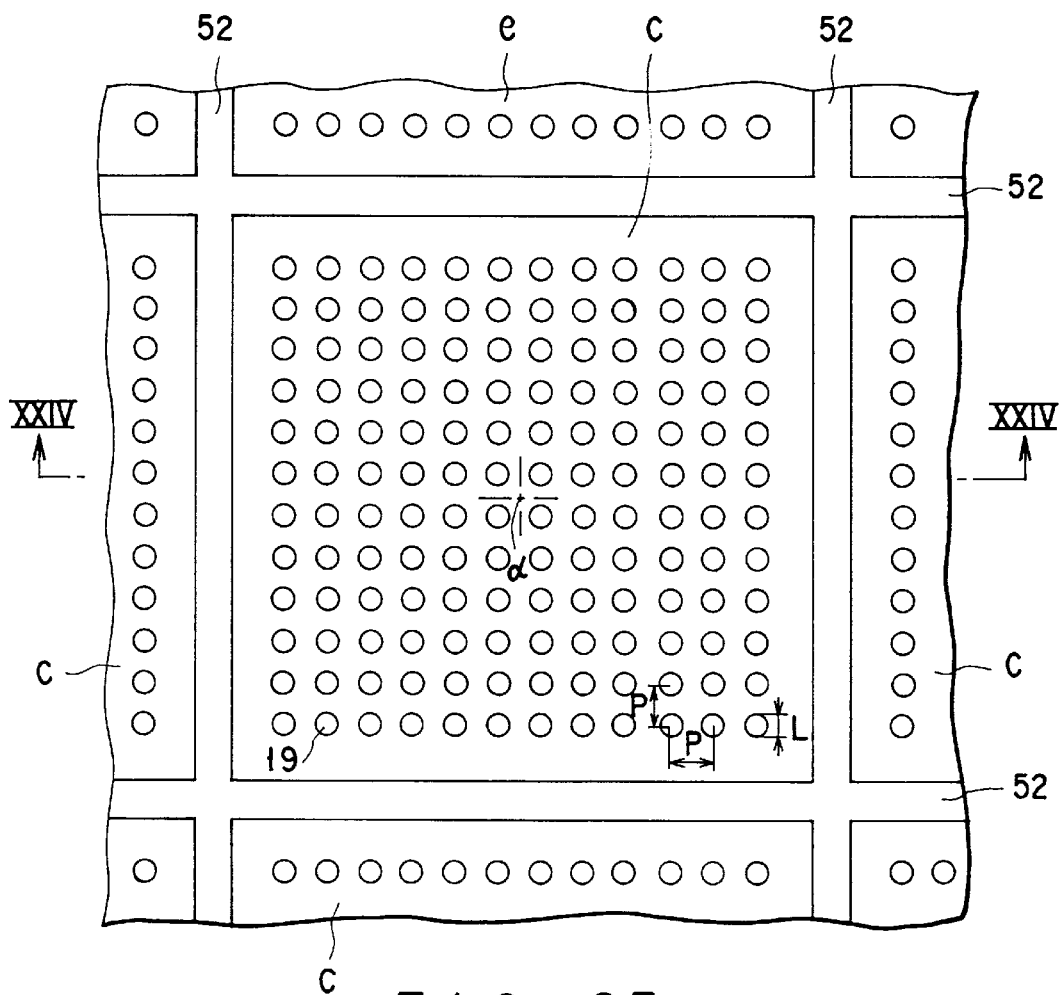
F I G. 23
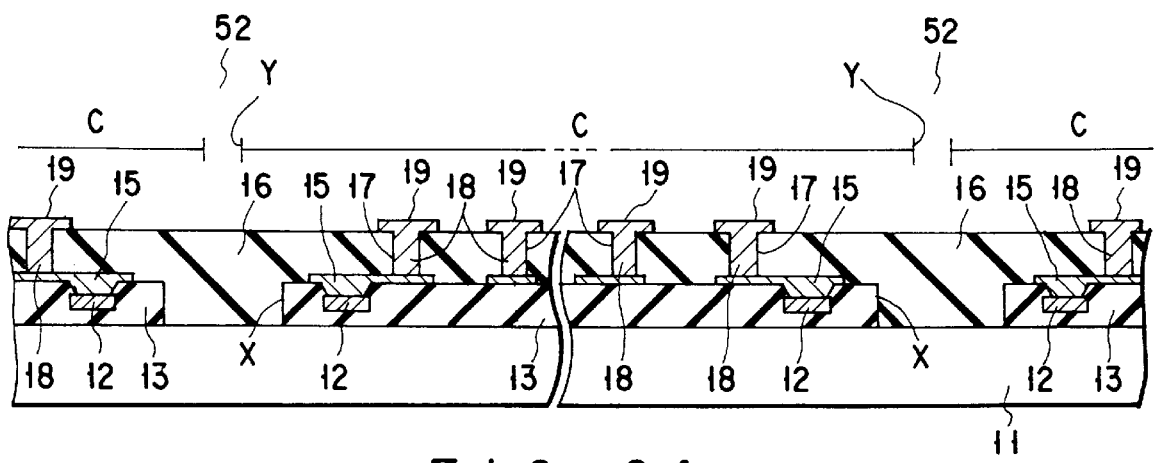
F I G. 24

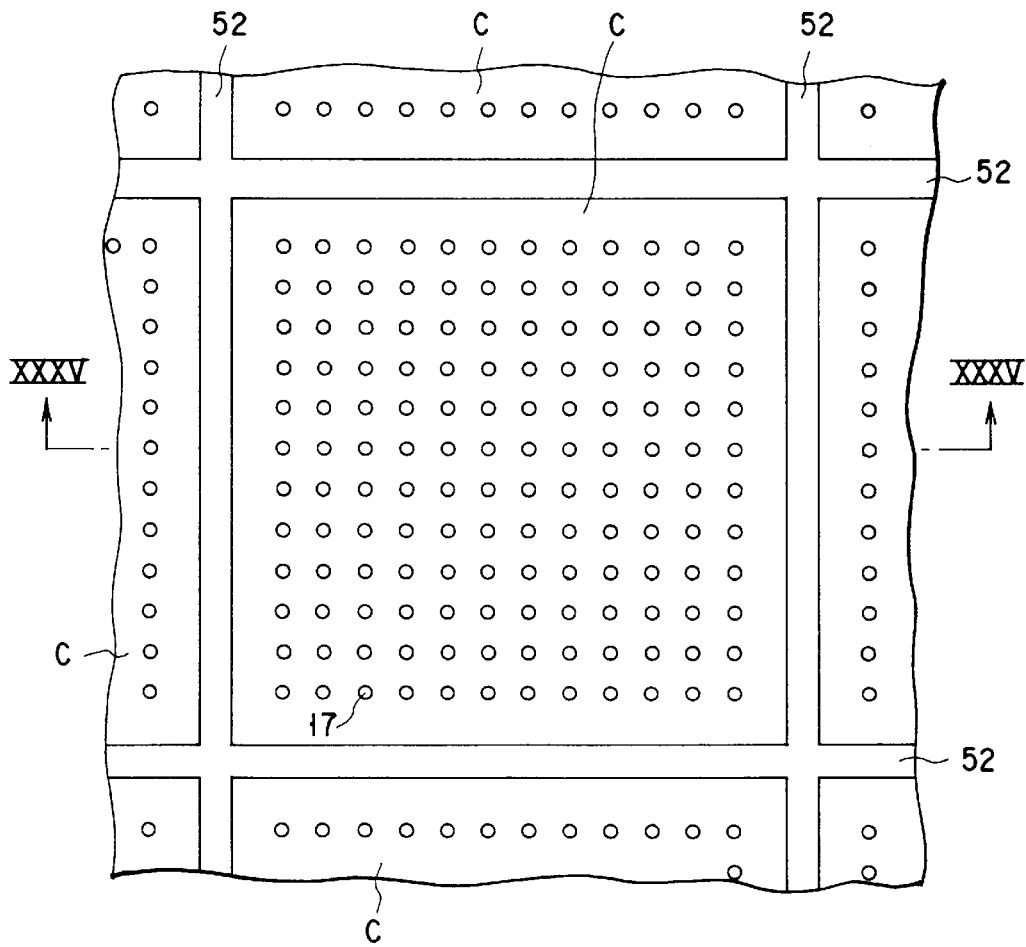
F I G. 34
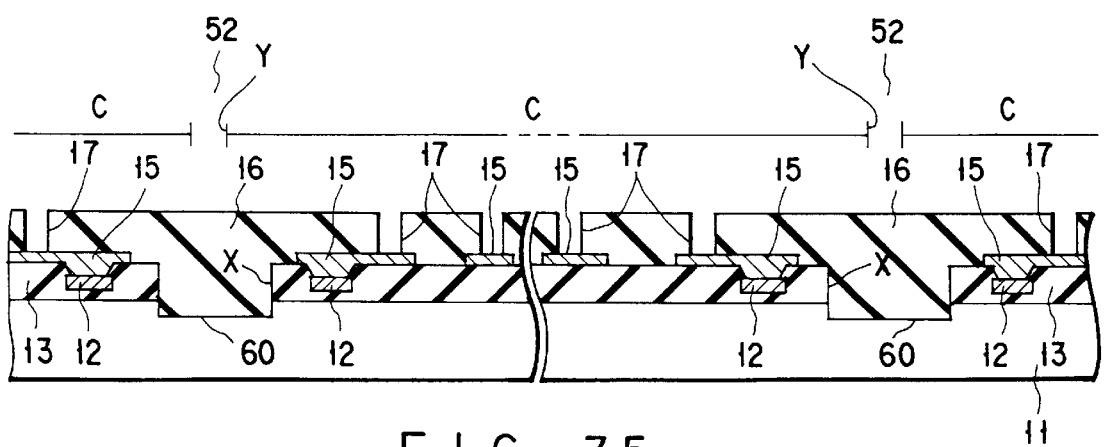
F I G. 35

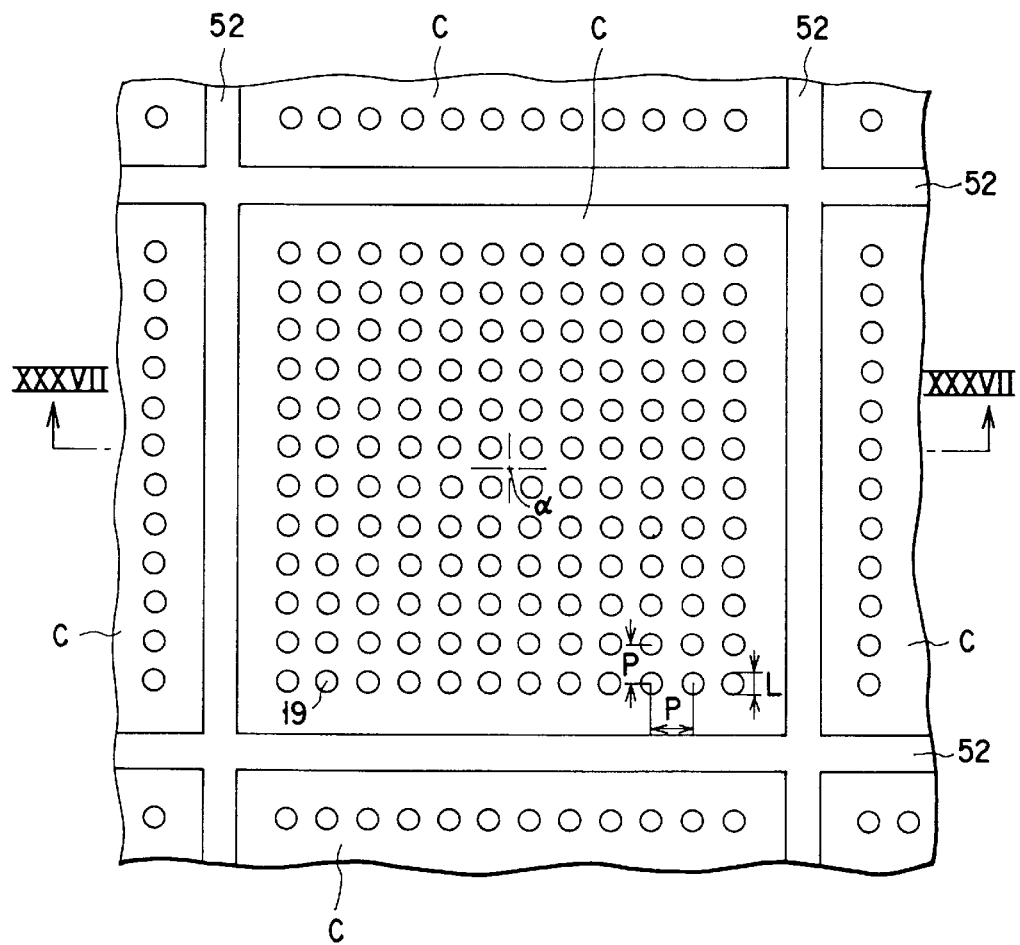
F I G. 36
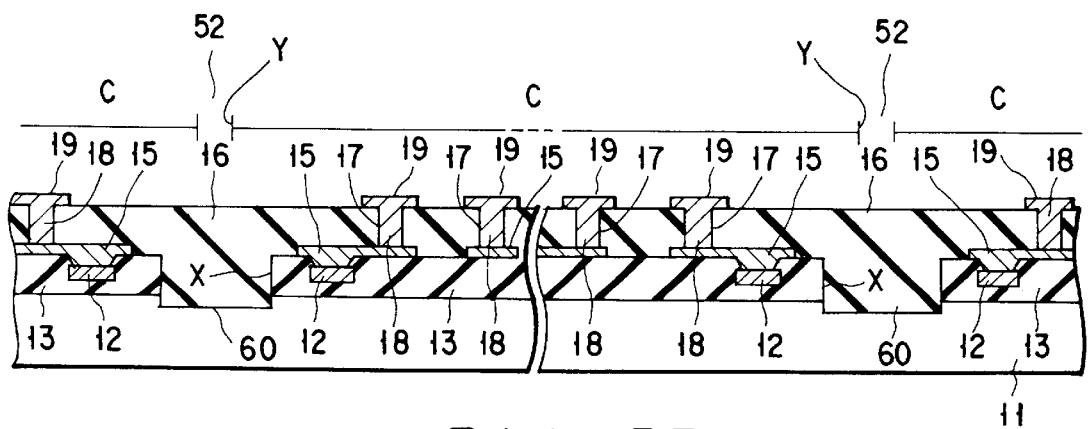
F I G. 37

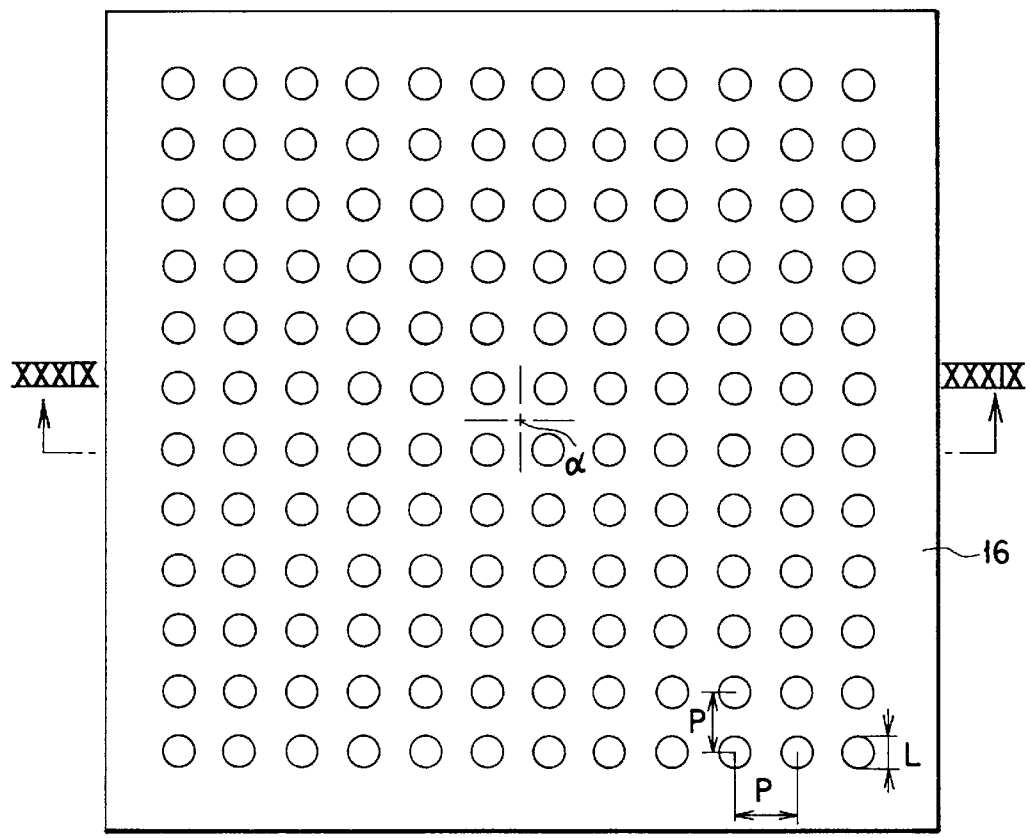
F I G. 38
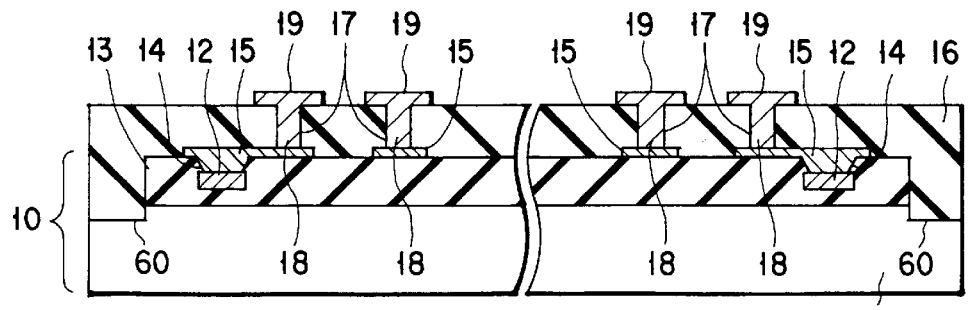
F I G. 39
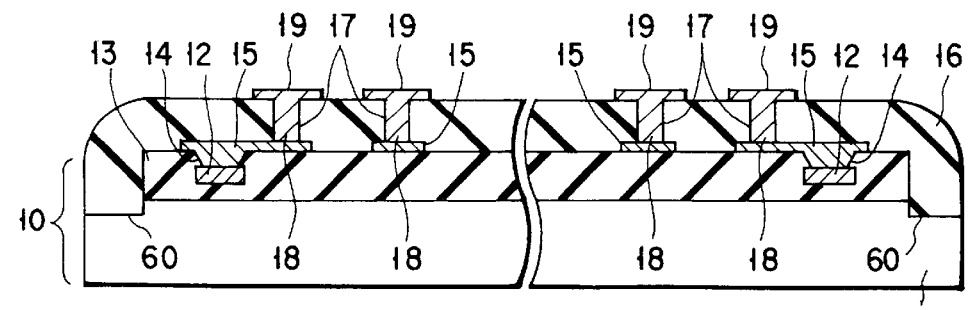
F I G. 40

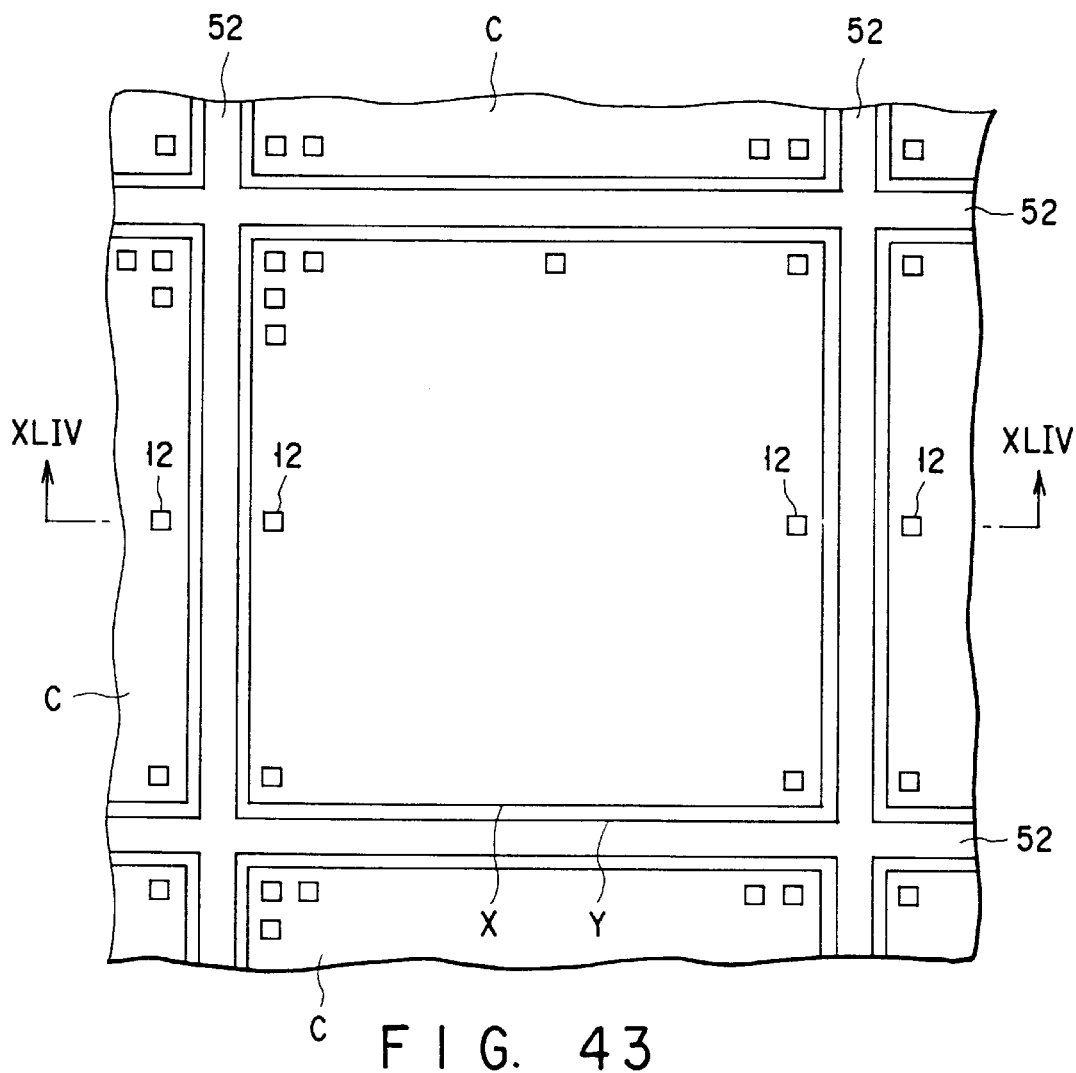
F I G. 43
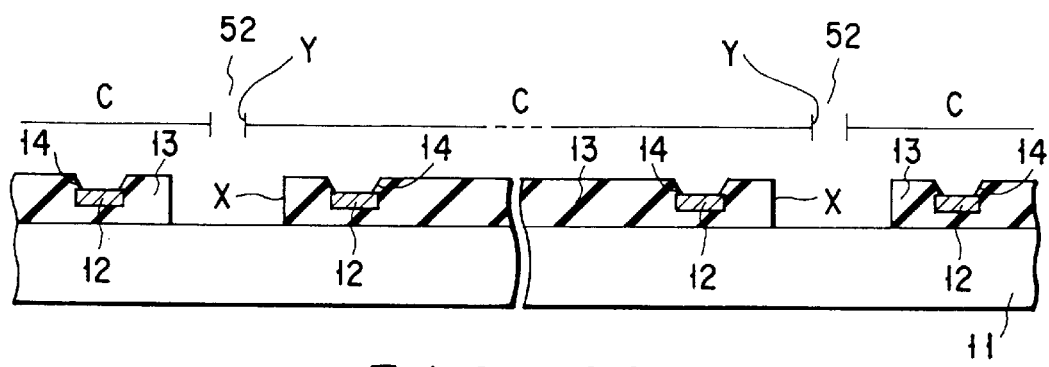
F I G. 44

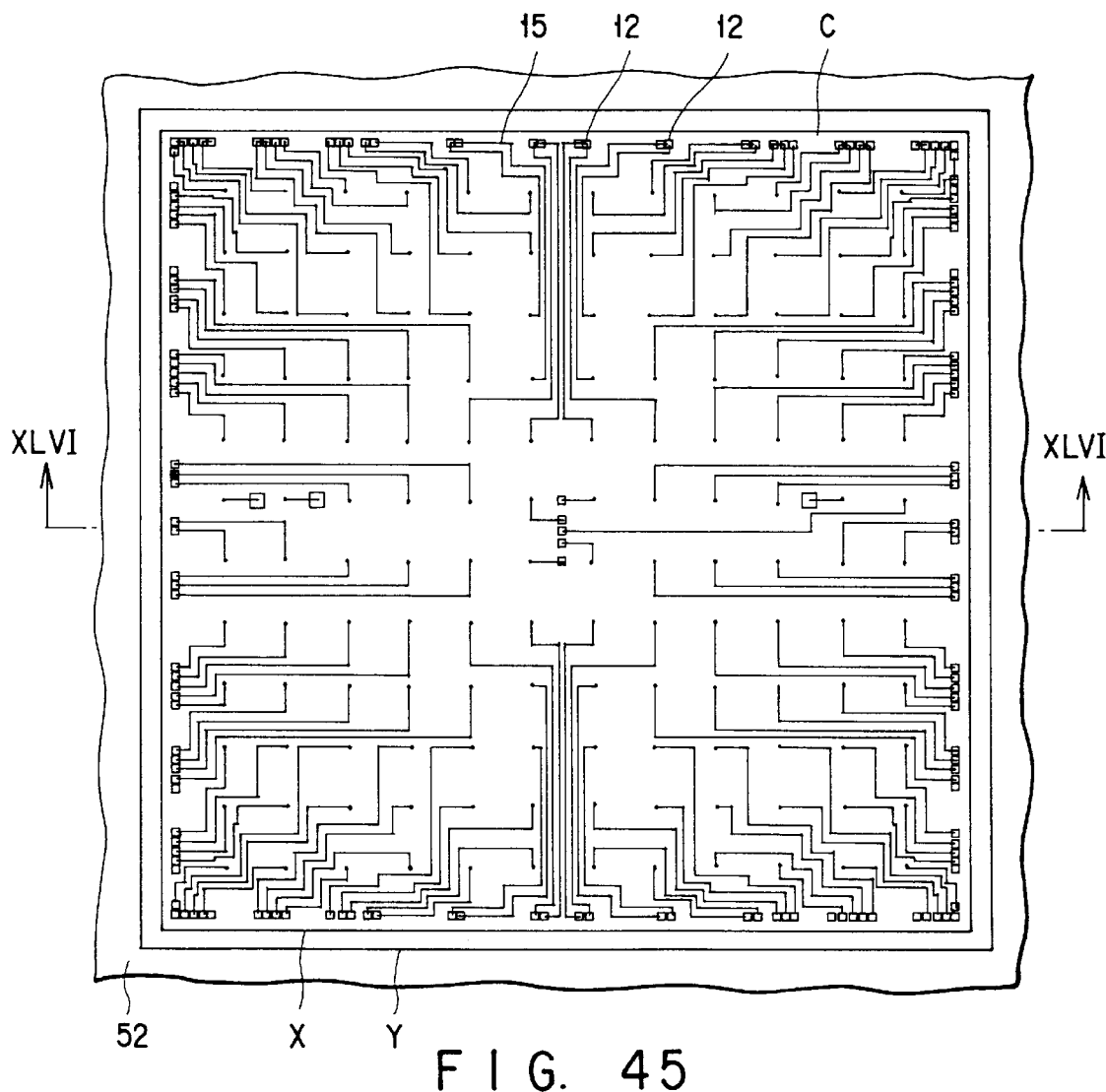
F I G. 45
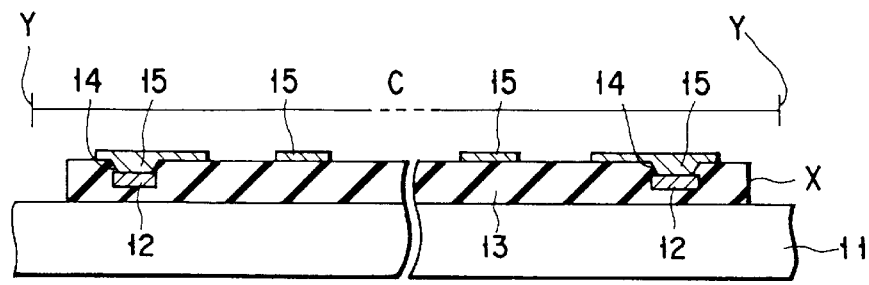
F I G. 46

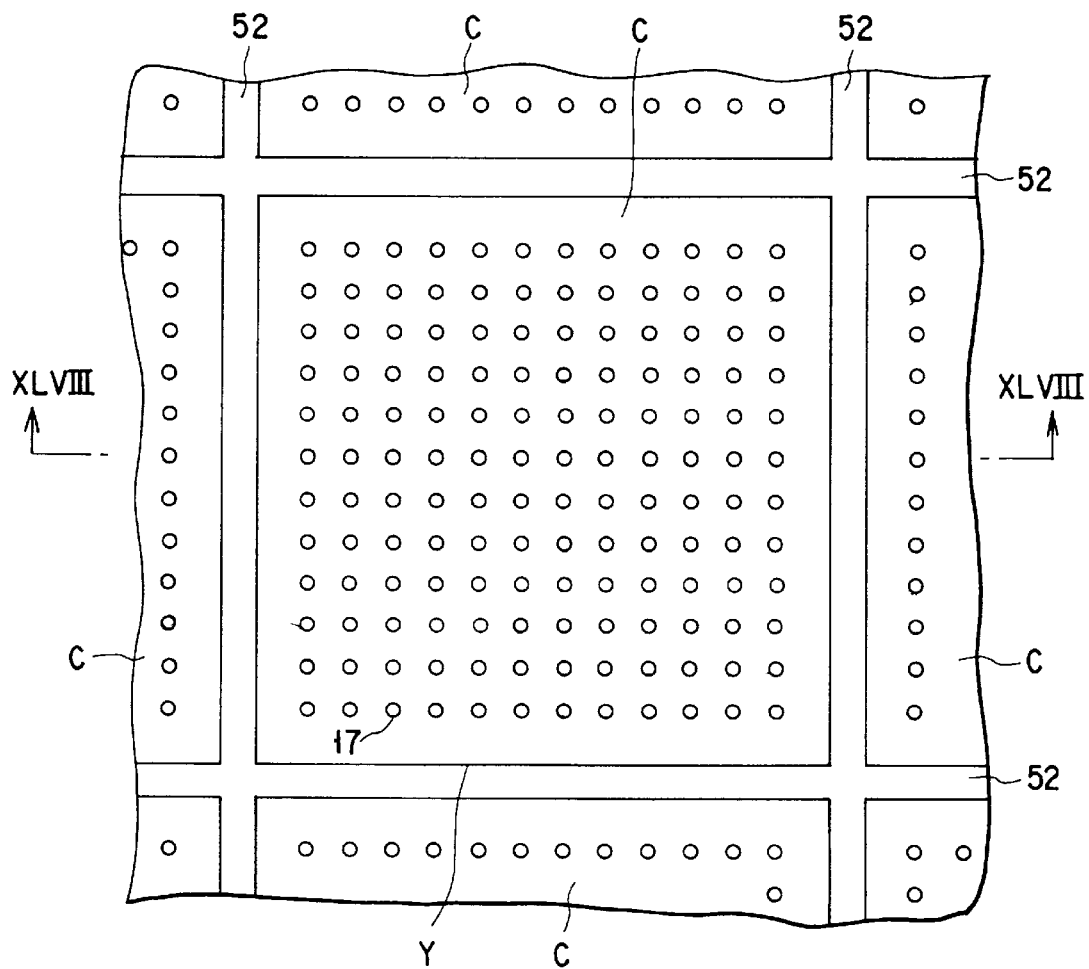
F I G. 47
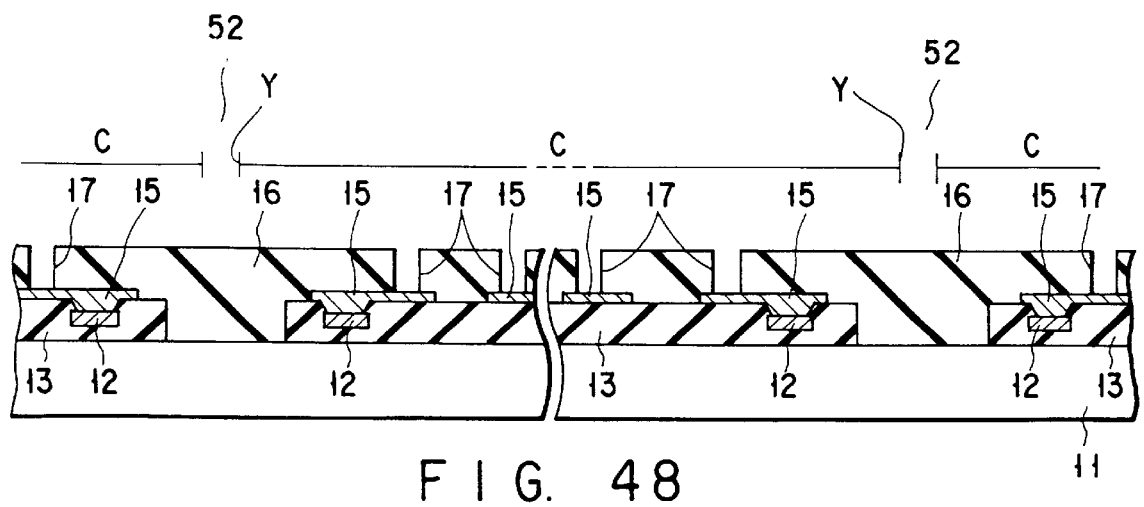
F I G. 48

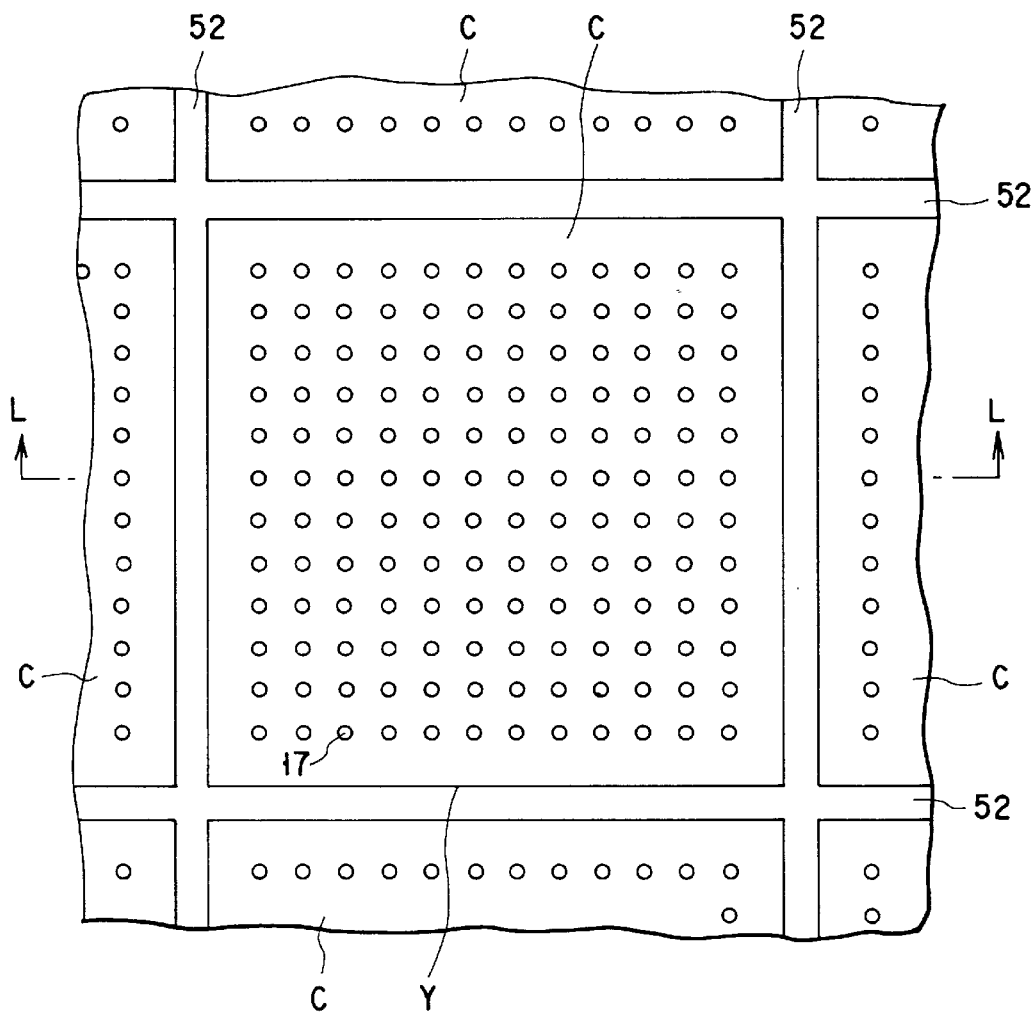
F I G. 49
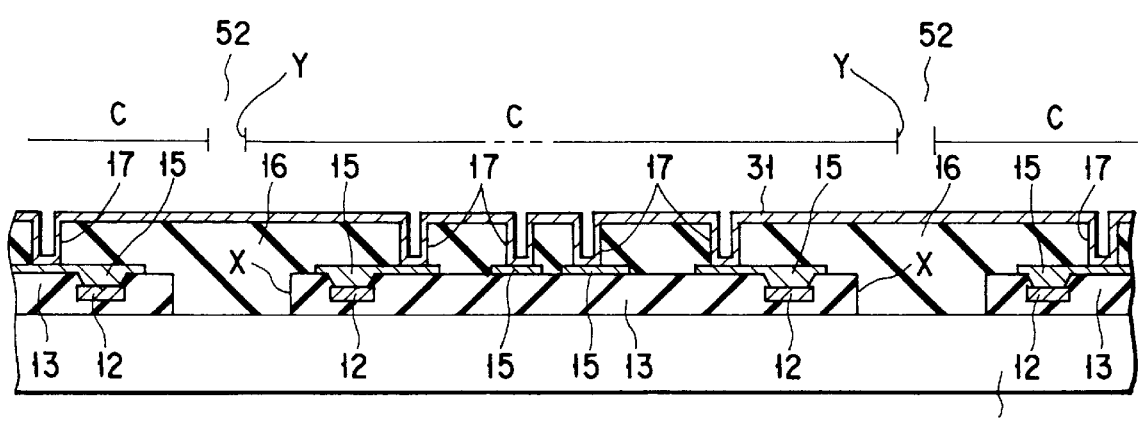
F I G. 50

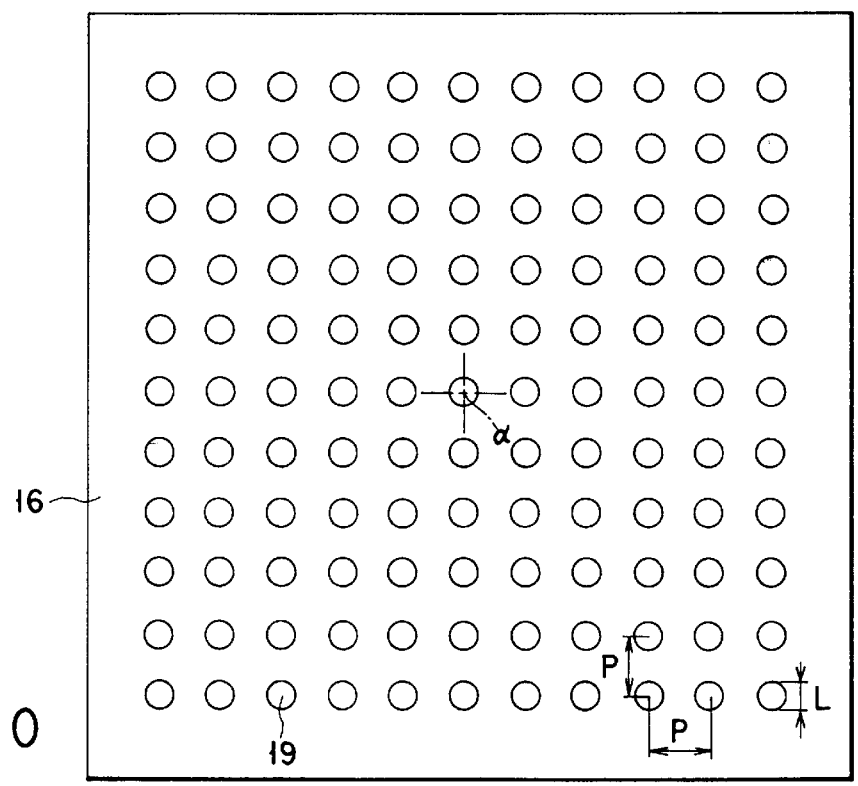
F I G. 70
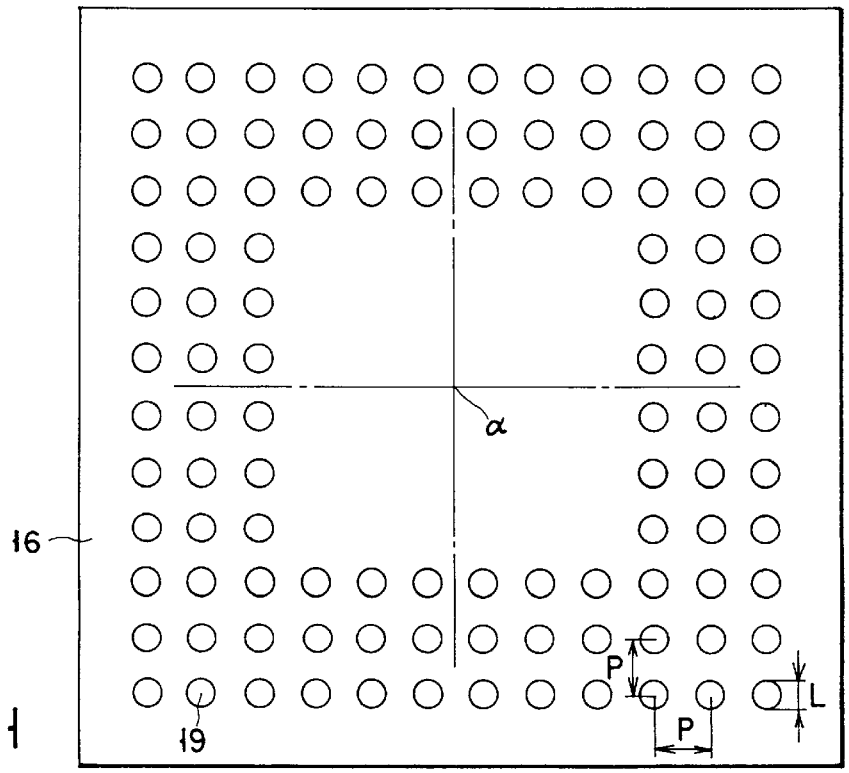
F I G. 71

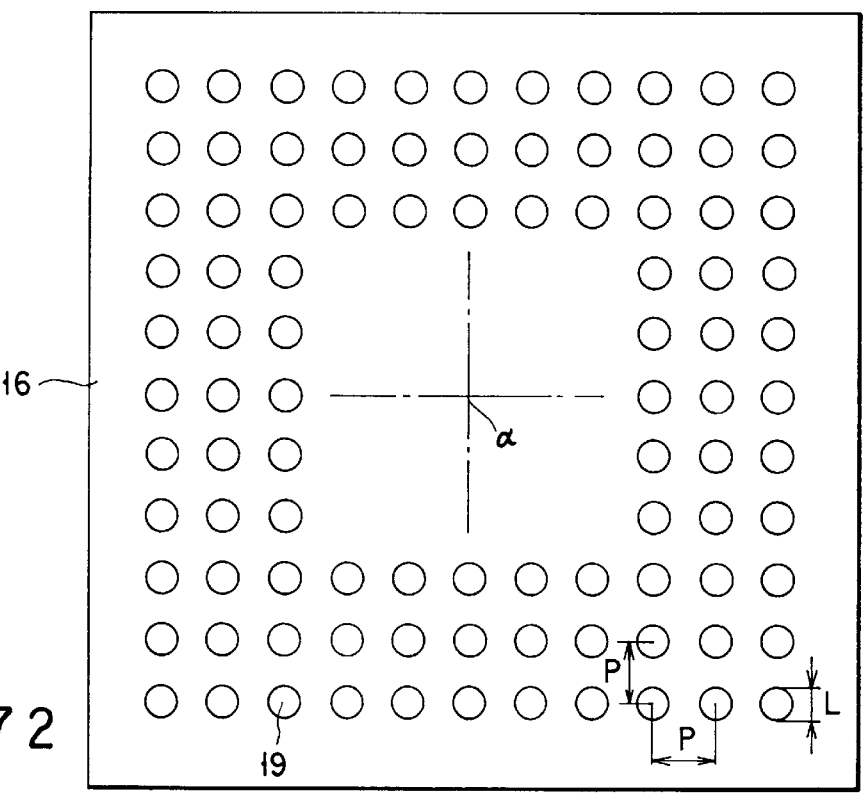
FIG. 72
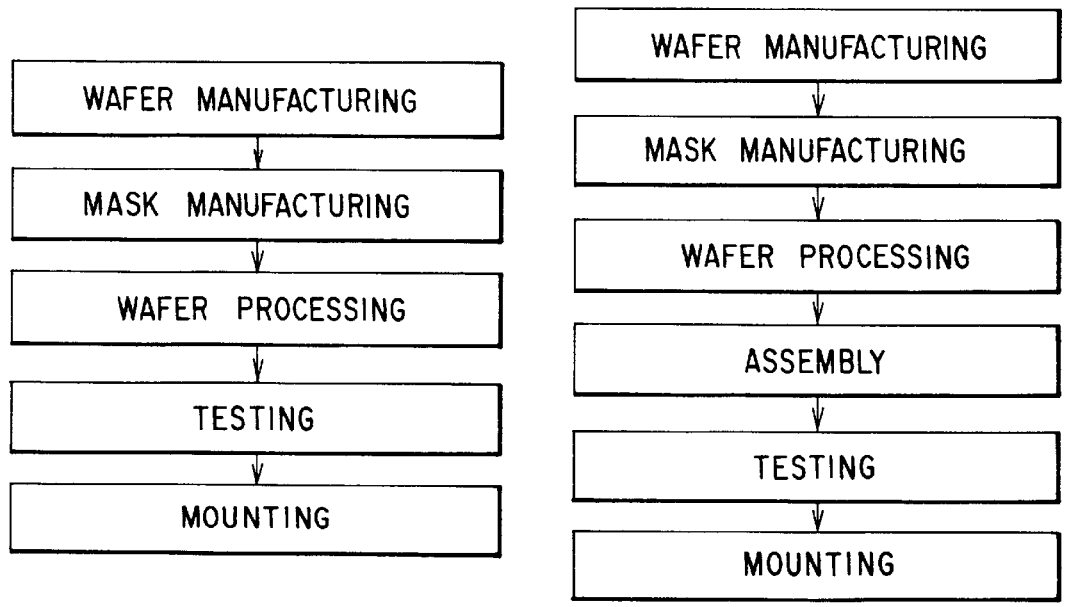
FIG. 73
FIG. 74
(PRIOR ART)

SEMICONDUCTOR PACKAGE INTEGRAL WITH SEMICONDUCTOR CHIP

BACKGROUND OF THE INVENTION

1. Field of the Invention

The present invention relates to semiconductor chip packaging techniques.

2. Description of the Related Art

Conventionally, semiconductor products undergo such various manufacturing processes as shown in FIG. 74 for their completion. The assembly process of incorporating a semiconductor chip into a semiconductor package is essential as one of manufacturing processes for completing semiconductor products.

The object of the assembly process is to facilitate signal communications between components formed in a semiconductor chip and components or devices external to the semiconductor chip, protect the semiconductor chip from humidity and external force, etc.

Some of conventional assembly processes incorporate a semiconductor chip into a semiconductor package such as a thin small outline package (TSOP), a tape carrier package (TCP), or the like.

However, the semiconductor package itself has no function. The cost required for the assembly process causes an increase in the cost of semiconductor products. The size of semiconductor products depend on the size of semiconductor packages, which imposes limitations on reductions in the size of semiconductor products.

SUMMARY OF THE INVENTION

It is an object of the present invention to provide a semiconductor package integral with a semiconductor chip.

Another object of the present invention is to reduce the cost of semiconductor products by excluding the conventional assembly process.

Still another object of the present invention is to reduce the size of semiconductor products by making semiconductor products equal to the semiconductor chip size.

According to an aspect of the present invention, a semiconductor package includes a semiconductor chip, a plurality of interconnection lines, a second passivating film, and a plurality of contacts for connection to external leads.

The semiconductor chip comprises a semiconductor substrate, a plurality of pads formed above the semiconductor substrate, and a first passivating film formed over the entire surface of the semiconductor substrate and having openings each formed over a respective one of the pads. The surface of the first passivating film is made flat.

The interconnection lines are formed on the surface of the first passivating film. Each of the interconnection lines is connected to a respective one of the pads.

The second passivating film is formed over the entire surface of the first passivating film and has through holes above the respective interconnection lines. The through holes are arranged in the form of an array. The surface of the second passivating film is made flat.

The contacts for connection to external leads are formed within and above the respective through holes. The contacts are arranged in the form of an array.

A semiconductor package of the present invention includes a semiconductor chip, a plurality of interconnection lines, a second passivating film, and a plurality of contacts for connection to external leads.

The semiconductor chip comprises a semiconductor substrate, a plurality of pads formed above the semiconductor substrate, and a first passivating film formed over the entire surface of the semiconductor substrate and having openings each formed over a respective one of the pads. The surface of the first passivating film is made flat. When viewed from above the semiconductor substrate, the edges of the first passivating film exist inside the edges of the semiconductor substrate.

The interconnection lines are formed on the surface of the first passivating film. Each of the interconnection lines is connected to a respective one of the pads.

The second passivating film is formed to overlie the edges of the semiconductor substrate and the surface and sides of the first passivating film and has through holes above the respective interconnection lines. The through holes are arranged in the form of an array. The surface of the second passivating film is made flat.

The contacts for connection to external leads are formed within and above the respective through holes. The contacts are arranged in the form of an array.

Another semiconductor package of the present invention includes a semiconductor chip, a plurality of interconnection lines, a second passivating film, and a plurality of contacts for connection to external leads.

The semiconductor chip comprises a semiconductor substrate, a plurality of pads formed above the semiconductor substrate, and a first passivating film formed over the entire surface of the semiconductor substrate and having openings each formed over a respective one of the pads. The surface of the first passivating film is made flat. When viewed from above the semiconductor substrate, the edges of the first passivating film exist inside the edges of the semiconductor substrate. A groove is formed in portions of the semiconductor substrate which are located between the edges of the first passivating film and the edges of the semiconductor substrate.

The interconnection lines are formed on the surface of the first passivating film. Each of the interconnection lines is connected to a respective one of the pads.

The second passivating film is formed to overlie the edge portions of the semiconductor substrate and the surface and sides of the first passivating film and has through holes above the respective interconnection lines. The through holes are arranged in the form of an array. The surface of the second passivating film is made flat.

The contacts for connection to external leads are formed within and above the respective through holes. The contacts are arranged in the form of an array.

Still another semiconductor package of the present invention includes a semiconductor chip, a plurality of interconnection lines, a second passivating film, a metal layer, and a plated layer.

The semiconductor chip comprises a semiconductor substrate, a plurality of pads formed above the semiconductor substrate, and a first passivating film formed over the entire surface of the semiconductor substrate and having openings each formed over a respective one of the pads. The surface of the first passivating film is made flat.

The interconnection lines are formed on the surface of the first passivating film. Each of the interconnection lines is connected to a respective one of the pads.

The second passivating film is formed over the entire surface of the first passivating film and has through holes above the respective interconnection lines. The through holes are arranged in the form of an array. The surface of the second passivating film is made flat.

The metal layer is formed on the bottom and sides of each of the through holes.

The plated layer is formed within and above each of the through holes. The plated layer forms contacts for connection to external leads over the respective through holes, which are arranged in the form of an array.

A semiconductor package manufacturing method of the present invention comprises the steps of forming a plurality of pads on each of semiconductor chip areas of a wafer, forming a first passivating film to overlie the pads, forming openings in portions of the first passivating film which are located above the pads, forming a plurality of interconnection lines on the first passivating film, forming a second passivating film functioning as a package on the first passivating film, forming through holes in portions of the second passivating film which are located above the respective interconnection lines and arranged in the form of an array, forming a conductive layer within and above the through holes and on the second passivating film, patterning the conductive layer to form contacts for connection to external leads over the respective through holes, and cutting the wafer into the semiconductor chip areas to thereby form semiconductor packages the size of the semiconductor chip areas.

Another semiconductor package manufacturing method of the present invention comprises the steps of forming a plurality of pads on each of semiconductor chip areas of a wafer, forming a first passivating film to overlie the pads, forming openings in portions of the first passivating film which are located above the respective pads, etching the first passivating film to leave it only within the semiconductor chip area, forming a plurality of interconnection lines on the first passivating film, forming a second passivating film functioning as a package over the entire surface of the semiconductor chip area to overlie the surface and sides of the first passivating film, forming through holes in portions of the second passivating film which are located above the respective interconnection lines and arranged in the form of an array, forming a conductive layer within and above the through holes and on the second passivating film, patterning the conductive layer to form contacts for connection to external leads over the respective through holes, and cutting the wafer into the semiconductor chip areas to thereby form semiconductor packages the size of the semiconductor chip areas.

Still another semiconductor package manufacturing method of the present invention comprises the steps of forming a plurality of pads on each of semiconductor chip areas of a wafer, forming a first passivating film to overlie the pads, forming first openings in portions of the first passivating film which are located above the respective pads, etching the first passivating film to leave it only within the semiconductor chip area, forming a plurality of interconnection lines on the first passivating film, forming a second passivating film functioning as a package over the entire surface of the semiconductor chip area to overlie the surface and sides of the first passivating film, forming through holes in portions of the second passivating film which are located above the respective interconnection lines and arranged in the form of an array, forming a metal layer at the bottom and on sides of the through holes and on the second passivating film, forming a resist layer on the metal layer, removing the resist layer over the through holes to form second openings, forming a plated layer within the through holes and the second openings by means of electroplating using the metal layer as a plating electrode to thereby form contacts for connection to external leads over the respective through holes, and cutting the wafer into the semiconductor chip areas to thereby form semiconductor packages the size of the semiconductor chip areas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a plan view of a semiconductor package according to a first embodiment of the present invention;

FIG. 2 is a sectional view taken along line II—II of FIG. 1;

FIG. 12 is a plan view illustrating one step of manufacture of the package of FIG. 1;

FIG. 13 is a sectional view taken along line XIII—XIII of FIG. 12;

FIG. 14 is a plan view illustrating one step of manufacture of the package of FIG. 1;

FIG. 17 is a plan view illustrating one step of manufacture of the package of FIG. 15;

FIG. 18 is a sectional view taken along line XVIII—XVIII of FIG. 17;

FIG. 19 is a plan view illustrating one step of manufacture of the package of FIG. 15;

FIG. 20 is a sectional view taken along line XX—XX of FIG. 19;

FIG. 21 is a plan view illustrating one step of manufacture of the package of FIG. 19;

FIG. 22 is a sectional view taken along line XXII—XXII of FIG. 21;

FIG. 23 is a plan view illustrating one step of manufacture of the package of FIG. 15;

FIG. 24 is a sectional view taken along line XXIV—XXIV of FIG. 23;

FIG. 34 is a plan view illustrating one step of manufacture of the package of FIG. 28;

FIG. 35 is a sectional view taken along line XXXV—XXXV of FIG. 34;

FIG. 36 is a plan view illustrating one step of manufacture of the package of FIG. 28;

FIG. 37 is a sectional view taken along line XXXVII—XXXVII of FIG. 36;

FIG. 38 is a plan view illustrating one step of manufacture of the package of FIG. 28;

FIG. 39 is a sectional view taken along line XXXIX—XXXIX of FIG. 28;

FIG. 40 is a plan view illustrating one step of manufacture of the package of FIG. 28;

FIG. 43 is a plan view illustrating one step of manufacture of the package of FIG. 41;

FIG. 44 is a sectional view taken along line XLIV—XLIV of FIG. 43;

FIG. 45 is a plan view illustrating one step of manufacture of the package of FIG. 41;

FIG. 46 is a sectional view taken along line XLVI—XLVI of FIG. 45;

FIG. 47 is a plan view illustrating one step of manufacture of the package of FIG. 41;

FIG. 48 is a sectional view taken along line XLVIII—XLVIII of FIG. 47;

FIG. 49 is a plan view illustrating one step of manufacture of the package of FIG. 41;

FIG. 50 is a sectional view taken along line L—L of FIG. 49;

FIG. 70 is a plan view of a semiconductor package according to a ninth embodiment of the present invention;

FIG. 71 is a plan view of a semiconductor package according to a tenth embodiment of the present invention;

FIG. 72 is a plan view of a semiconductor package according to an eleventh embodiment of the present invention;

FIG. 73 shows all steps of manufacture of a semiconductor product using a package of the present invention; and FIG. 74 shows all steps of manufacture of a semiconductor product using a conventional package.

DETAILED DESCRIPTION OF THE PREFERRED EMBODIMENTS

Figure 3:
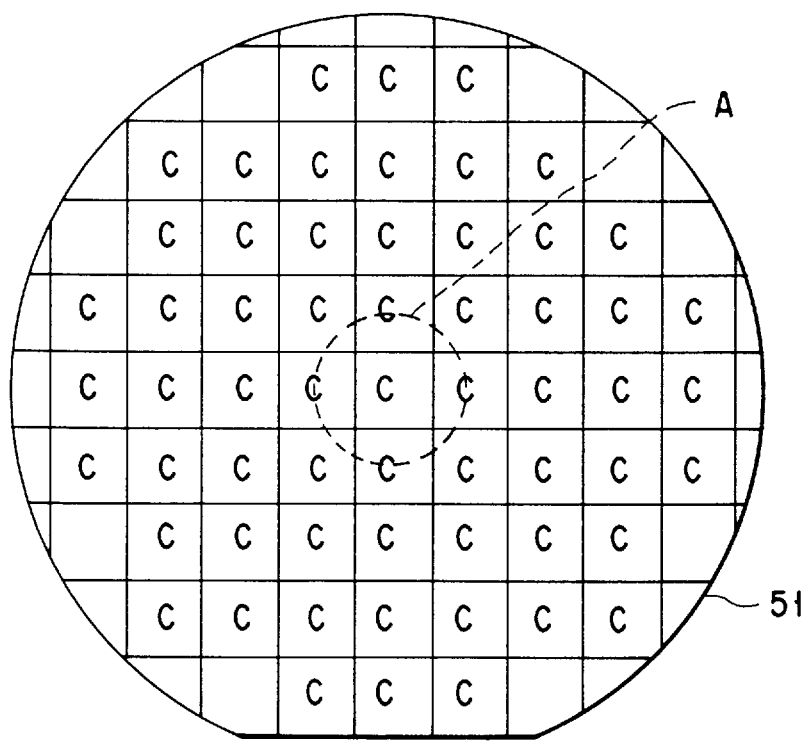
FIG. 3 is a plan view illustrating one step of manufacture of the package of FIG. 1.

Hereinafter, semiconductor packages of the present invention which are integral with semiconductor chips and methods of manufacture thereof will be described in detail with reference to the accompanying drawings.

FIG. 1 shows a semiconductor package according to a first embodiment of the present invention, and FIG. 2 is a sectional diagram taken along line II—II of FIG. 1.

First, the structure of this semiconductor package will be described.

For example, a semiconductor chip 10 has a square shape and measures 13.5 mm on a side. Semiconductor components having specific functions are formed on a semiconductor substrate 11. A plurality of pads (input and output terminals) 12 is formed on the substrate 11. The pads 12 are connected to the substrate 11, impurity regions within the substrate, and semiconductor components.

When conventional wafer processing (processing of forming semiconductor components on a wafer) is used, these pads are mainly formed on peripheral portions of a semiconductor substrate. In the present invention, however, the pads 12 may be placed uniformly over the substrate by the use of a novel wafer process.

A passivating film 13 is formed on the semiconductor substrate 11. This passivating film is the same as that for use with the conventional wafer processing and consists of an insulating material such as silicon oxide or silicon nitride. The passivating film 13 has openings 14 above the pads 12. The surface of the passivating film 13 is made flat.

A plurality of interconnection lines 15 is formed on the passivating film 13, which constitutes one of features of the present invention. The interconnection lines 15 are connected to the pads 12 immediately below the openings 14 in the passivating film 13. Each interconnection line consists of a conductor such as aluminum or copper.

A passivating film 16 is formed over the passivating film 13, which constitutes one of features of the present invention. This passivating film, which has not been used with any conventional wafer process, covers the pads 12 completely. That is, the passivating film 16 will serve as a package.

Thus, the passivating film 16 is set to have a thickness in the range from 0.05 to 0.2 mm so that it can fully serve as a package. The surface of the passivating film 16 is made flat so that electrodes may be formed thereon easily.

The passivating film 16 has through holes 17 above the metal lines 15. When seen from above the semiconductor substrate 11, the through holes 17 are arranged in a grid form or array form. The through holes 17 are arranged symmetrically with respect to the central point α of the surface of the passivation insulating film 16.

An electrically conductive layer 18 is formed within the through holes 17 in the passivating film 16 and on portions of the passivating film 16 adjacent to the through holes. The conductive layer 18 consists of copper, gold, nickel, or a two-layered structure of nickel and gold. The conductive layer 18 constitutes on the surface of the passivating film 16 contacts (electrodes) 19 for connection to external leads.

As shown in FIG. 1, for example, a total of 144 metal contacts is formed in a 12×12 array at a pitch P of about 1 mm with each contact having a circular shape of a diameter L of about 0.5 mm.

According to the semiconductor package thus formed, the back and sides of the semiconductor substrate 11 are used as part of the package and the passivating film 16 formed over the front of the semiconductor substrate is used as part of the package.

According to the present invention, therefore, the semiconductor package can be formed in the wafer process, permitting the assembly process to be excluded as shown in FIG. 73. Thus, the semiconductor package of the present invention permits the cost of semiconductor products (finished products) to be lowered in comparison with conventional semiconductor packages requiring the assembly process.

The semiconductor device test processing, such as functional test, burn-in, etc., shown in FIG. 73 can be performed readily by connecting a socket to the contacts 19, providing test signals to semiconductor components and taking the test results from the semiconductor components.

According to the semiconductor package of the present invention, since the back and the sides of the semiconductor substrate 11 are used as part of the package, the size of the semiconductor products becomes equal to that of the semiconductor substrate 11. That is, the size of the semiconductor products can be decreased because the semiconductor package is integral with the semiconductor chip.

Therefore, a number of semiconductor products can be mounted on a printed-circuit board at a high density, lowering the cost for the mounting processing shown in FIG. 73.

The front of the semiconductor substrate 11 is completely coated with the passivating film 16, whereby the semiconductor package of the present invention is made resistant to humidity and external force.

A manufacturing method of the semiconductor package of FIGS. 1 and 2 will be described hereinafter.

First, as shown in FIG. 3, an LSI structure (including semiconductor components) is formed within each of semiconductor chip regions C of a wafer 51 by means of the standard wafer processing.

Figure 4:
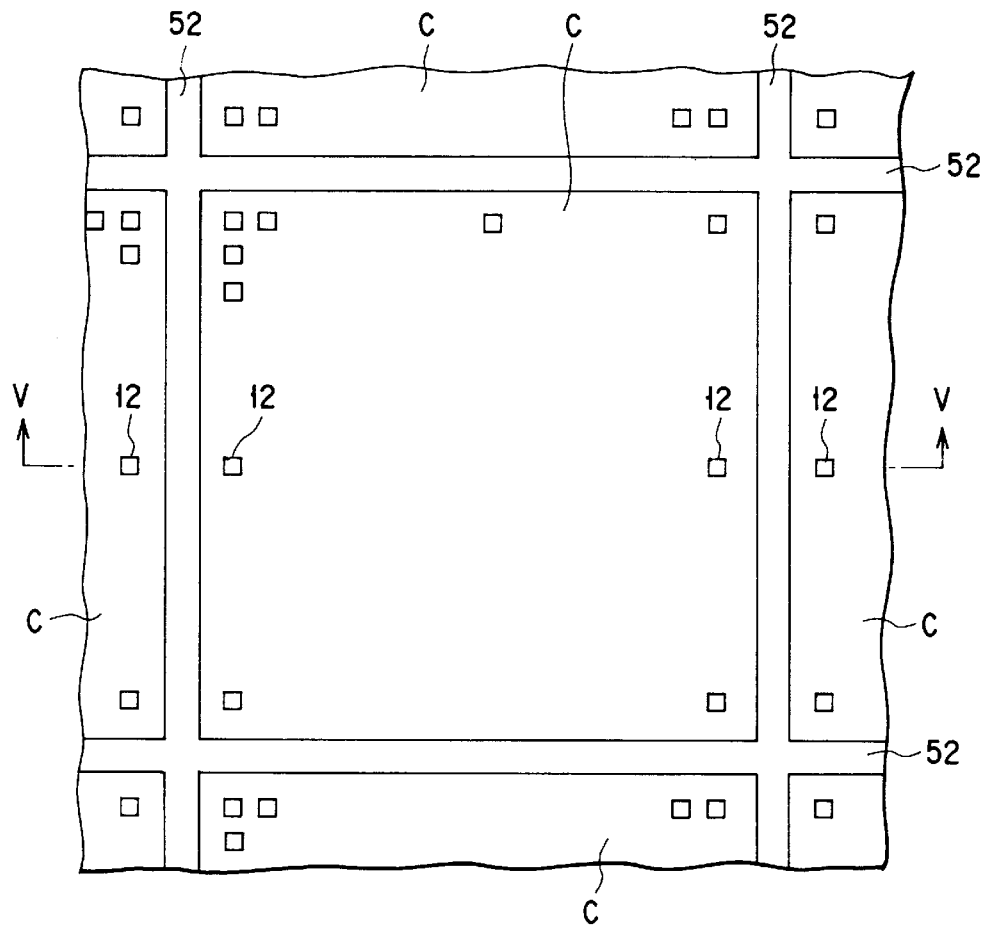
FIG. 4 is a plan view illustrating one step of manufacture of the package of FIG. 1.
Figure 5:
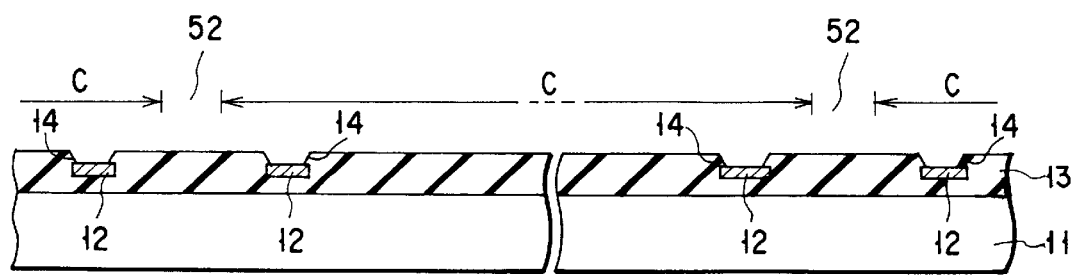
FIG. 5 is a sectional view taken along line V—V of FIG. 4.

As shown in FIGS. 4 and 5, which are enlarged views of the portion A of FIG. 4, a plurality of pads 12 is formed on each semiconductor chip region C. With the conventional wafer process, these pads are formed mainly in peripheral portions of the semiconductor substrate 11. In the present invention, however, the pads may be formed evenly over the entire surface of the semiconductor substrate by means of a novel wafer process.

Each semiconductor chip region C, for example, has a square shape and measures about 13.5 mm on a side. A dicing line 52 is placed between semiconductor chip regions C.

The passivating film 13 is formed on the semiconductor substrate 11 by means of CVD by way of example to thereby overlie semiconductor components. This passivating film 13 is the same as that used in the conventional wafer processing and consists of an insulating material such silicon oxide, silicon nitride or the like.

After the surface of the passivating film 13 has been made flat by means of chemical mechanical polishing (CMP) by way of example, the passivating film is partly etched using a photoetching process (PEP). As a result, openings 14 are formed in the passivating film 13 each of which reaches the respective individual pads 12.

Figure 6:
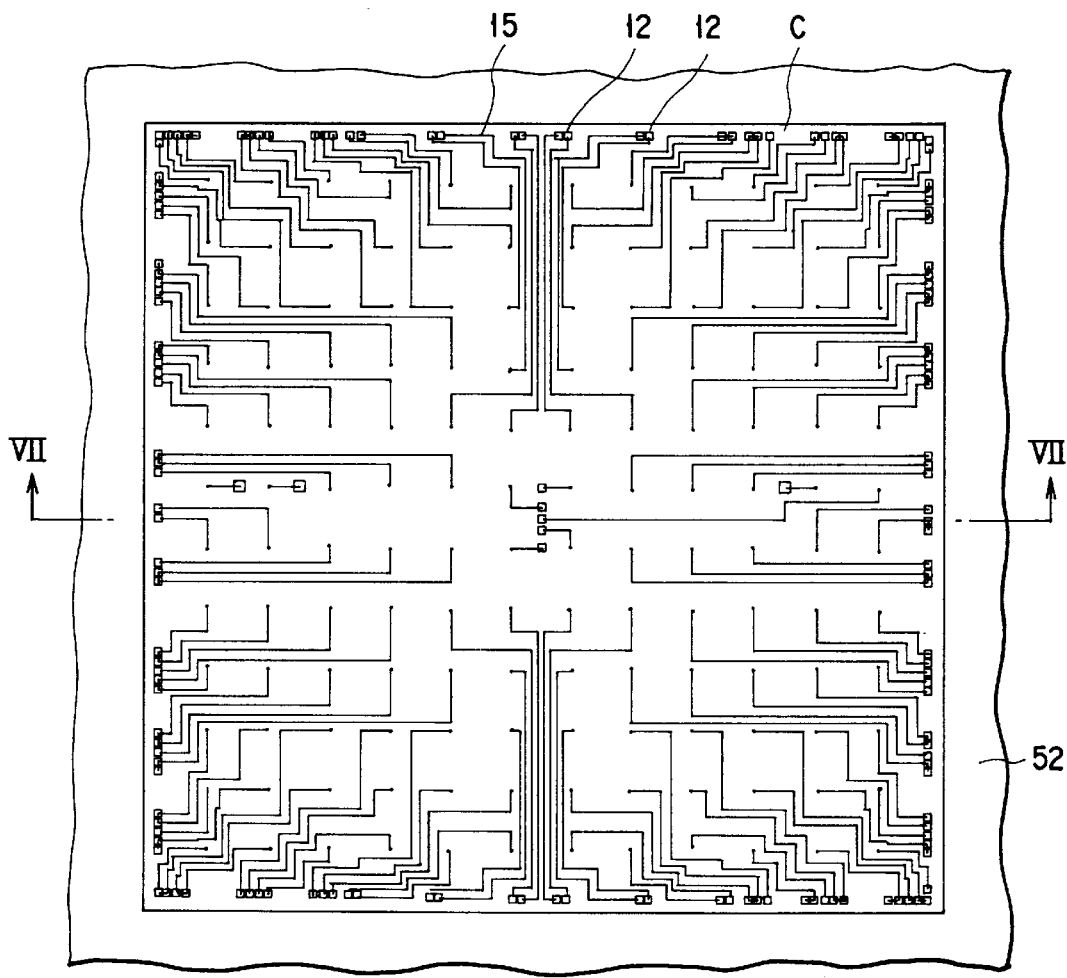
FIG. 6 is a plan view illustrating one step of manufacture of the package of FIG. 1.
Figure 7:
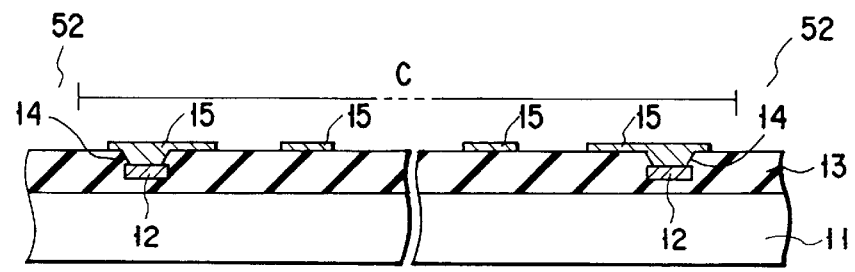
FIG. 7 is a sectional view taken along line VII—VII of FIG. 6.

Next, as shown in FIGS. 6 and 7, by using sputtering techniques by way of example, a conductive layer is formed over the entire surface of the passivating film 13. By means of PEP, the conductive layer is patterned to create a plurality of interconnection lines 15 on the passivating film 13. Each interconnection line is connected to one of the pads 12 in the passivating film 13 that are located immediately below the openings 14. The interconnection line consists of an electrical conductor made of aluminum, copper, or the like.

Figure 8:
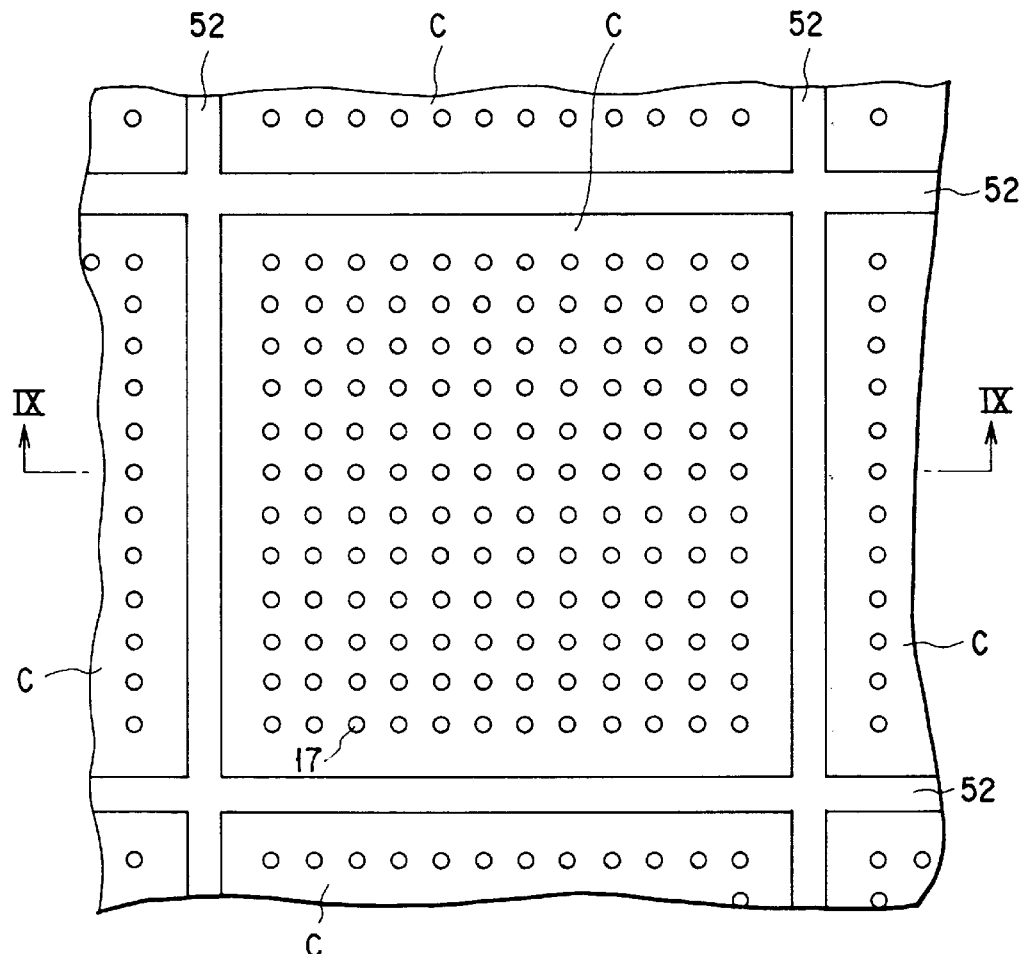
FIG. 8 is a plan view illustrating one step of manufacture of the package of FIG. 1.
Figure 9:
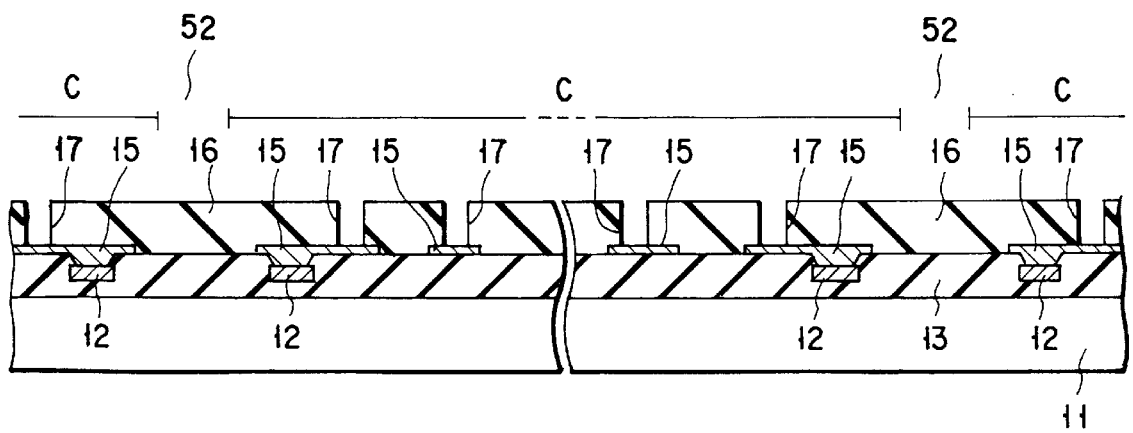
FIG. 9 is a sectional view taken along line IX—IX of FIG. 8.

Next, as shown in FIGS. 8 and 9, the passivating film 16 is formed over the passivating film 13 at a thickness in the range 0.05 to 0.2 mm by means of CVD by way of example. The passivating film 16, which is not used in conventional wafer processing, covers the pads 12 completely. That is, this passivating film effects the function of packages.

By means of the CMP method, the surface of the passivating film 16 is flattened so that electrodes can be formed easily. The passivating film 16 is then etched partly by means of the PEP method to form through holes 17 in the passivating film 16 over the interconnection lines 15.

As shown in FIG. 8, the through holes 17 are arranged in the form of a grid or array. The holes 17 are arranged in a symmetrical relation with respect to the center of the surface of the insulating protection film 16.

Figure 10:
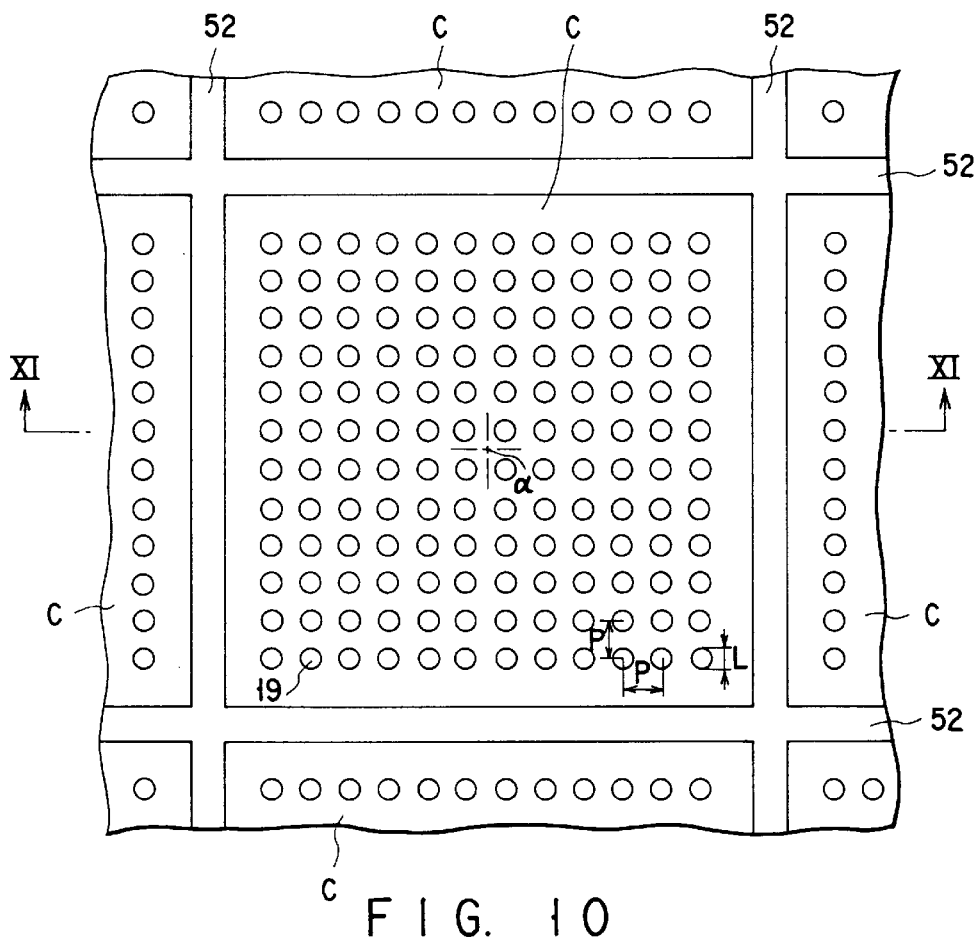
FIG. 10 is a plan view illustrating one step of manufacture of the package of FIG. 1.
Figure 11:
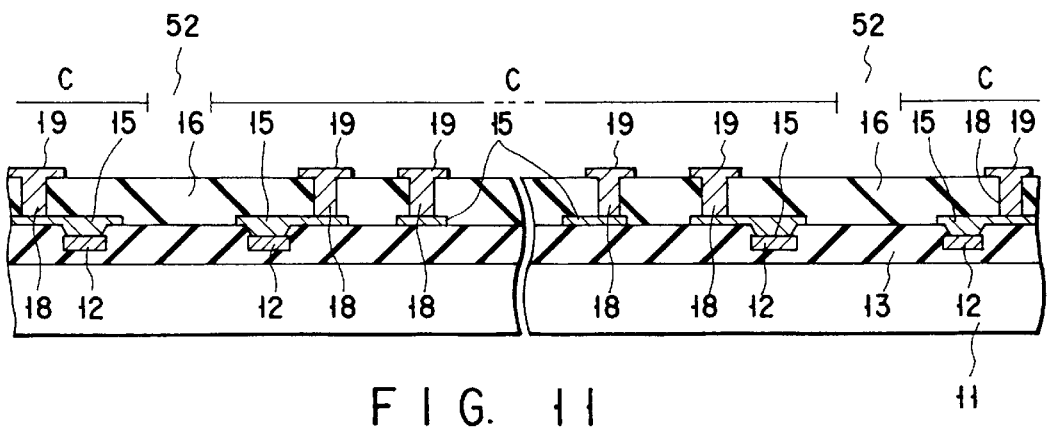
FIG. 11 is a sectional view taken along line XI—XI of FIG. 10.

Next, as shown in FIGS. 10 and 11, the conductive layer 18 is formed over the entire surface of the passivating film 16 by using the sputtering techniques. By means of the PEP methods the conductive film 18 is then patterned to create, on the passivating film, the contacts (electrodes) 19 for connection to external leads. The contacts 19 are connected to the interconnection lines 15 immediately below the through-holes 17 in the passivating film 16. The contact 19 is made of copper, gold, nickel, or a two-layered structure of nickel and gold.

The contacts 19, the number of which is 144, each have a circular shape with a diameter of about 0.5 mm and are formed at a pitch of about 1 mm in the form of a grid (in a 12×12 array).

Next, the wafer is cut along its dicing lines denoted at 52 in FIG. 10 using a dicing apparatus, whereby a plurality of semiconductor chips 10 are obtained. At this point, semiconductor packages are also completed simultaneously.

In order to round off the edges of the passivation film 16 as shown in FIG. 14, the semiconductor chip 10 may be subjected to heat treatment.

By the above steps such a semiconductor package integrated with a semiconductor chip as shown in FIGS. 1 and 2 is completed.

Next, a method of mounting the semiconductor package shown in FIGS. 1 and 2 will be described.

Figure 63:
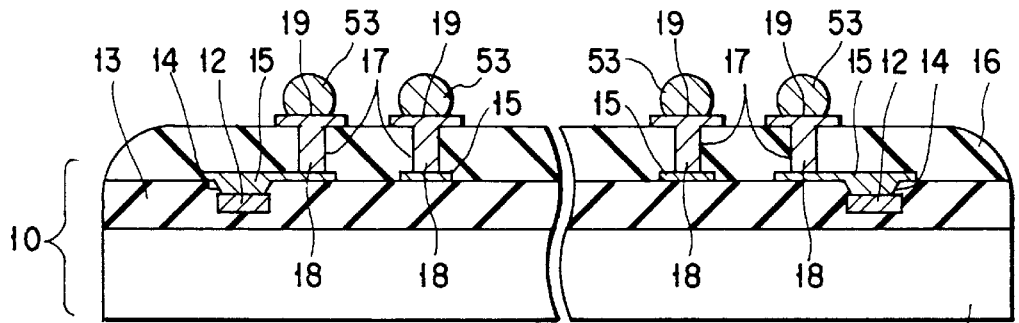
FIG. 63 is a plan view of a semiconductor package according to a fifth embodiment of the present invention.

First, as shown in FIG. 63, solder balls 53 are formed on the respective contacts 19 for connection to external leads of the semiconductor package (corresponding to a fifth embodiment of the present invention). These solder balls are provided for easier mounting of the semiconductor package onto a printed-circuit board. Thus, the solder balls are not necessarily needed.

Figure 67:
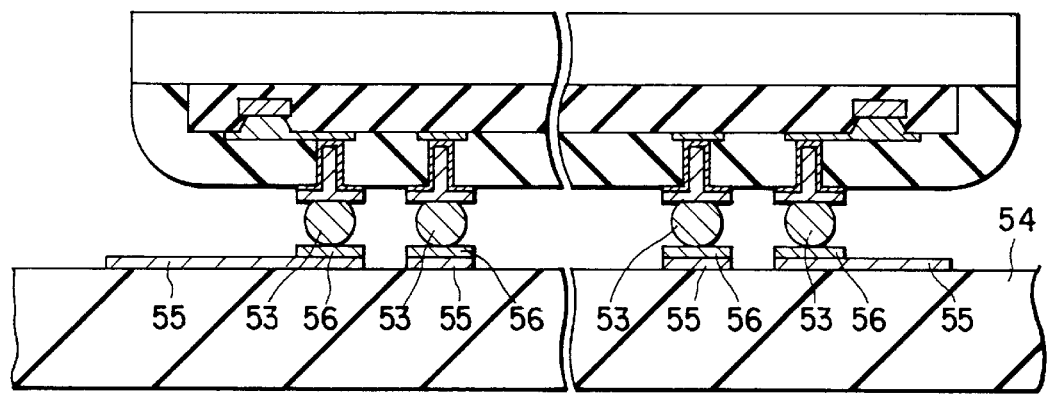
FIG. 67 is a sectional view illustrating one step of mounting the package of FIG. 66 on a printed-circuit board.

Next, as shown in FIG. 67, the semiconductor package is placed on a printed-circuit board 54 so that the solder balls 53 may be brought into contact with predetermined portions of leads 55 on the printed-circuit board 54. The predetermined portions of the leads 55 of the printed-circuit board 54 are printed with solder 56.

Figure 68:
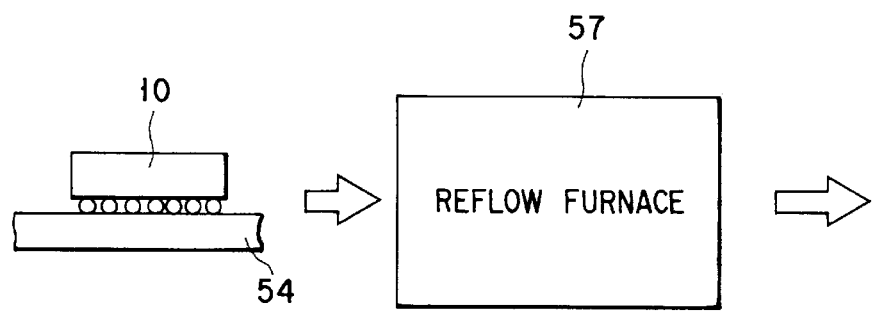
FIG. 68 is a sectional view illustrating one step of mounting the package of FIG. 66 on a printed-circuit board.

Next, as shown in FIG. 68, the semiconductor package (semiconductor chip) 10 and the printed-circuit board 54 are placed in a reflow furnace 57, then heated under predetermined conditions.

Figure 69:
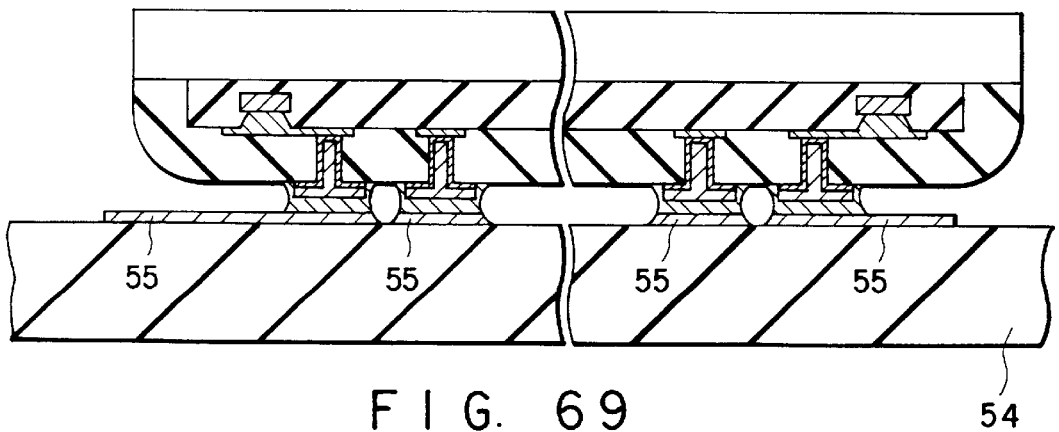
FIG. 69 is a sectional view illustrating one step of mounting the package of FIG. 66 on a printed-circuit board.

Consequently, the solder melts and solidifies, permitting each of the contacts 19 of the semiconductor package to be connected to a respective one of the leads 55 of the printed-circuit board as shown in FIG. 69. Thus, the mounting processing terminates.

Figure 15:
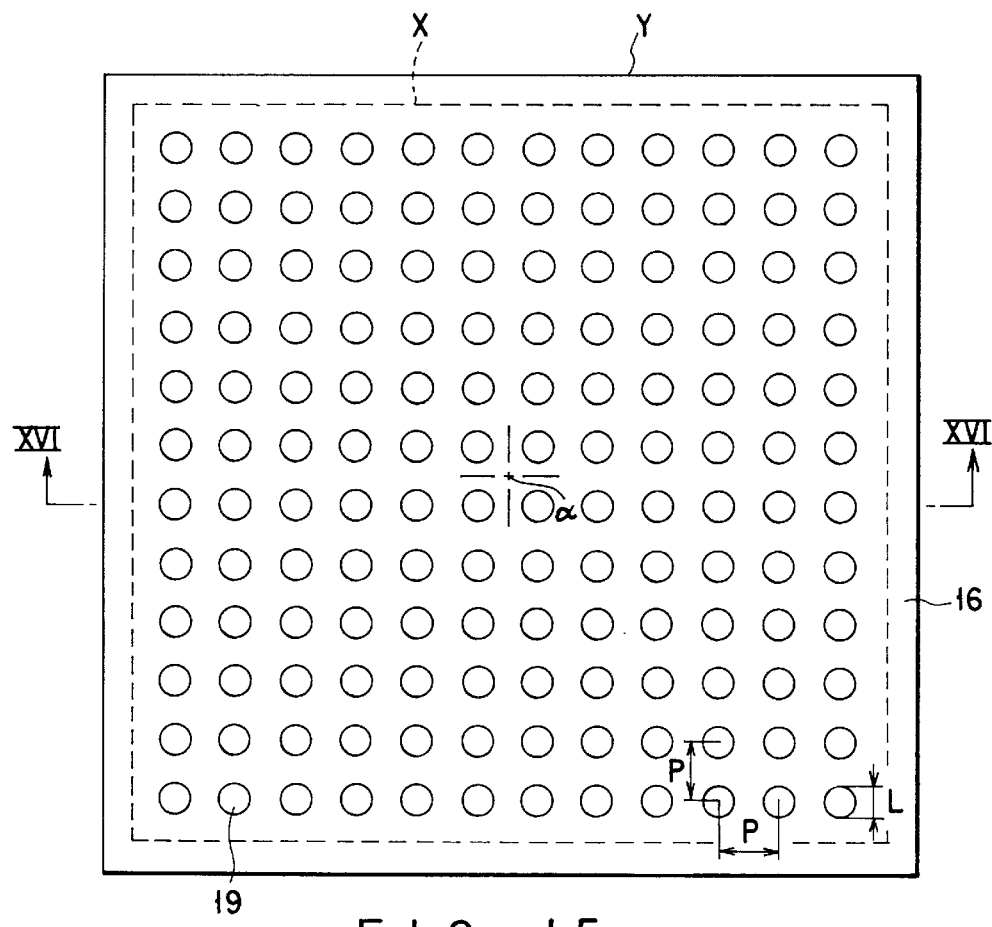
FIG. 15 is a plan view of a semiconductor package according to a second embodiment of the present invention.
Figure 16:
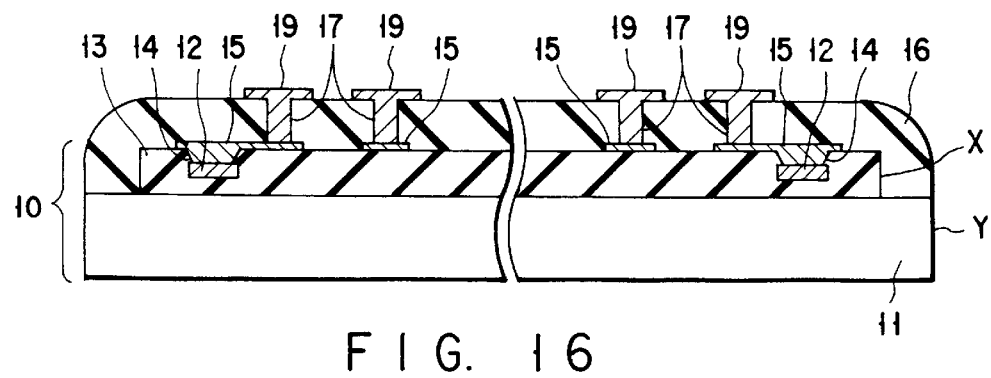
FIG. 16 is a sectional view taken along line XVI—XVI of FIG. 15.
Figure 25:
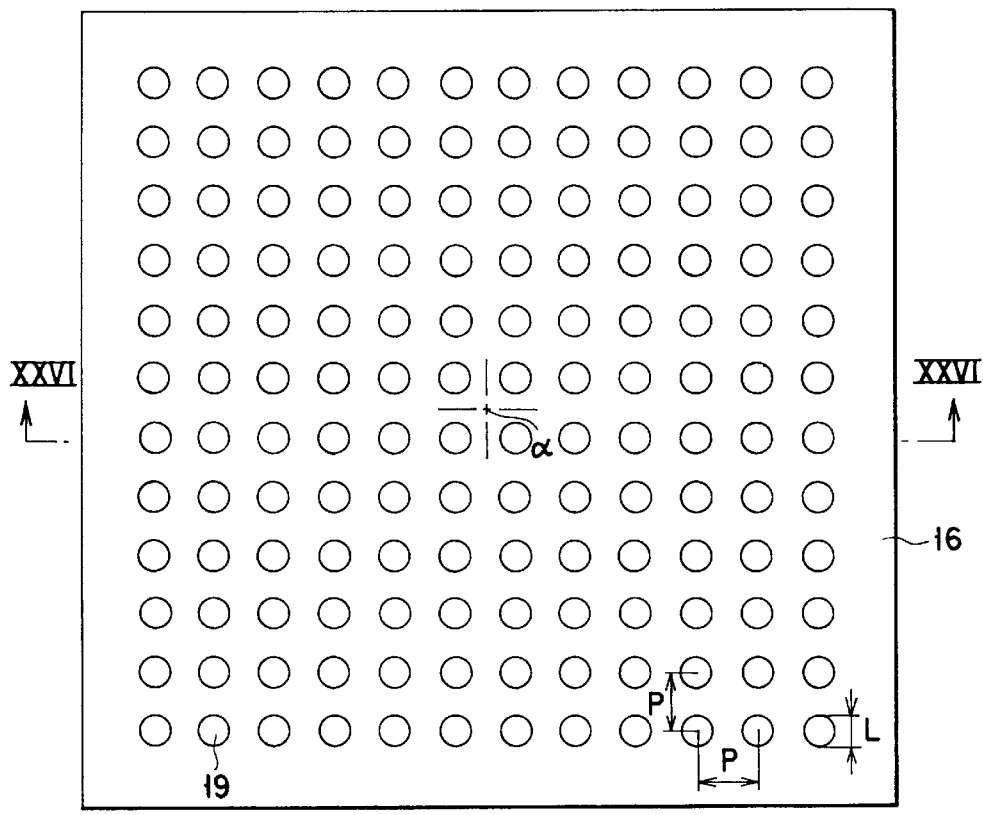
FIG. 25 is a plan view illustrating one step of manufacture of the package of FIG. 15.
Figure 26:
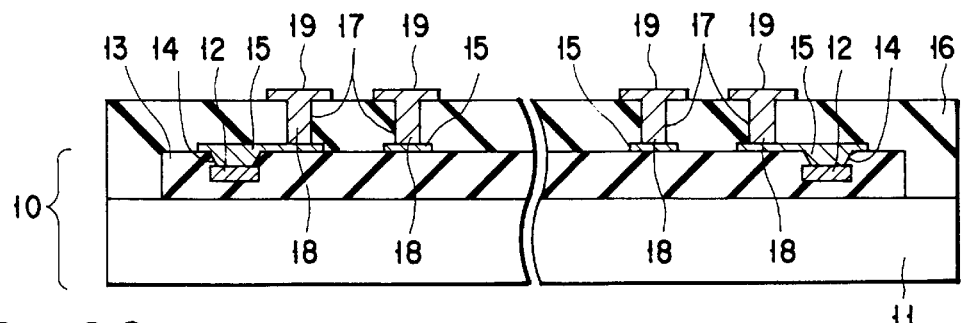
FIG. 26 is a sectional view taken along line XXVI—XXVI of FIG. 25.

Referring now to FIG. 15, there is shown a semiconductor package according to a second embodiment of the present invention. FIG. 16 is a sectional diagram taken along line XVI—XVI of FIG. 15.

First, the structure of this semiconductor package will be described.

A semiconductor chip 10 has a square shape and measures 13.5 mm on a side. Semiconductor components with specific functions are formed within a semiconductor substrate 11. A plurality of pads (input and output terminals) are formed on the semiconductor substrate 11. Each pad is connected to the semiconductor substrate 11, an impurity region within the substrate, or a semiconductor component.

When using the conventional wafer processing, these pads are formed mainly on peripheral portions of the semiconductor substrate 11. In the present invention, however, the pads 12 may be placed evenly over the entire surface of the semiconductor substrate 11 using a novel wafer process.

A passivating film 13 is formed on the semiconductor substrate 11. This passivating film is the same as that used in the conventional wafer processing and consists of an insulating material such as silicon oxide, silicon nitride, or the like.

The passivating film 13 has openings 14 over the pads 12. The surface of the passivating film is made flat.

The edges of the passivating film 13 do not reach the edges of the semiconductor substrate 11. That is, when viewed from above the substrate, the edges X of the passivating film 13 exist inside the edges Y of the semiconductor substrate.

A plurality of interconnection lines 15 is formed on the passivating film 13, which constitutes one of features of the present invention. Each line 15 is connected to a respective one of the pads 12 immediately under the openings 14. The interconnection line is made of a conductor such as aluminum, copper or the like.

A passivating film 16 is formed on the semiconductor substrate 11 and the passivating film 13, which constitutes one of the features of the present invention. The passivating film 16, which is not used in conventional wafer processing, covers the pads 12 completely. That is, the passivating film 16 functions as a package.

Thus, the passivating film 16 is set to have a thickness sufficient to function as a package, i.e., a thickness in the range 0.05 to 0.2 mm. The surface of the passivating film 16 is made flat so that electrodes can be easily formed thereon.

The passivating film 16 completely covers the edges of the passivating film 13. That is, the passivating film 13 is not exposed to outside. In comparison with the semiconductor package of FIGS. 1 and 2, therefore, the semiconductor package of the second embodiment is improved in moisture resistance because it is made difficult for moisture to penetrate into the interior of the semiconductor chip.

The passivating film 16 has through holes 17 above the metal lines 15. When seen from above the semiconductor substrate 11, the through holes 17 are arranged in a grid form or array form. The through holes 17 are arranged symmetrically with respect to the central point α of the surface of the passivation insulating film 16.

An electrically conductive layer 18 is formed within the through holes 17 in the passivating film 16 and on portions of the passivating film 16 adjacent to the through holes. The conductive layer 18 is made of copper, gold, nickel, or a two-layered structure of nickel and gold. The conductive layer 18 constitutes on the surface of the passivating film 16 contacts (electrodes) 19 for connection to external leads.

As shown in FIG. 15, for example, a total of 144 metal contacts is formed in a 12×12 array at a pitch P of about 1 mm with each contact having a circular shape of a diameter L of about 0.5 mm.

According to the semiconductor package thus formed, the back and sides of the semiconductor substrate 11 are used as part of the package and the passivating film 16 formed over the upper surface of the semiconductor substrate is used as part of the package.

According to the semiconductor package, therefore, the semiconductor package can be formed in the wafer processing, permitting the assembly process to be excluded as shown in FIG. 73. Thus, the semiconductor package of the present invention permits the cost of semiconductor products (finished products) to be lowered in comparison with the conventional semiconductor packages requiring the assembly process.

The semiconductor device test processing, such as functional test, burn-in, etc., shown in FIG. 73 can be performed readily by connecting a socket to the metal contacts 19, providing test signals to semiconductor components and taking the test results from the semiconductor components.

According to the semiconductor package, since the back and the sides of the semiconductor substrate 11 are used as part of the package, the semiconductor products are made equal to the size of the semiconductor substrate 11. That is, the size of the semiconductor products can be decreased because the semiconductor package is integral with the semiconductor chip.

Therefore, a number of semiconductor products can be mounted on a printed-circuit board at a high density, lowering the cost for the mounting process shown in FIG. 73.

The passivating film 16 covers completely the edges X of the passivating film 13 and contacts the edges Y of the semiconductor substrate 11. Thus, only the interface between the semiconductor substrate 11 and the passivating film 16 is exposed to outside, allowing the semiconductor package to be very resistant to humidity and external force.

A manufacturing method of the semiconductor package of FIGS. 15 and 16 will be described hereinafter.

First, as shown in FIG. 3, an LSI structure (including semiconductor components) is formed within each of semiconductor chip regions C of a wafer 51 by means of the standard wafer processing.

As shown in FIG. 17 which is an enlarged view of A of FIG. 3 and FIG. 18 which is a sectional view taken along line XVIII—XVIII of FIG. 17, a plurality of pads 12 is formed on each semiconductor chip region C. With the conventional wafer processing, these pads are formed mainly in peripheral portions of the semiconductor substrate 11. In the present invention, however, the pads may be formed evenly over the entire surface of the semiconductor substrate by means of a novel wafer process.

Each semiconductor chip region C, for example, has a square shape and measures about 13.5 mm on a side. A dicing line 52 is placed between semiconductor chip regions C.

The passivating film 13 is formed on the semiconductor substrate 11 by means of CVD by way of example to thereby cover semiconductor components. This passivating film 13 is the same as that used in the conventional wafer process and consists of an insulating material such silicon oxide, silicon nitride or the like.

After the surface of the passivating film 13 has been made flat by means of CMP by way of example, the passivating film is partly etched using PEP. As a result, openings 14 are formed in the passivating film 13 each of which reaches the respective individual pads 12.

Using the PEP method, the passivating film 13 is partly etched away to remove the passivating film 13 in areas including the area immediately under the dicing lines 52. As a result, the edges X of the passivating film 13 are placed inside the semiconductor chip region C (its edges Y finally become the edges of the semiconductor substrate 11).

Next, as shown in FIGS. 19 and 20, by using the sputtering method by way of example, a conductive layer is formed over the entire surface of the passivating film 13. By means of PEP, the conductive layer is patterned to create a plurality of interconnection lines 15 on the passivating film 13. Each interconnection line is connected to one of the pads 12 in the passivating film 13 that are located immediately below the openings 14. The interconnection line consists of an electrical conductor made of aluminum, copper, or the like.

Next, as shown in FIGS. 21 and 22, the passivating film 16 is formed over the passivating film 13 at a thickness in the range 0.05 to 0.2 mm by means of CVD by way of example. The passivating film 16, which is not used in the conventional wafer processing, covers the pads 12 completely. That is, this passivating film functions as a package.

By means of the CMP method, the surface of the passivating film 16 is flattened so that electrodes can be easily formed thereon. The passivating film 16 is then etched partly by means of the PEP method to form through holes 17 in the passivating film 16 over the interconnection lines 15.

When viewed from above the semiconductor substrate 11, the through holes 17 are arranged in the form of a grid or array. The holes 17 are arranged in a symmetrical relation with respect to the center α of the surface of the insulating protection film 16.

Next, as shown in FIGS. 23 and 24, the conductive layer 18 is formed over the entire surface of the passivating film 16 by using the sputtering method. By means of the PEP method the conductive film 18 is then patterned to create, on the passivating film, the contacts (electrodes) 19 for connection to external leads. The contacts 19 are connected to the interconnection lines 15 immediately below the through holes 17 in the passivating film 16. The contact 19 is made of copper, gold, nickel, or a two-layered structure of nickel and gold.

The contacts 19, the number of which is 144, each have a circular shape with a diameter of about 0.5 mm and are formed at a pitch of about 1 mm in the form of a grid (in a 12×12 array).

Next, the wafer is cut along its dicing lines denoted at 52 in FIG. 23 using a dicing apparatus, whereby a plurality of semiconductor chips 10 are obtained. At this point, semiconductor packages are also completed simultaneously.

Figure 27:
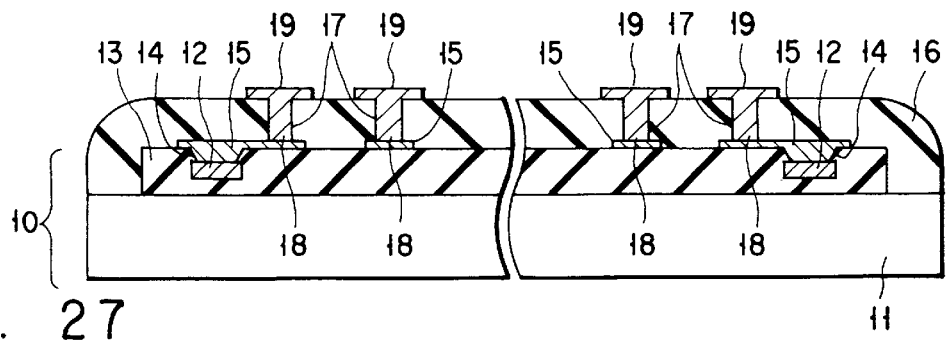
FIG. 27 is a plan view illustrating one step of manufacture of the package of FIG. 15.

In order to round off the edges of the passivation film 16 as shown in FIG. 27, the semiconductor chip 10 may be subjected to heat treatment.

By the above steps such a semiconductor package integrated with a semiconductor chip as shown in FIGS. 15 and 16 is completed.

Next, a method of mounting the semiconductor package shown in FIGS. 15 and 16 will be described.

Figure 64:
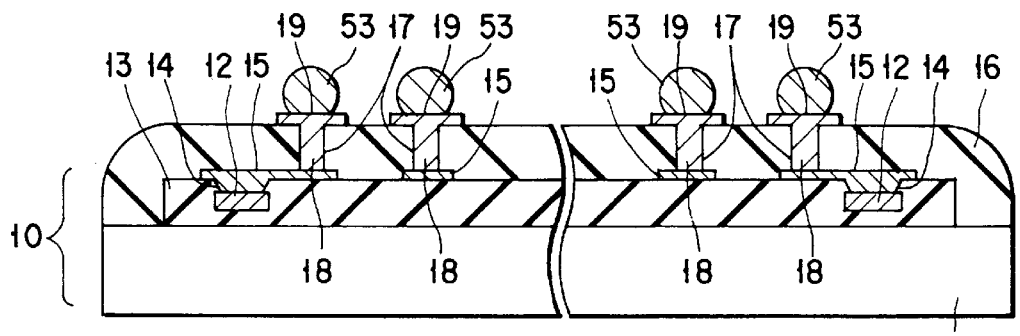
FIG. 64 is a plan view of a semiconductor package according to a sixth embodiment of the present invention.

First, as shown in FIG. 64, solder balls 53 are formed on the contacts 19 for connection to external leads of the semiconductor package (corresponding to a sixth embodiment of the present invention). These solder balls are provided for easier mounting of the semiconductor package onto a printed-circuit board. Thus, the solder balls are not necessarily needed.

Next, as shown in FIG. 67, the semiconductor package is placed on a printed-circuit board 54 so that the solder balls 53 may be brought into contact with predetermined portions of leads 55 on the printed-circuit board 54. The predetermined portions of the leads 55 of the printed-circuit board 54 are printed with solder 56.

Next, as shown in FIG. 68, the semiconductor package (semiconductor chip) 10 and the printed-circuit board 54 are placed in a reflow furnace 57, then heated under predetermined conditions.

Consequently, the solder melts and solidifies, permitting each of the contacts 19 of the semiconductor package to be connected to a respective one of the leads 55 of the printed-circuit board as shown in FIG. 69. Thus, the mounting process terminates.

Figure 28:
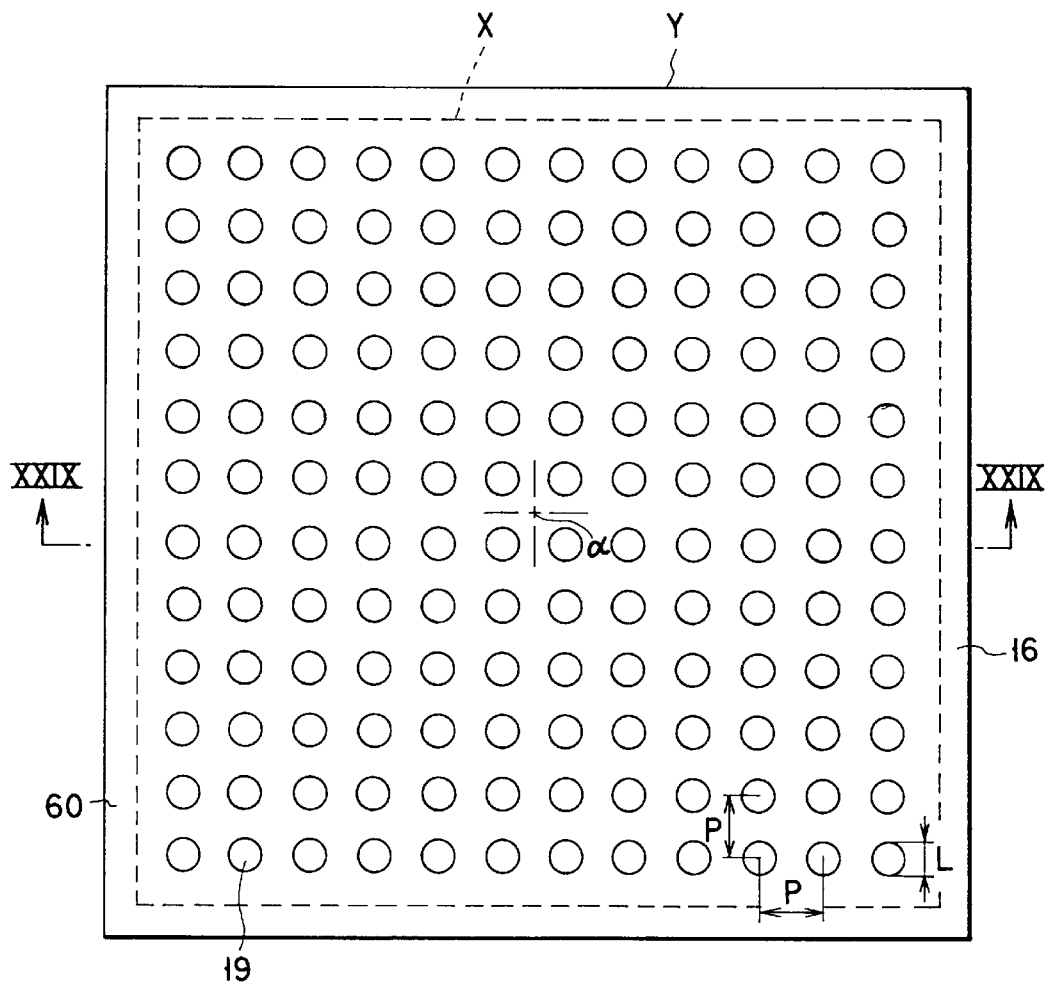
FIG. 28 is a plan view of a semiconductor package according to a third embodiment of the present invention.
Figure 29:
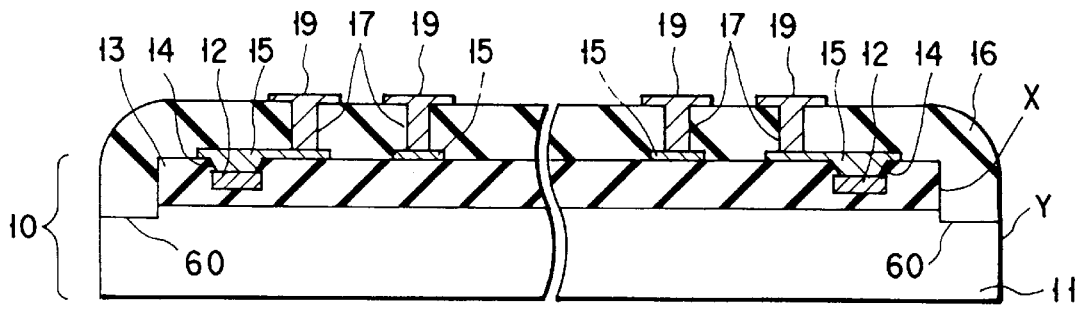
FIG. 29 is a sectional view taken along line XXIX—XXIX of FIG. 28.

Referring now to FIG. 28, there is shown a semiconductor package according to a third embodiment of the present invention. FIG. 29 is a sectional diagram taken along line XXIX—XXIX of FIG. 28.

First, the structure of this semiconductor package will be described.

A semiconductor chip 10 has a square shape and measures 13.5 mm on a side. Semiconductor components with specific functions are formed within a semiconductor substrate 11. A plurality of pads (input and output terminals) are formed on the semiconductor substrate 11. Each pad is connected to the semiconductor substrate 11, an impurity region within the substrate, or a semiconductor component.

When using the conventional wafer processing, these pads are formed mainly on peripheral portions of the semiconductor substrate 11. In the present invention, however, the pads 12 may be placed evenly over the entire surface of the semiconductor substrate 11 using a novel wafer process.

A passivating film 13 is formed on the semiconductor substrate 11. This passivating film is the same as that used in conventional wafer processing and consists of an insulating material such as silicon oxide, silicon nitride, or the like.

The passivating film 13 has openings 14 over the pads 12. The surface of the passivating film is made flat.

The edges of the passivating film 13 do not reach the edges of the semiconductor substrate 11. That is, when viewed from above the substrate, the edges X of the passivating film 13 exist inside the edges Y of the semiconductor substrate. Between the edges X of the passivating film 13 and the edges Y of the semiconductor substrate 11 is formed a groove 60 along the edges of the semiconductor substrate.

A plurality of interconnection lines 15 is formed on the passivating film 13, which constitutes one of features of the present invention. Each line 15 is connected to a respective one of the pads 12 immediately under the openings 14. The interconnection line is made of a conductor such as aluminum, copper or the like.

A passivating film 16 is formed on the semiconductor substrate 11 and the passivating film 13, which constitutes one of the features of the present invention. The passivating film 16, which is not used in the conventional wafer processing, covers the pads 12 completely. That is, the passivating film 16 functions as a package.

Thus, the passivating film 16 is set to have a thickness sufficient to function as a package, i.e., a thickness in the range 0.05 to 0.2 mm. The surface of the passivating film 16 is made flat so that electrodes can be easily formed thereon.

The passivating film 16 completely covers the edges X of the passivating film 13. That is, the passivating film 13 is not exposed to outside. In comparison with the semiconductor package of FIGS. 1 and 2, therefore, the semiconductor package of the third embodiment is improved in moisture resistance because it is made difficult for moisture to penetrate into the interior of the semiconductor chip.

The passivating film 16 has through holes 17 above the metal lines 15. When seen from above the semiconductor substrate 11, the through holes 17 are arranged in a grid form or array form. The through holes 17 are arranged symmetrically with respect to the central point α of the surface of the passivation insulating film 16.

An electrically conductive layer 18 is formed within the through holes 17 in the passivating film 16 and on portions of the passivating film 16 adjacent to the through holes. The conductive layer 18 is made of copper, gold, nickel, or a two-layered structure of nickel and gold. The conductive layer 18 constitutes on the surface of the passivating film 16 metal contacts (electrodes) 19 for connection to external leads.

As shown in FIG. 28, for example, a total of 144 metal contacts is formed in a 12×12 array at a pitch P of about 1 mm with each metal contact having a circular shape of a diameter L of about 0.5 mm.

According to the semiconductor package thus formed, the back and sides of the semiconductor substrate 11 are used as part of the package and the passivating film 16 formed over the front of the semiconductor substrate is used as part of the package.

According to the semiconductor package, therefore, the semiconductor package can be formed in the wafer process, permitting the assembly process to be excluded as shown in FIG. 73. Thus, the semiconductor package of the present invention permits the cost of semiconductor products (finished products) to be lowered in comparison with the conventional semiconductor package requiring the assembly process.

The semiconductor device test process, such as functional test, burn-in, etc., shown in FIG. 73 can be performed readily by connecting a socket to the metal contacts 19, providing test signals to semiconductor components and taking the test results from the semiconductor components.

According to the semiconductor package, since the back and the sides of the semiconductor substrate 11 are used as part of the package, the semiconductor products are made equal to the size of the semiconductor substrate 11. That is, the size of the semiconductor products can be decreased because the semiconductor package is integral with the semiconductor chip.

Therefore, a number of semiconductor products can be mounted on a printed-circuit board at a high density, lowering the cost for the mounting process shown in FIG. 73.

The passivating film 16 covers completely the edges X of the passivating film 13 and contacts the edges Y of the semiconductor substrate 11. Thus, only the interface between the semiconductor substrate 11 and the passivating film 16 is exposed to outside, allowing the semiconductor package to be very resistant to humidity and external force.

A manufacturing method of the semiconductor package of FIGS. 28 and 29 will be described hereinafter.

First, as shown in FIG. 3, an LSI structure (including semiconductor components) is formed within each of semiconductor chip regions C of a wafer 51 by means of the standard wafer process.

Figure 30:
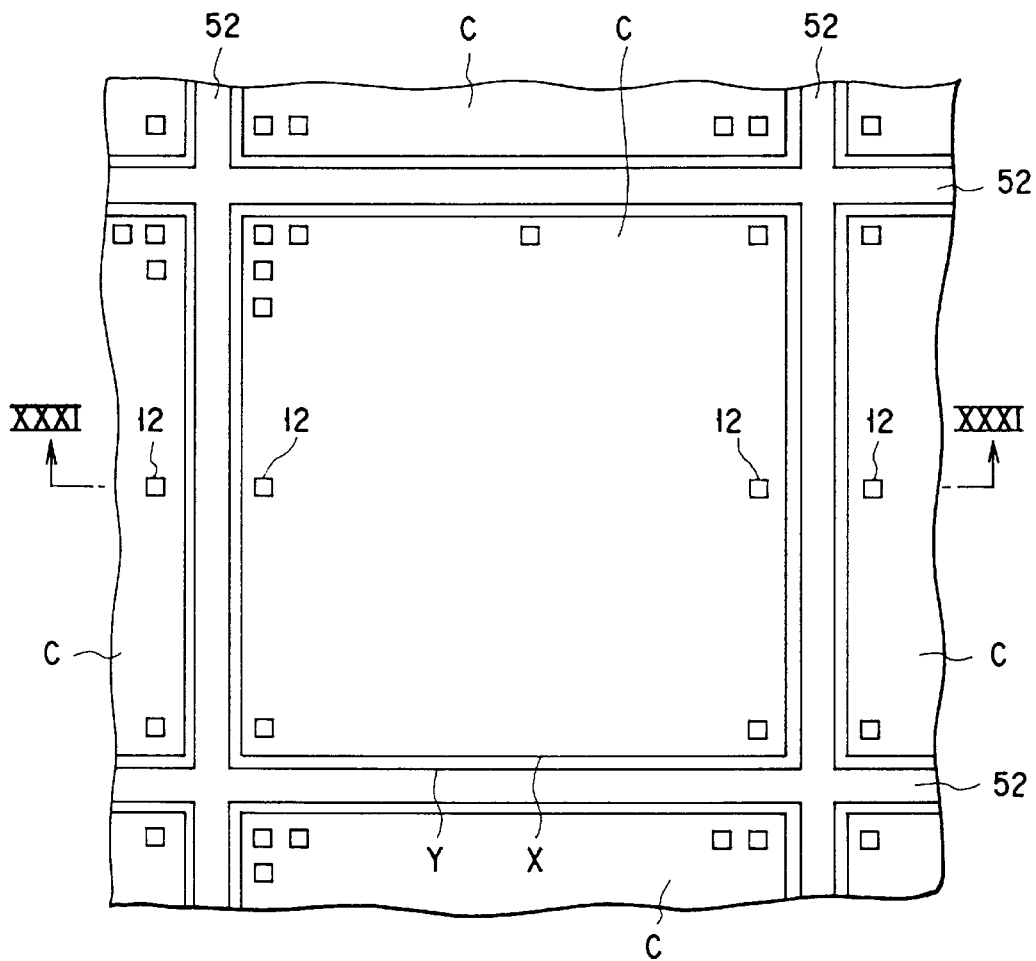
FIG. 30 is a plan view illustrating one step of manufacture of the package of FIG. 28.
Figure 31:
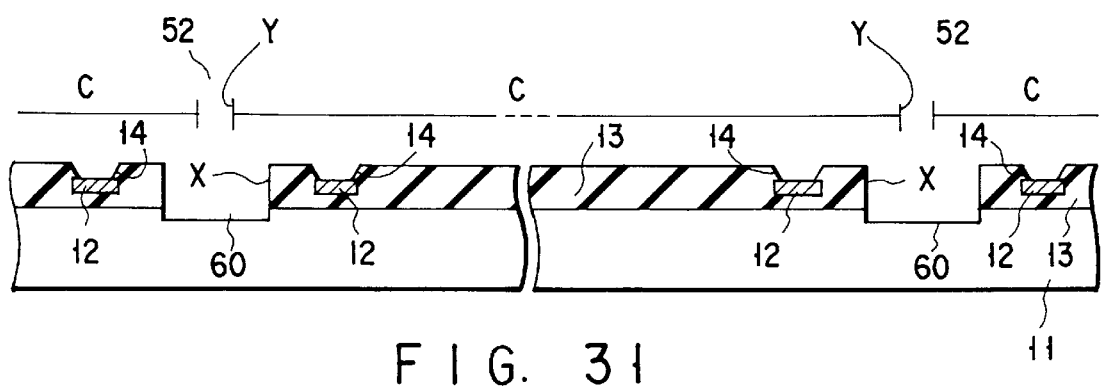
FIG. 31 is a sectional view taken along line XXXI—XXXI of FIG. 30.

As shown in FIG. 30 which is an enlarged view of A of FIG. 3 and FIG. 31 which is a sectional view taken along line XXXI—XXXI of FIG. 30, a plurality of pads 12 is formed on each semiconductor chip region C. With the conventional wafer process, these pads are formed mainly in peripheral portions of the semiconductor substrate 11. In the present invention, however, the pads may be formed evenly over the entire surface of the semiconductor substrate by means of a novel wafer process.

Each semiconductor chip region C, for example, has a square shape and measures about 13.5 mm on a side. A dicing line 52 is placed between semiconductor chip regions C.

The passivating film 13 is formed on the semiconductor substrate 11 by means of CVD by way of example to thereby cover semiconductor components. This passivating film 13 is the same as that used in the conventional wafer process and consists of an insulating material such silicon oxide, silicon nitride or the like.

After the surface of the passivating film 13 has been made flat by means of CMP by way of example, the passivating film is partly etched using PEP. As a result, openings 14 are formed in the passivating film 13 each of which reaches the respective individual pads 12.

Using the PEP method, the passivating film 13 is partly etched away to remove the passivating film 13 and the semiconductor substrate in areas including the area immediately under the dicing lines 52. As a result, the edges X of the passivating film 13 are placed inside the semiconductor chip region C (its edges Y finally become the edges of the semiconductor substrate 11). In the semiconductor substrate the groove 60 is formed which extends along the dicing lines 52 and has a width greater than the width of the dicing lines. The groove is formed by overetching the semiconductor substrate 11 for the purpose of completely removing the passivating film 13 immediately under the dicing lines 52.

Figure 32:
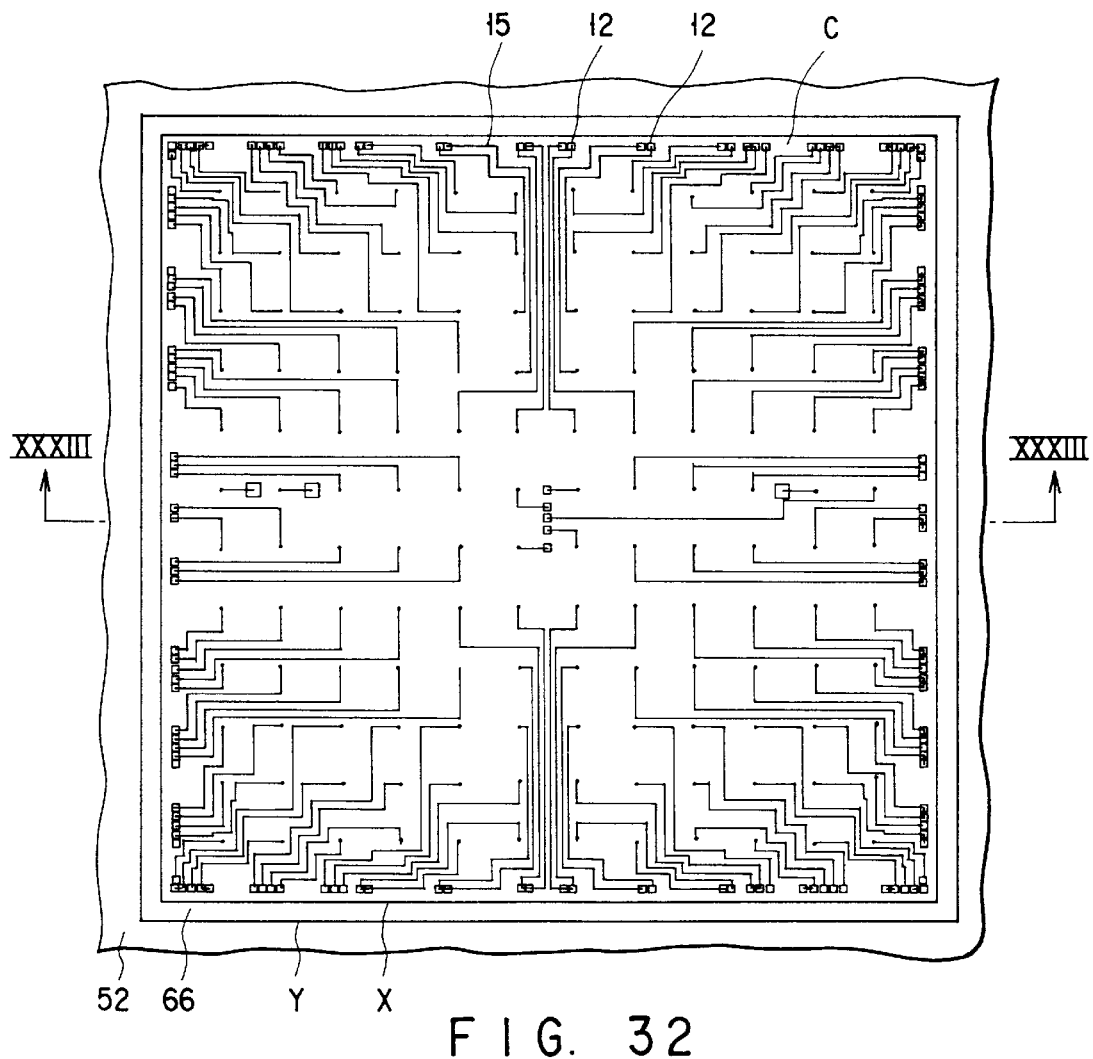
FIG. 32 is a plan view illustrating one step of manufacture of the package of FIG. 28.
Figure 33:
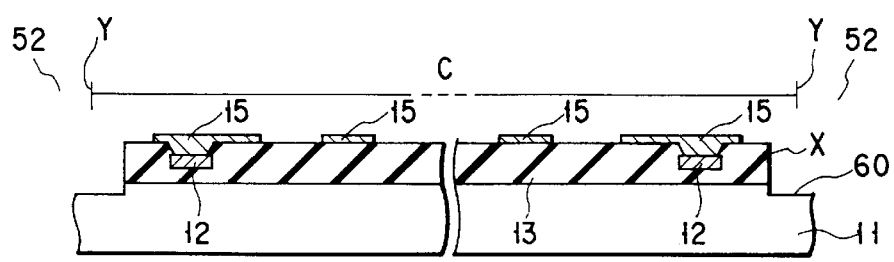
FIG. 33 is a sectional view taken along line XXXIII—XXXIII of FIG. 32.

Next, as shown in FIGS. 32 and 33, by using the sputtering method by way of example, a conductive layer is formed over the entire surface of the passivating film 13. By means of PEP, the conductive layer is patterned to create a plurality of interconnection lines 15 on the passivating film 13. Each interconnection line is connected to one of the pads 12 in the passivating film 13 that are located immediately below the openings 14. The interconnection line consists of an electrical conductor made of aluminum, copper, or the like.

Next, as shown in FIGS. 34 and 35, the passivating film 16 is foamed over the passivating film 13 at a thickness in the range 0.05 to 0.2 mm by means of CVD by way of example. The passivating film 16, which is not used in the conventional wafer process, covers the pads 12 completely. That is, this passivating film functions as a package.

By means of the CMP method, the surface of the passivating film 16 is flattened so that electrodes can be easily formed thereon. The passivating film 16 is then etched partly by means of the PEP method to form through holes 17 in the passivating film 16 over the interconnection lines 15.

When viewed from above the semiconductor substrate 11, the through holes 17 are arranged in the form of a grid or array. The holes 17 are arranged in a symmetrical relation with respect to the center α of the surface of the insulating protection film 16.

Next, as shown in FIGS. 36 and 37, the conductive layer 18 is formed over the entire surface of the passivating film 16 by using the sputtering method. By means of the PEP method the conductive film 18 is then patterned to create, on the passivating film, the contacts (electrodes) 19 for connection to external leads. The contacts 19 are connected to the interconnection lines 15 immediately below the through holes 17 in the passivating film 16. The contact 19 is made of copper, gold, nickel, or a two-layered structure of nickel and gold.

The contacts 19, the number of which is 144, each have a circular shape with a diameter of about 0.5 mm and are formed at a pitch of about 1 mm in the form of a grid (in a 12×12 array).

Next, the wafer is cut along its dicing lines denoted at 52 in FIG. 36 using a dicing apparatus, whereby a plurality of semiconductor chips 10 are obtained. At this point, semiconductor packages are also completed simultaneously.

In order to round off the edges of the passivation film 16 as shown in FIG. 40, the semiconductor chip 10 may be subjected to heat treatment.

By the above steps such a semiconductor package integrated with a semiconductor chip as shown in FIGS. 28 and 29 is completed.

Next, a method of mounting the semiconductor package shown in FIGS. 28 and 29 will be described.

Figure 65:
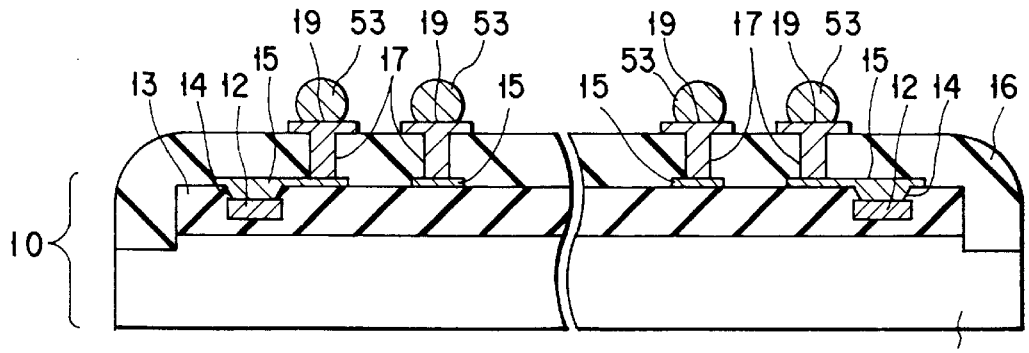
FIG. 65 is a plan view of a semiconductor package according to a seventh embodiment of the present invention.

First, as shown in FIG. 65, solder balls 53 are formed on the contacts 19 for connection to external leads of the semiconductor package (corresponding to a seventh embodiment of the present invention). These solder balls are provided for easier mounting of the semiconductor package onto a printed-circuit board. Thus, the solder balls are not necessarily needed.

Next, as shown in FIG. 67, the semiconductor package is placed on a printed-circuit board 54 so that the solder balls 53 may be brought into contact with predetermined portions of leads 55 on the printed-circuit board 54. The predetermined portions of the leads 55 of the printed-circuit board 54 are printed with solder 56.

Next, as shown in FIG. 68, the semiconductor package (semiconductor chip) 10 and the printed-circuit board 54 are placed in a reflow furnace 57, then heated under predetermined conditions.

Consequently, the solder melts and solidifies, permitting each of the contacts 19 of the semiconductor package to be connected to a respective one of the leads 55 of the printed-circuit board as shown in FIG. 69. Thus, the mounting process terminates.

Figure 41:
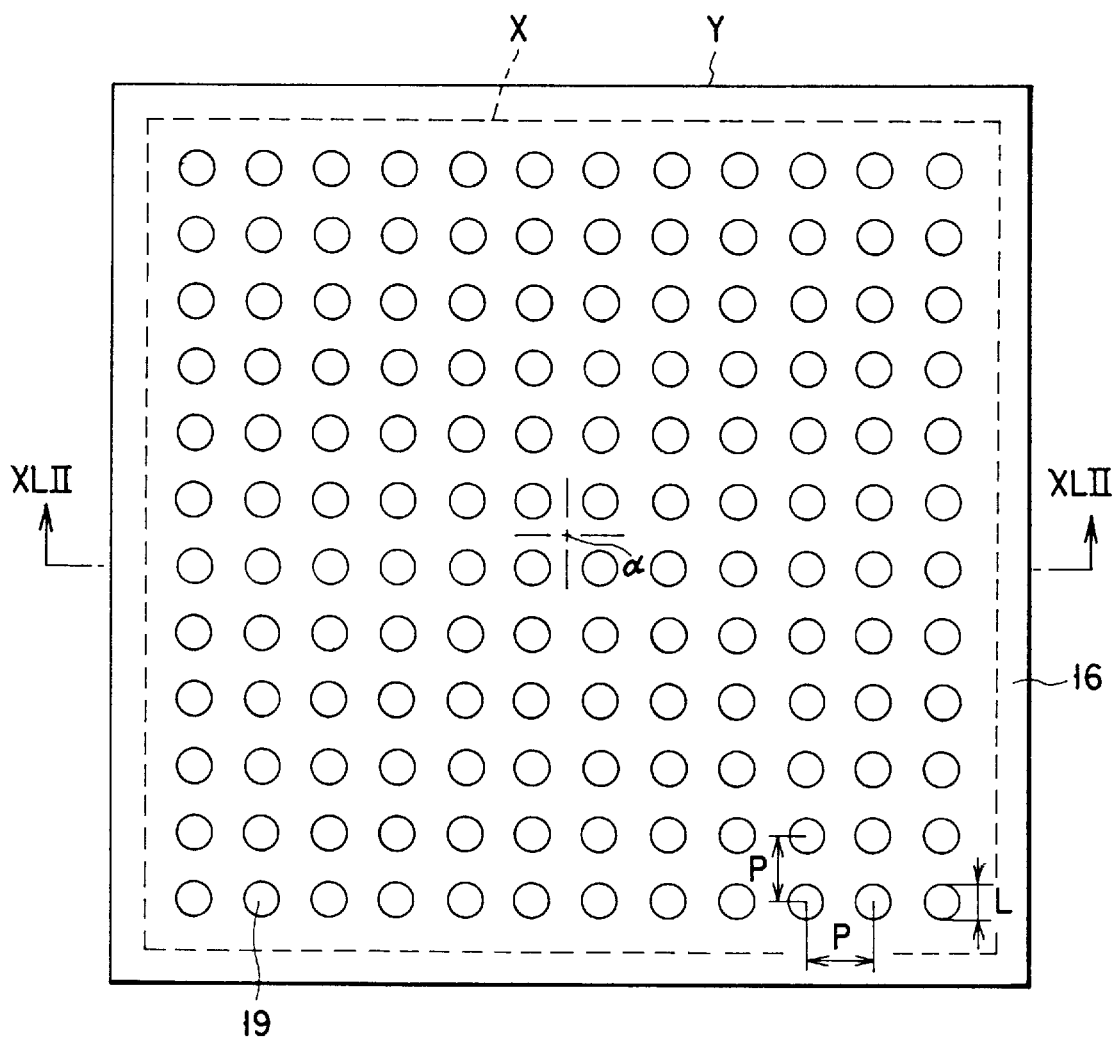
FIG. 41 is a plan view of a semiconductor package according to a fourth embodiment of the present invention.
Figure 42:
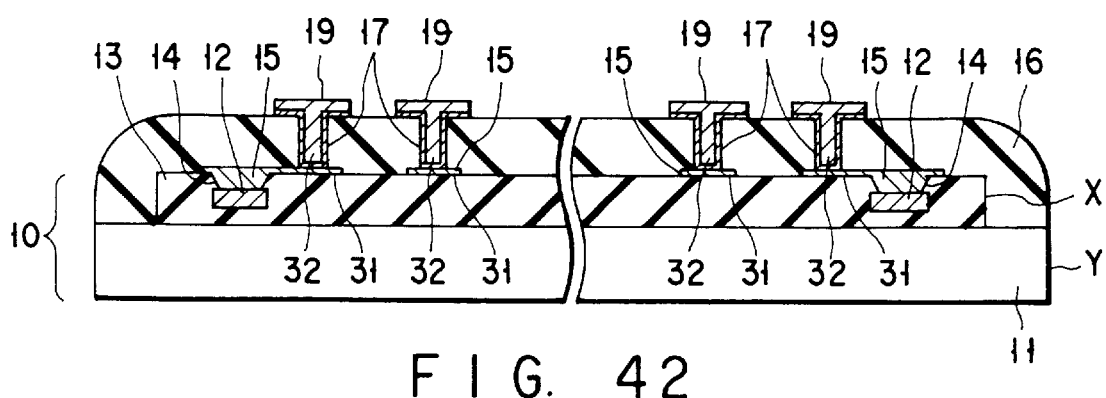
FIG. 42 is a sectional view taken along line XLII—XLII of FIG. 41.

Referring now to FIG. 41, there is shown a semiconductor package according to a fourth embodiment of the present invention. FIG. 42 is a sectional diagram taken along line XLII—XLII of FIG. 41.

First, the structure of this semiconductor package will be described.

A semiconductor chip 10 has a square shape and measures 13.5 mm on a side. Semiconductor components with specific functions are formed within a semiconductor substrate 11. A plurality of pads (input and output terminals) is formed on the semiconductor substrate 11. Each pad is connected to the semiconductor substrate 11, an impurity region within the substrate, or a semiconductor component.

When using the conventional wafer process, these pads are formed mainly on peripheral portions of the semiconductor substrate 11. In the present invention, however, the pads 12 may be placed evenly over the entire surface of the semiconductor substrate 11 using a novel wafer process.

A passivating film 13 is formed on the semiconductor substrate 11. This passivating film is the same as that used in the conventional wafer process and consists of an insulating material such as silicon oxide, silicon nitride, or the like.

The passivating film 13 has openings 14 over the pads 12. The surface of the passivating film is made flat.

The edges of the passivating film 13 do not reach the edges of the semiconductor substrate 11. That is, when viewed from above the substrate, the edges X of the passivating film 13 exist inside the edges Y of the semiconductor substrate. Between the edges X of the passivating film 13 and the edges Y of the semiconductor substrate 11 is formed a groove 60 along the edges of the semiconductor substrate 11.

A plurality of interconnection lines 15 is formed on the passivating film 13, which constitutes one of features of the present invention. Each line 15 is connected to a respective one of the pads 12 immediately under the openings 14. The interconnection line is made of a conductor such as aluminum, copper or the like.

A passivating film 16 is formed on the semiconductor substrate 11 and the passivating film 13, which constitutes one of the features of the present invention. The passivating film 16, which is not used in the conventional wafer processing, covers the pads 12 completely. That is, the passivating film 16 functions as a package.

Thus, the passivating film 16 is set to have a thickness sufficient to function as a package, i.e., a thickness in the range 0.05 to 0.2 mm. The surface of the passivating film 16 is made flat so that electrodes can be easily formed thereon.

The passivating film 16 completely covers the edges X of the passivating film 13. That is, the passivating film 13 is not exposed to outside. In comparison with the semiconductor package of FIGS. 1 and 2, therefore, the semiconductor package of the fourth embodiment is improved in moisture resistance because it is made difficult for moisture to penetrate into the interior of the semiconductor chip.

The passivating film 16 has through holes 17 above the metal lines 15. When seen from above the semiconductor substrate 11, the through holes 17 are arranged in a grid form or array form. The through holes 17 are arranged symmetrically with respect to the central point α of the surface of the passivation insulating film 16.

A thin layer 31 of metal is formed within the through holes 17 and on those portions of the passivating film 16 which are adjacent to the through holes. The thickness of the metal layer 31 is set sufficiently small in comparison with the size (diameter) of the through holes 17. The metal layer 31 is made of, for example, titan (about 0.05 $\mu$m in thickness), nickel (about 0.3 $\mu$m in thickness), palladium (about 0.1 $\mu$m in thickness), or a stacked layer of these materials.

A plated layer 32 is formed on the metal layer 31 within the through holes and on the metal layer 31 adjacent to the through holes. The plated layer is made of copper, gold, nickel or a two-layered structure of nickel and gold. The plated layer constitutes contacts (electrodes) 18 for connection to external leads on the surface of the passivating film 16.

The metal layer 31 functions as a plating electrode in forming the plated layer 32 by means of electroplating. The metal layer also functions as barrier metal for preventing diffusion of metallic atoms and alloy reaction.

As shown in FIG. 41, for example, a total of 144 metal contacts is formed in a 12×12 array at a pitch P of about 1 mm with each metal contact having a circular shape of a diameter L of about 0.5 mm. The height of the metal contacts 19 is set to range from some micrometers to 10 micrometers.

According to the semiconductor package thus formed, the back and sides of the semiconductor substrate 11 are used as part of the package and the passivating film 16 formed over the upper surface of the semiconductor substrate is used as part of the package.

According to the semiconductor package, therefore, the semiconductor package can be formed in the wafer process, permitting the assembly process to be excluded as shown in FIG. 73. Thus, the semiconductor package of the present invention permits the cost of semiconductor products (finished products) to be lowered in comparison with the conventional semiconductor package requiring the assembly process.

The semiconductor device test process, such as functional test, burn-in, etc., shown in FIG. 73 can be performed readily by connecting a socket to the metal contacts 19, providing test signals to semiconductor components and taking the test results from the semiconductor components.

According to the semiconductor package, since the back and the sides of the semiconductor substrate 11 are used as part of the package, the semiconductor products is made equal to the size of the semiconductor substrate 11. That is, the size of the semiconductor products can be decreased because the semiconductor package is integral with the semiconductor chip.

Therefore, a number of semiconductor products can be mounted on a printed-circuit board at a high density, lowering the cost for the mounting process shown in FIG. 73.

The passivating film 16 covers completely the edges X of the passivating film 13 and contacts the edges Y of the semiconductor substrate 11. Thus, only the interface between the semiconductor substrate 11 and the passivating film 16 is exposed to outside, allowing the semiconductor package to be very resistant to humidity and external force.

Furthermore, since the metal layer 31 serving as the plating electrode is placed immediately under the plated layer 32, the metal contacts 19 can be formed at low cost and easily by means of electroplating.

A manufacturing method of the semiconductor package of FIGS. 41 and 42 will be described hereinafter.

First, as shown in FIG. 3, an LSI structure (including semiconductor components) is formed within each of semiconductor chip regions C of a wafer 51 by means of the standard wafer processing.

As shown in FIG. 43 which is an enlarged view of A of FIG. 3 and FIG. 44 which is a sectional view taken along line XLIV—XLIV of FIG. 43, a plurality of pads 12 is formed on each semiconductor chip region C. With the conventional wafer processing, these pads are formed mainly in peripheral portions of the semiconductor substrate 11. In the present invention, however, the pads may be formed evenly over the entire surface of the semiconductor substrate by means of a novel wafer process.

Each semiconductor chip region C, for example, has a square shape and measures about 13.5 mm on a side. A dicing line 52 is placed between semiconductor chip regions C.

The passivating film 13 is formed on the semiconductor substrate 11 by means of CVD by way of example to thereby cover semiconductor components. This passivating film 13 is the same as that used in the conventional wafer process and consists of an insulating material such silicon oxide, silicon nitride or the like.

After the surface of the passivating film 13 has been made flat by means of CMP by way of example, the passivating film is partly etched using PEP. As a result, openings 14 are formed in the passivating film 13 each of which reaches the respective individual pads 12.

Using the PEP method, the passivating film 13 is partly etched away to remove the passivating film 13 in areas including the area immediately under the dicing lines 52. As a result, the edges X of the passivating film 13 are placed inside the semiconductor chip region C (its edges Y finally become the edges of the semiconductor substrate 11).

Next, as shown in FIGS. 45 and 46, by using the sputtering method by way of example, a conductive layer is formed over the entire surface of the passivating film 13. By means of PEP, the conductive layer is patterned to create a plurality of interconnection lines 15 on the passivating film 13. Each interconnection line is connected to one of the pads 12 in the passivating film 13 that are located immediately below the openings 14. The interconnection line consists of an electrical conductor made of aluminum, copper, or the like.

Next, as shown in FIGS. 47 and 48, the passivating film 16 is formed over the passivating film 13 at a thickness in the range 0.05 to 0.2 mm by means of CVD by way of example. The passivating film 16, which is not used in the conventional wafer process, covers the pads 12 completely. That is, this passivating film functions as a package.

By means of the CMP method, the surface of the passivating film 16 is flattened so that electrodes can be easily formed thereon. The passivating film 16 is then etched partly by means of the PEP method to form through holes 17 in the passivating film 16 over the interconnection lines 15.

When viewed from above the semiconductor substrate 11, the through holes 17 are arranged in the form of a grid or array. The holes 17 are arranged in a symmetrical relation with respect to the center α of the surface of the insulating protection film 16.

Next, as shown in FIGS. 49 and 50, the metal layer 31 is formed at the bottom and on the sides of the through holes 17 and over the entire surface of the passivating film 16 (the entire surface of the wafer) by using the sputtering method. The metal layer is formed by depositing, for example, a layer of titan of about 0.05 micrometer thickness, a layer of nickel of about 0.3 micrometer thickness and a layer of palladium of about 0.1 micrometer thickness in sequence.

Figure 51:
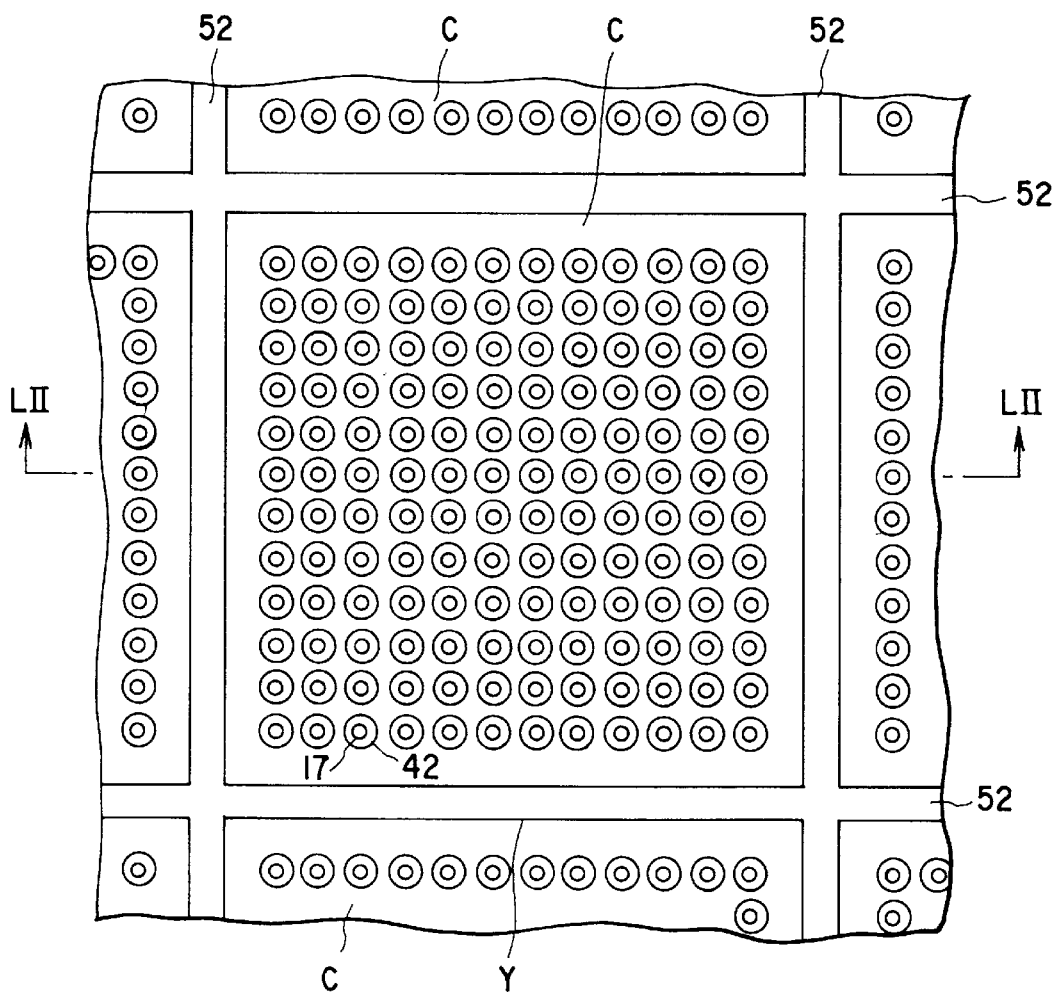
FIG. 51 is a plan view illustrating one step of manufacture of the package of FIG. 41.
Figure 52:
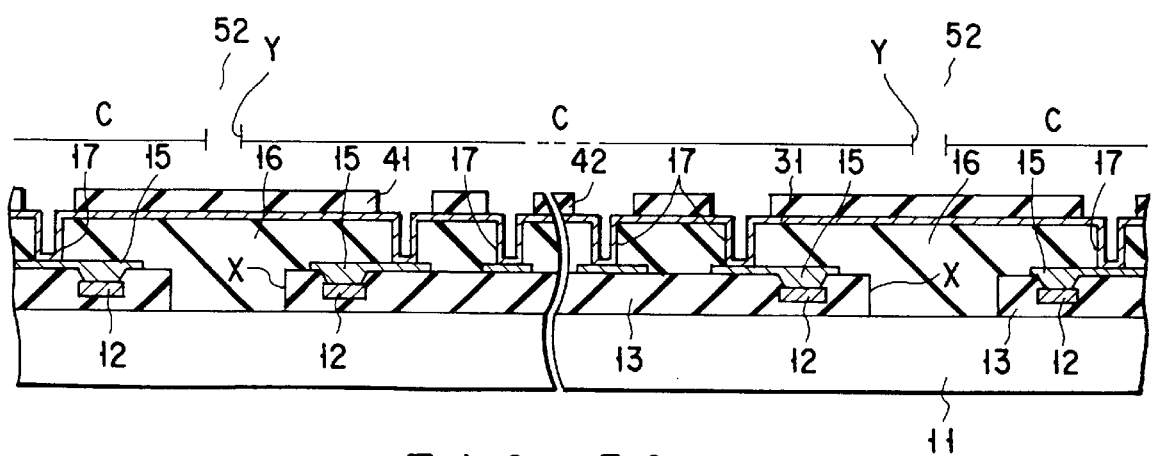
FIG. 52 is a sectional view taken along line LII—LII of FIG. 41.

Next, as shown in FIGS. 51 and 52, a resist layer 41 is formed over the entire surface of the metal layer 31, then patterned to form openings 42, which are greater in diameter than the through holes 17, in those portions of the resist layer which are located over the through holes. The openings 52 are made equal in size to the package contacts for connection to external leads.

Figure 53:
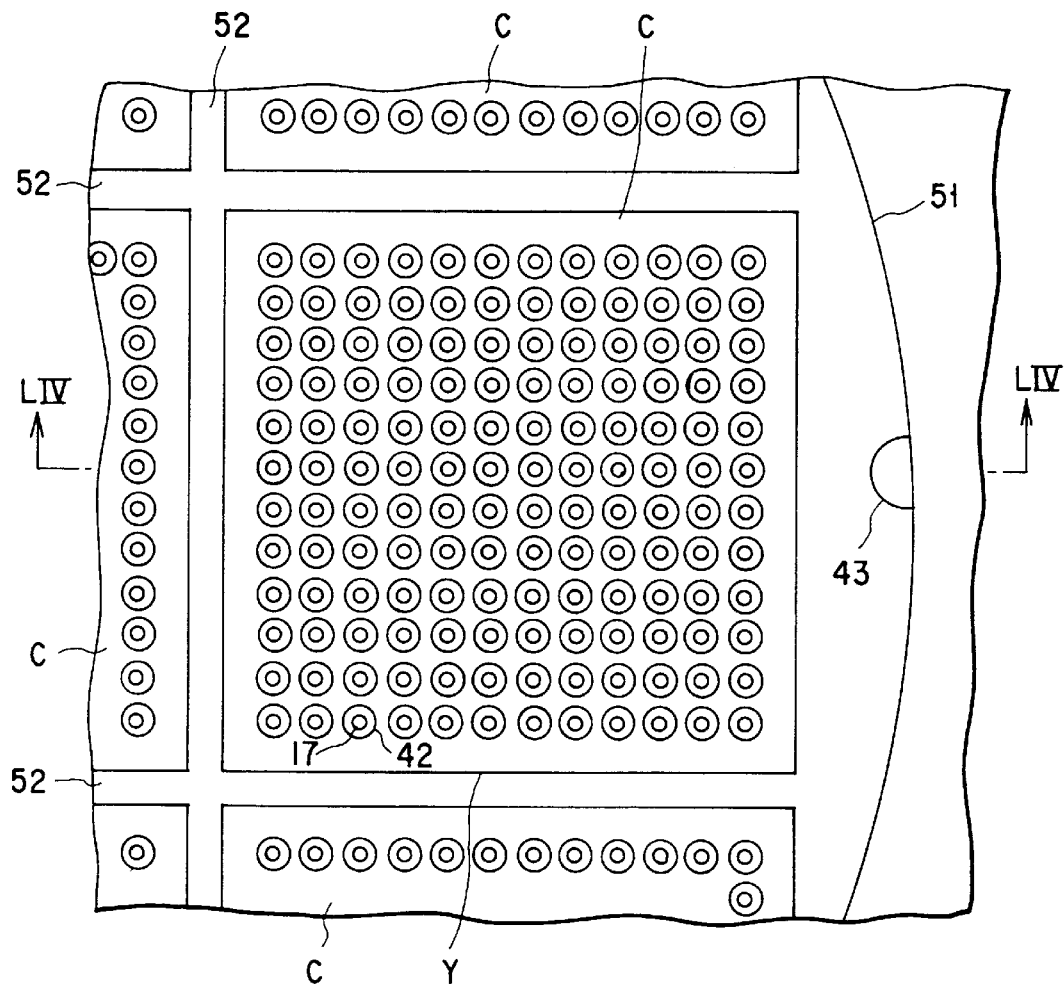
FIG. 53 is a plan view illustrating one step of manufacture of the package of FIG. 41.
Figure 54:
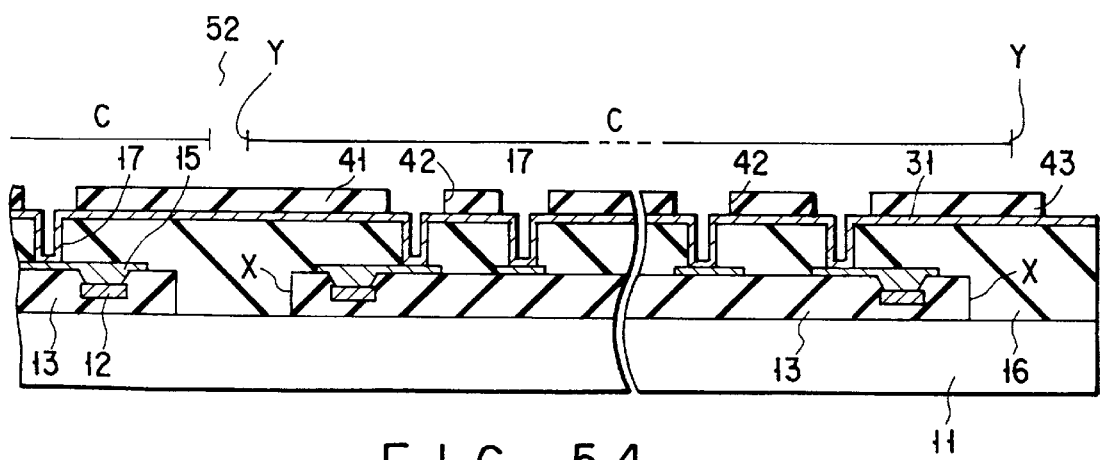
FIG. 54 is a sectional view taken along line LIV—LIV of FIG. 53.

At the same time, as shown in FIGS. 53 and 54, one or more voltage supplying openings 43 are formed at the edge of the wafer 51. In this example, a single opening is formed. The opening 43 may be formed in a predetermined inside portion of the wafer 51 instead of being formed in its edge portion.

Figure 55:
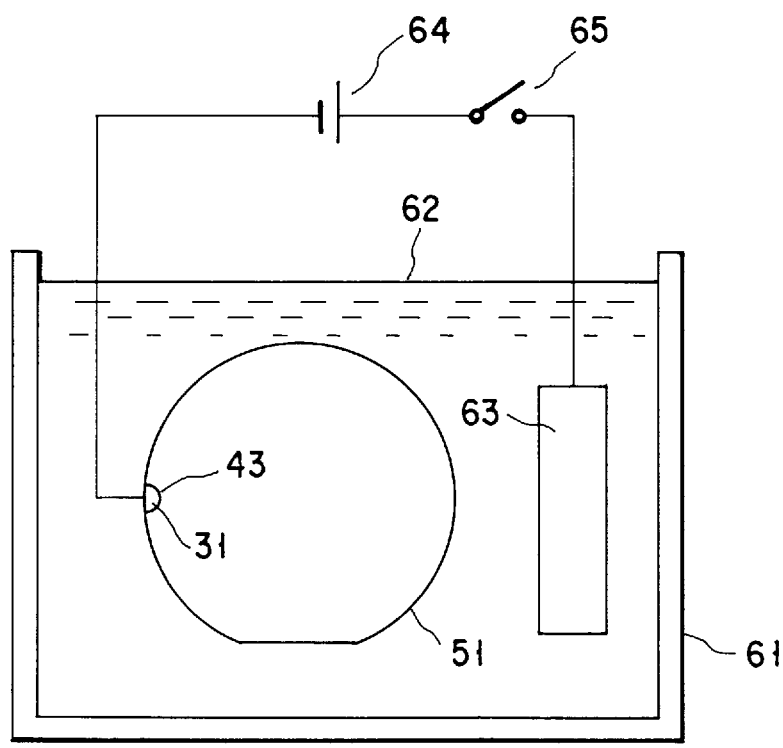
FIG. 55 is a plan view illustrating one step of manufacture of the package of FIG. 41.
Figure 56:
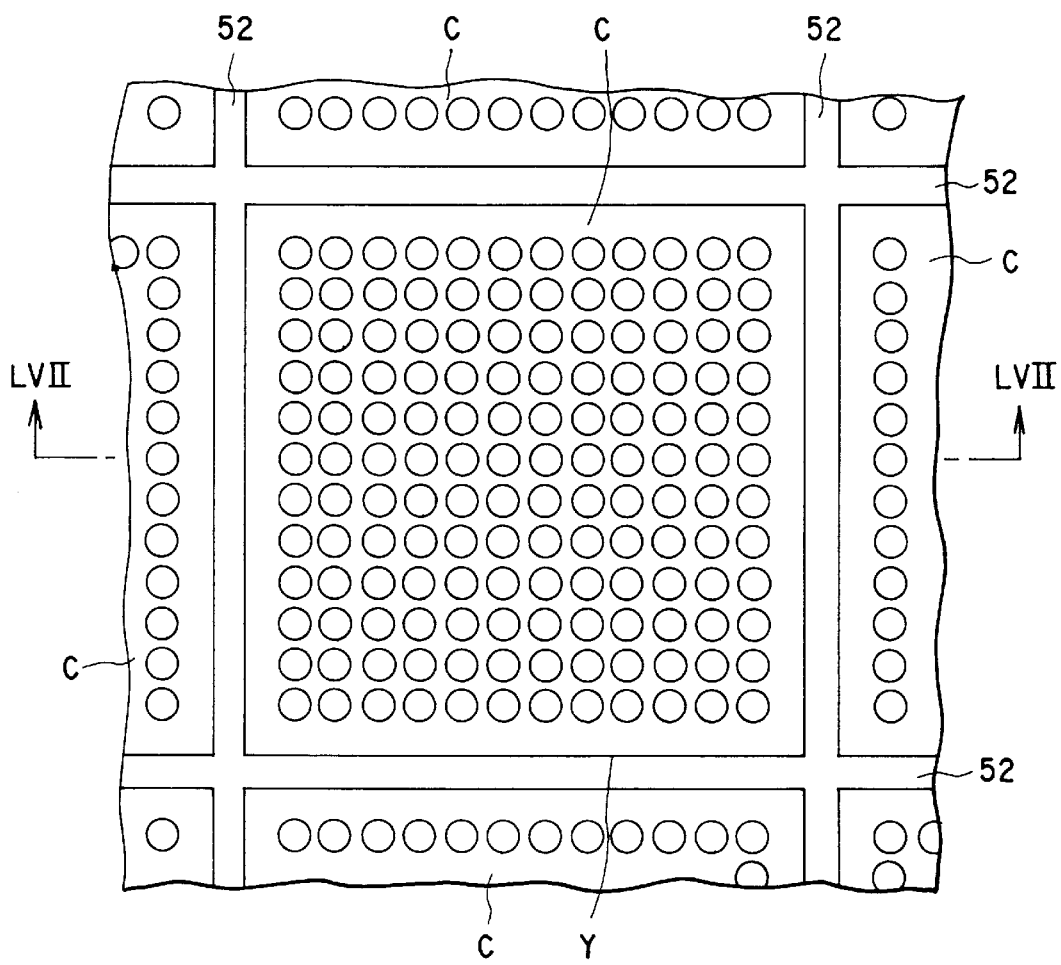
FIG. 56 is a plan view illustrating one step of manufacture of the package of FIG. 41.
Figure 57:
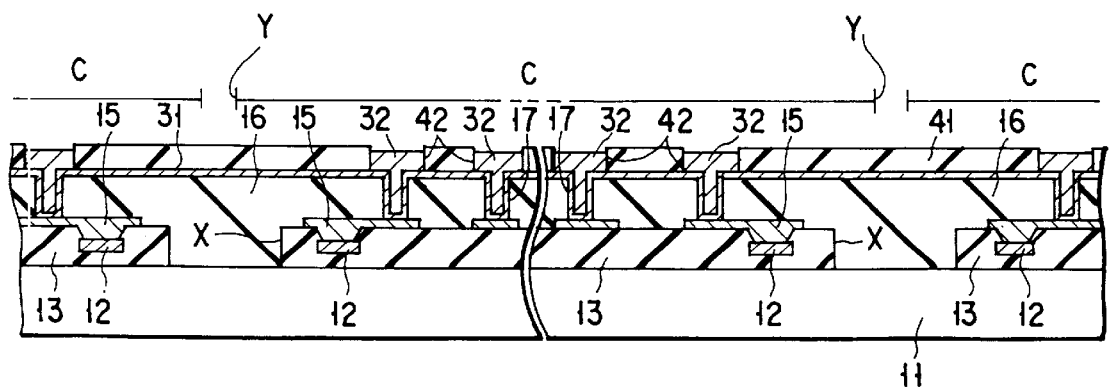
FIG. 57 is a sectional view taken along line LVII—LVII of FIG. 56.

Next, as shown in FIG. 55, a plating bath 61 is prepared which is filled with a predetermined solution. One end of a power supply 64 is connected to the metal layer 31 of the wafer 51 which is exposed through the opening 43 with the other end being connected to a plating electrode 63. After that, the wafer 51 and the plating electrode 63 are immersed in the solution 62 in the plating bath 61.

In this state, when a switch 65 is closed, the plated layer 32 is formed within the openings 42 in the resist layer 41, i.e., on the metal layer 31 within and around the through holes 17.

The plated layer 32 can be made of various materials by changing the solution 62 and the electrode 63. For example, the plated layer 32 is made of copper, gold, nickel, or a two-layered structure of nickel and gold.

Figure 58:
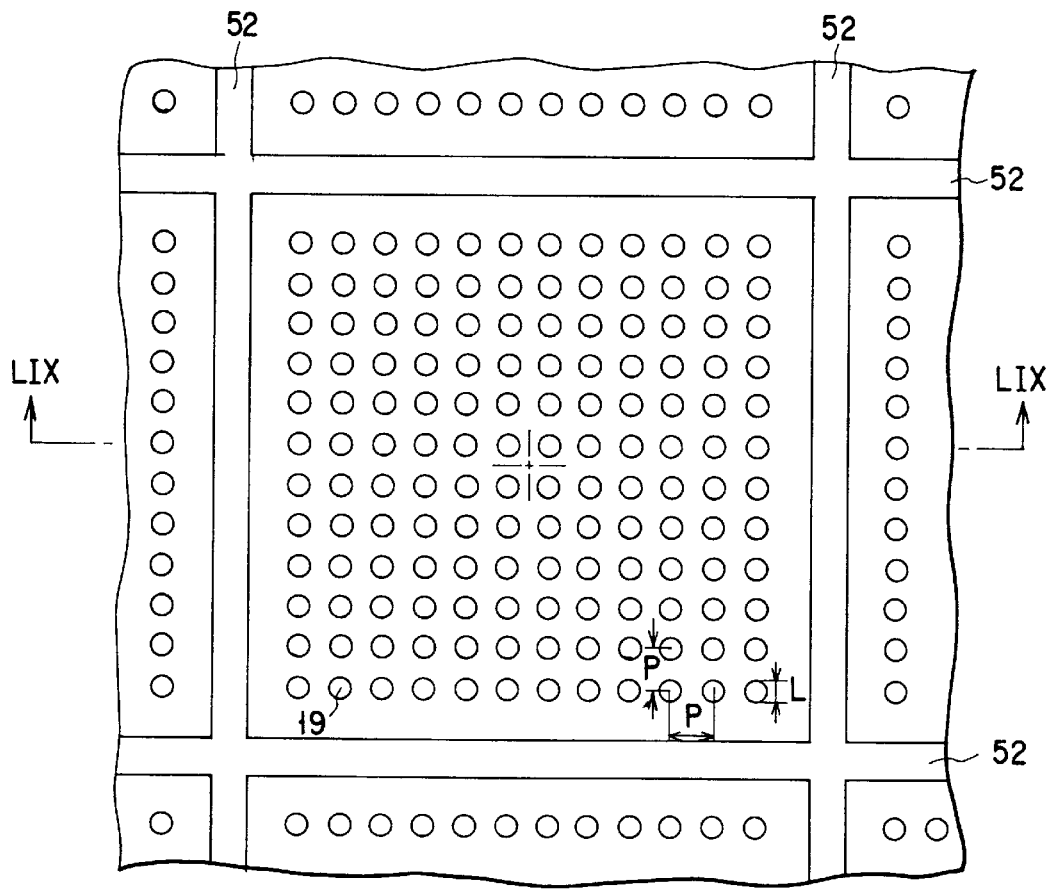
FIG. 58 is a plan view illustrating one step of manufacture of the package of FIG. 41.
Figure 59:
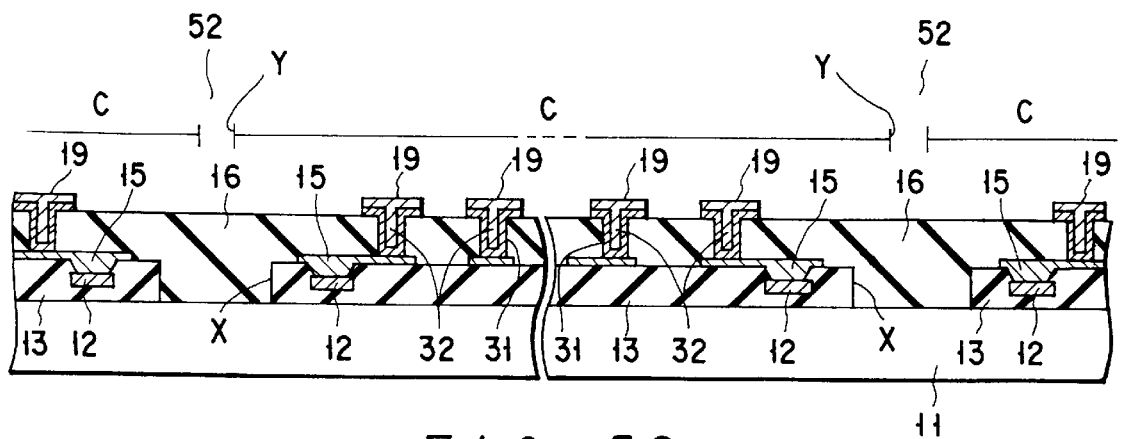
FIG. 59 is a sectional view taken along line LIX—LIX of FIG. 58.

Next, by removing the resist layer 41, the package contacts 19 are formed on the surface of the passivating film 16 as shown in FIGS. 58 and 59. The contacts 19, which are 144 in number, each have a circular shape with a diameter of about 0.5 mm and are formed at a pitch of about 1 mm in the form of a grid (in a 12×12 array).

Figure 60:
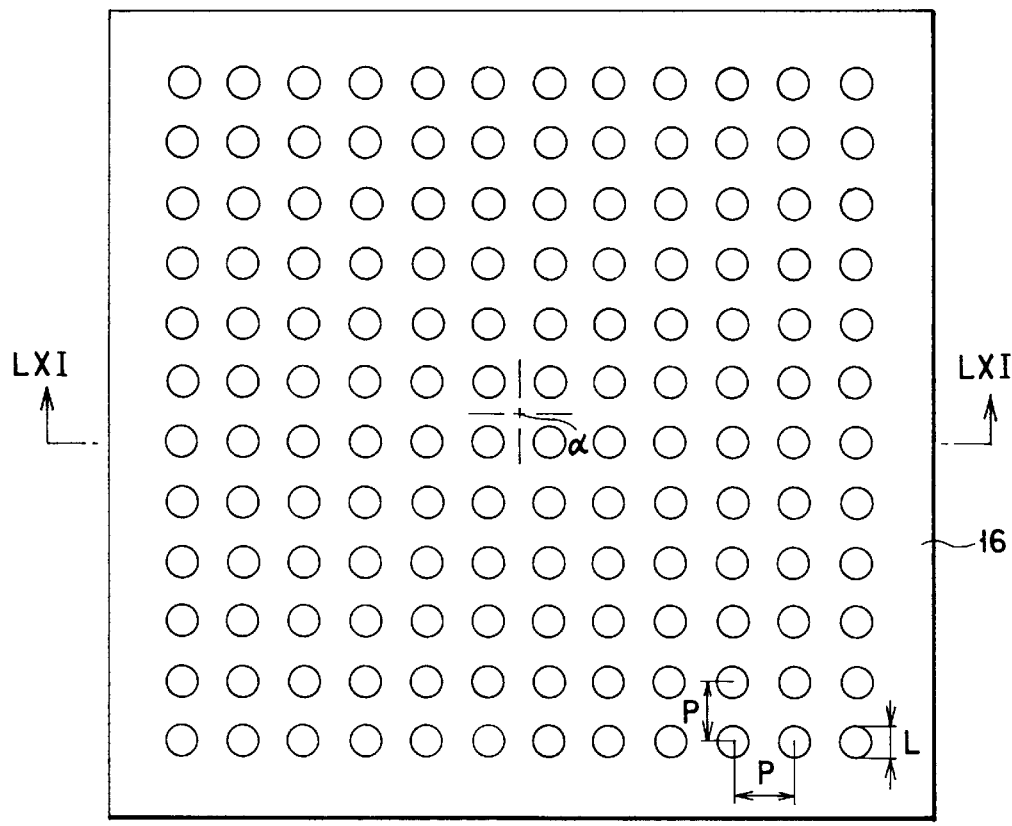
FIG. 60 is a plan view illustrating one step of manufacture of the package of FIG. 41.
Figure 61:
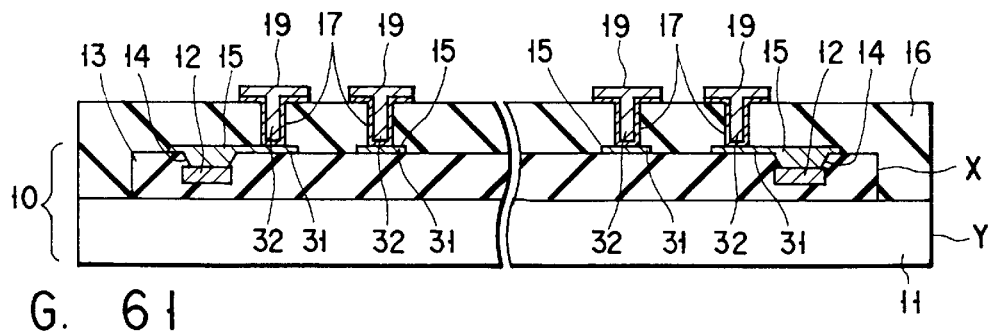
FIG. 61 is a sectional view taken along line LXI—LXI of FIG. 60.

Next, as shown in FIGS. 60 and 61, the wafer is cut along its dicing lines denoted at 52 in FIG. 58 using a dicing apparatus, whereby a plurality of semiconductor chips 10 are obtained. At this point, semiconductor packages are also completed simultaneously.

Figure 62:
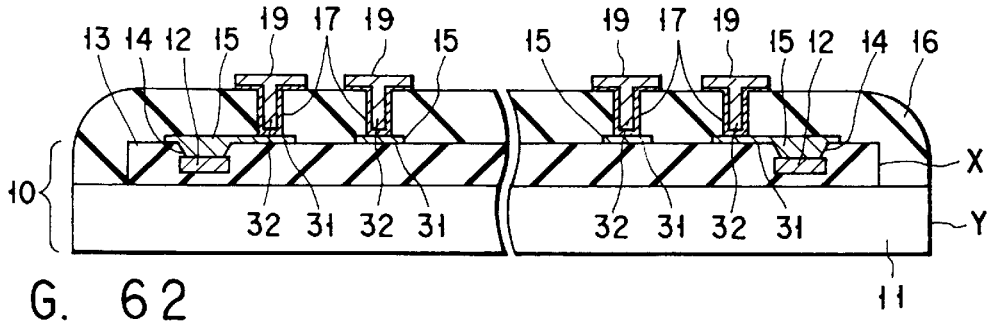
FIG. 62 is a plan view illustrating one step of manufacture of the package of FIG. 41.

In order to round off the edges of the passivation film 16 as shown in FIG. 62, the semiconductor chip 10 may be subjected to heat treatment.

By the above steps such a semiconductor package integrated with a semiconductor chip as shown in FIGS. 41 and 42 is completed.

Next, a method of mounting the semiconductor package shown in FIGS. 41 and 42 will be described.

Figure 66:
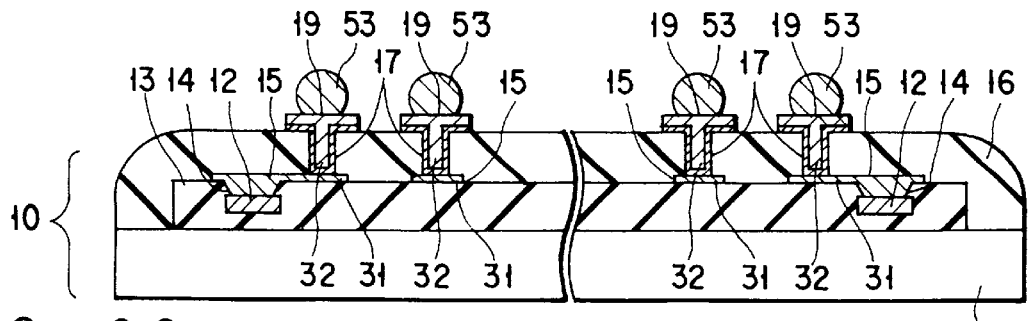
FIG. 66 is a plan view of a semiconductor package according to an eighth embodiment of the present invention.

First, as shown in FIG. 66, solder balls 53 are formed on the contacts 19 for connection to external leads of the semiconductor package (corresponding to an eighth embodiment of the present invention). These solder balls are provided for easier mounting of the semiconductor package onto a printed-circuit board. Thus, the solder balls are not necessarily needed.

Next, as shown in FIG. 67, the semiconductor package is placed on a printed-circuit board 54 so that the solder balls 53 may be brought into contact with predetermined portions of leads 55 on the printed-circuit board 54. The predetermined portions of the leads 55 of the printed-circuit board 54 are printed with solder 56.

Next, as shown in FIG. 68, the semiconductor package 10 and the printed-circuit board 54 are placed in a reflow furnace 57, then heated under predetermined conditions.

Consequently, the solder melts and solidifies, permitting each of the contacts 19 of the semiconductor package to be connected to a respective one of the leads 55 of the printed-circuit board as shown in FIG. 69. Thus, the mounting process terminates.

FIG. 70 shows a semiconductor package according to a ninth embodiment of the present invention. The feature of this package is its way of arranging the contacts 19 for connection to external leads.

When viewed from above the semiconductor chip, a total of 121 contacts, each of which has a circular shape with a diameter of about 0.5 mm, are formed in a grid form (11×11 array) at a pitch P of about 1 mm. Thus, one of the contacts 19 is located at the central point α of the semiconductor package. Thereby, the contacts 19 will be arranged symmetrically with respect to the central point α of the semiconductor package.

FIG. 71 shows a semiconductor package according to a tenth embodiment of the present invention, which features the way the contacts 19 are arranged.

When viewed from above the semiconductor chip, a total of 121 contacts, each of which has a circular shape with a diameter of about 0.5 mm, are formed on the periphery of the semiconductor package at a pitch P of about 1 mm.

That is, this semiconductor package can be considered to have the 6×6 array of contacts to be located in the center of the semiconductor package of FIG. 1 omitted.

In this case as well, the contacts 19 are placed symmetrically with respect to the center α of the semiconductor package.

FIG. 72 shows a semiconductor package according to an eleventh embodiment of the present invention, which features the way the contacts 19 are arranged.

When viewed from above the semiconductor chip, a total of 96 contacts, each of which has a circular shape with a diameter of about 0.5 mm, are formed on the periphery of the semiconductor package at a pitch P of about 1 mm.

That is, this semiconductor package can be considered to have the 5×5 array of contacts to be located in the center of the semiconductor package of FIG. 1 omitted.

In this case as well, the contacts 19 are placed symmetrically with respect to the center α of the semiconductor package.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor package comprising:
   a semiconductor chip having a semiconductor substrate, a plurality of pads formed above said semiconductor substrate, and a first passivating film formed over an entire surface of said semiconductor substrate and having openings above said pads, and the surface of said first passivating film being flat;
   a plurality of interconnection lines formed on the surface of said first passivating film, each of said interconnection lines being connected to a respective one of said pads;
   a second passivating film formed over the entire surface of said first passivating film, wherein the edges of said second passivating film are rounded off, and having through holes each located only above a respective one of said interconnection lines, said through holes being arranged in the form of an array and the surface of said second passivating film being flat; and
   a plurality of contacts for connection to external leads, each of said contacts being formed within and above a respective one of said through holes and said contacts being arranged in the form of an array, wherein said external leads are directly connected to a printed-circuit board.

2. The semiconductor package according to claim 1, wherein said plurality of pads is placed along the edges of said semiconductor substrate.

3. The semiconductor package according to claim 1, wherein said plurality of pads is placed evenly over the entire surface of said semiconductor substrate.

4. The semiconductor package according to claim 1, wherein the edges of said semiconductor substrate coincide with the edges of said first passivating film.

5. The semiconductor package according to claim 1, wherein each of said interconnection lines is made of one of conductors including aluminum and copper.

6. The semiconductor package according to claim 1, wherein said second passivating film functions as a package and has a thickness in the range of 0.05 to 0.2 mm.

7. The semiconductor package according to claim 1, wherein each of said first and second passivating films is made of one of insulating materials including silicon oxide and silicon nitride.

8. The semiconductor package according to claim 1, wherein, when viewed from above said semiconductor substrate, said contacts are placed symmetrically with respect to the central point of said second passivating film.

9. The semiconductor package according to claim 1, wherein said contacts are placed evenly over the entire surface of said second passivating film.

10. The semiconductor package according to claim 1, wherein said contacts are placed along the edges of said second passivating film.

11. The semiconductor package according to claim 1, wherein, when viewed from above said semiconductor substrate, each of said contacts has a circular shape.

12. The semiconductor package according to claim 1, wherein, when viewed from above said semiconductor substrate, said semiconductor substrate has a square shape and measures 13.5 mm on a side, each of said contacts has a circular shape with a diameter of 0.5 mm, and the pitch of said contacts is 1 mm.

13. The semiconductor package according to claim 1, wherein each of said contacts is made of one of conductors including copper, gold, nickel, and a two-layered structure of nickel and gold.

14. The semiconductor package according to claim 1, further comprising solder balls each formed on a respective one of said contacts.

15. The semiconductor package according to claim 1, wherein a bottom surface of the semiconductor package comprises a bottom surface of the semiconductor substrate.

16. A semiconductor package comprising:
    a semiconductor chip having a semiconductor substrate, a plurality of pads formed above said semiconductor substrate, and a first passivating film formed over an entire surface of said semiconductor substrate and having openings above said pads, the surface of said first passivating film being flat, and when viewed from above said semiconductor substrate, the edges of said first passivating film being inside the edges of said semiconductor substrate;
    a plurality of interconnection lines formed on the surface of said first passivating film, each of said interconnection lines being connected to a respective one of said pads;
    a second passivating film overlying the edges of said semiconductor substrate and the entire surface and sides of said first passivating film and having through holes each located only above a respective one of said interconnection lines, said through holes being arranged in the form of an array and the surface of said second passivating film being flat; and
    a plurality of contacts for connection to external leads, each of said contacts being formed within and above a respective one of said through holes and said contacts being arranged in the form of an array, wherein said external leads are directly connected to a printed-circuit board.

17. The semiconductor package according to claim 16, wherein said plurality of pads is placed along the edges of said semiconductor substrate.

18. The semiconductor package according to claim 16, wherein said plurality of pads is placed evenly over the entire surface of said semiconductor substrate.

19. The semiconductor package according to claim 16, wherein the edges of said semiconductor substrate coincide with the edges of said second passivating film.

20. The semiconductor package according to claim 16, wherein each of said interconnection lines is made of one of conductors including aluminum and copper.

21. The semiconductor package according to claim 16, wherein said second passivating film functions as a package and has a thickness in the range of 0.05 to 0.2 mm.

22. The semiconductor package according to claim 16, wherein the edges of said second passivating film are rounded off.

23. The semiconductor package according to claim 16, wherein each of said first and second passivating films is made of one of insulating materials including silicon oxide and silicon nitride.

24. The semiconductor package according to claim 16, wherein, when viewed from above said semiconductor substrate, said contacts are placed symmetrically with respect to the central point of said second passivating film.

25. The semiconductor package according to claim 16, wherein said contacts are placed evenly over the entire surface of said second passivating film.

26. The semiconductor package according to claim 16, wherein said contacts are placed along the edges of said second passivating film.

27. The semiconductor package according to claim 16, wherein, when viewed from above said semiconductor substrate, each of said contacts has a circular shape.

28. The semiconductor package according to claim 16, wherein, when viewed from above said semiconductor substrate, said semiconductor substrate has a square shape and measures 13.5 mm on a side, each of said contacts has a circular shape with a diameter of 0.5 mm, and the pitch of said contacts is 1 mm.

29. The semiconductor package according to claim 16, wherein each of said contacts is made of one of conductors including copper, gold, nickel, and a two-layered structure of nickel and gold.

30. The semiconductor package according to claim 16, further comprising solder balls each formed on a respective one of said contacts.

31. The semiconductor package according to claim 16, wherein a bottom surface of the semiconductor package comprises a bottom surface of the semiconductor substrate.

32. A semiconductor package comprising:
a semiconductor chip having a semiconductor substrate, a plurality of pads formed above said semiconductor substrate, and a first passivating film formed over an entire surface of said semiconductor substrate and having openings above said pads, the surface of said first passivating film being flat, the edges of said first passivating film being inside the edges of said semiconductor substrate when viewed from above said semiconductor substrate, and a groove being formed in portions of said semiconductor substrate which are located between the edges of said first passivating film and the edges of said semiconductor substrate;
a plurality of interconnection lines formed on the surface of said first passivating film, each of said interconnection lines being connected to a respective one of said pads;
a second passivating film overlying the edges of said semiconductor substrate and the entire surface and sides of said first passivating film and having through holes each located only above said a respective one of said interconnection lines, said through holes being arranged in the form of an array and the surface of said second passivating film being flat; and
a plurality of contacts for connection to external leads, each of said contacts being formed within and above a respective one of said through holes and said contacts being arranged in the form of an array, wherein said external leads are directly connected to a printed-circuit board.

33. The semiconductor package according to claim 32, wherein said plurality of pads is placed along the edges of said semiconductor substrate.

34. The semiconductor package according to claim 32, wherein said plurality of pads is placed evenly over the entire surface of said semiconductor substrate.

35. The semiconductor package according to claim 32, wherein the edges of said semiconductor substrate coincide with the edges of said second passivating film.

36. The semiconductor package according to claim 32, wherein each of said interconnection lines is made of one of conductors including aluminum and copper.

37. The semiconductor package according to claim 32, wherein said second passivating film functions as a package and has a thickness in the range of 0.05 to 0.2 mm.

38. The semiconductor package according to claim 32, wherein the edges of said second passivating film are rounded off.

39. The semiconductor package according to claim 32, wherein each of said first and second passivating films is made of one of insulating materials including silicon oxide and silicon nitride.

40. The semiconductor package according to claim 32, wherein, when viewed from above said semiconductor substrate, said contacts are placed symmetrically with respect to the central point of said second passivating film.

41. The semiconductor package according to claim 32, wherein said contacts are placed evenly over the entire surface of said second passivating film.

42. The semiconductor package according to claim 32, wherein said contacts are placed along the edges of said second passivating film.

43. The semiconductor package according to claim 32, wherein, when viewed from above said semiconductor substrate, each of said contacts has a circular shape.

44. The semiconductor package according to claim 32, wherein, when viewed from above said semiconductor substrate, said semiconductor substrate has a square shape and measures 13.5 mm on a side, each of said contacts has a circular shape with a diameter of 0.5 mm, and the pitch of said contacts is 1 mm.

45. The semiconductor package according to claim 32, wherein each of said contacts is made of one of conductors including copper, gold, nickel, and a two-layered structure of nickel and gold.

46. The semiconductor package according to claim 32, further comprising solder balls each formed on a respective one of said contacts.

47. The semiconductor package according to claim 32, wherein a bottom surface of the semiconductor package comprises a bottom surface of the semiconductor substrate.

48. A semiconductor package comprising:
a semiconductor chip having a semiconductor substrate, a plurality of pads formed above said semiconductor substrate, and a first passivating film formed over an entire surface of said semiconductor substrate and having openings above said pads, and the surface of said first passivating film being flat;
a plurality of interconnection lines formed on the surface of said first passivating film, each of said interconnection lines being connected to a respective one of said pads;
a second passivating film formed over the entire surface of said first passivating film, wherein the edges of said second passivating film are rounded off, and having through holes each located only above a respective one of said interconnection lines, said through holes being arranged in the form of an array and the surface of said second passivating film being flat;
a metal layer formed on the bottom and sides of each of said through holes; and
a plated layer formed within and above each of said through holes, said plated layer forming each of contacts for connection to external leads above a respective one of said through holes, wherein said external leads are directly connected to a printed-circuit board.

49. The semiconductor package according to claim 46, wherein said plurality of pads is placed along the edges of said semiconductor substrate.

50. The semiconductor package according to claim 46, wherein said plurality of pads is placed evenly over the entire surface of said semiconductor substrate.

51. The semiconductor package according to claim 46, wherein the edges of said semiconductor substrate are inside the edges of said second passivating film.

52. The semiconductor package according to claim 46, wherein each of said interconnection lines is made of one of conductors including aluminum and copper.

53. The semiconductor package according to claim 46, wherein said second passivating film functions as a package and has a thickness in the range of 0.05 to 0.2 mm.

54. The semiconductor package according to claim 46, wherein each of said first and second passivating films is made of one of insulating materials including silicon oxide and silicon nitride.

55. The semiconductor package according to claim 46, wherein, when viewed from above said semiconductor substrate, said contacts are placed symmetrically with respect to the central point of said second passivating film.

56. The semiconductor package according to claim 46, wherein said contacts are placed evenly over the entire surface of said second passivating film.

57. The semiconductor package according to claim 46, wherein said contacts are placed along the edges of said second passivating film.

58. The semiconductor package according to claim 46, wherein, when viewed from above said semiconductor substrate, each of said contacts has a circular shape.

59. The semiconductor package according to claim 46, wherein, when viewed from above said semiconductor substrate, said semiconductor substrate has a square shape and measures 13.5 mm on a side, each of said contacts has a circular shape with a diameter of 0.5 mm, and the pitch of said contacts is 1 mm.

60. The semiconductor package according to claim 46, wherein said metal layer is made of at least one of metals including titanium, nickel, and palladium.

61. The semiconductor package according to claim 46, wherein each of said contacts is made of one of conductors including copper, gold, nickel, and a two-layered structure of nickel and gold.

62. The semiconductor package according to claim 46, further comprising solder balls each formed on a respective one of said contacts.

63. The semiconductor package according to claim 48, wherein a bottom surface of the semiconductor package comprises a bottom surface of the semiconductor substrate.

* * * * *

UNITED STATES PATENT AND TRADEMARK OFFICE
CERTIFICATE OF CORRECTION

PATENT NO. : 5,892,273
DATED : April 6, 1999
INVENTOR(S) : Iwasaki et al.

It is certified that error appears in the above-identified patent and that said Letters Patent is hereby corrected as shown below:

Claim 49, column 24, line 59, "claim 46" should read --claim 48--.
Claim 50, column 24, line 62, "claim 46" should read --claim 48--.
Claim 51, column 24, line 65, "claim 46" should read --claim 48--.
Claim 52, column 25, line 1, "claim 46" should read --claim 48--.
Claim 53, column 25, line 4, "claim 46" should read --claim 48--.
Claim 54, column 25, line 7, "claim 46" should read --claim 48--.
Claim 55, column 25, line 11, "claim 46" should read --claim 48--.
Claim 56, column 25, line 15, "claim 46" should read --claim 48--.
Claim 57, column 25, line 18, "claim 46" should read --claim 48--.
Claim 58, column 25, line 21, "claim 46" should read --claim 48--.
Claim 59, column 26, line 1, "claim 46" should read --claim 48--.
Claim 60, column 26, line 8, "claim 46" should read --claim 48--.
Claim 61, column 26, line 11, "claim 46" should read --claim 48--.
Claim 62, column 26, line 15, "claim 46" should read --claim 48--.

Signed and Sealed this

Seventh Day of December, 1999

Attest:

Q. TODD DICKINSON

*Attesting Officer*  *Acting Commissioner of Patents and Trademarks*